(12) United States Patent
Ishizu et al.

(10) Patent No.: US 11,854,599 B2
(45) Date of Patent: Dec. 26, 2023

(54) SEMICONDUCTOR DEVICE, ELECTRONIC COMPONENT, AND ELECTRONIC DEVICE

(71) Applicant: SEMICONDUCTOR ENERGY LABORATORY CO., LTD., Atsugi (JP)

(72) Inventors: Takahiko Ishizu, Kanagawa (JP); Yuto Yakubo, Kanagawa (JP); Tatsuya Onuki, Kanagawa (JP); Shunpei Yamazaki, Tokyo (JP)

(73) Assignee: SEMICONDUCTOR ENERGY LABORATORY CO., LTD., Kanagawa-ken (JP)

( * ) Notice: Subject to any disclaimer, the term of this patent is extended or adjusted under 35 U.S.C. 154(b) by 0 days.

(21) Appl. No.: 17/977,099

(22) Filed: Oct. 31, 2022

(65) Prior Publication Data

US 2023/0110439 A1  Apr. 13, 2023

Related U.S. Application Data

(62) Division of application No. 16/881,069, filed on May 22, 2020, now abandoned.

(30) Foreign Application Priority Data

Jun. 7, 2019 (JP) .................................. 2019-106982
Jul. 2, 2019 (JP) .................................. 2019-123905
Aug. 28, 2019 (JP) .................................. 2019-155418

(51) Int. Cl.
*G11C 11/40* (2006.01)
*G11C 11/4074* (2006.01)
(Continued)

(52) U.S. Cl.
CPC ...... *G11C 11/4074* (2013.01); *G11C 11/4096* (2013.01); *H01L 27/1207* (2013.01);
(Continued)

(58) Field of Classification Search
CPC ... G11C 11/4047; G11C 11/4096; G11C 5/14; G11C 5/148; G11C 11/1697
See application file for complete search history.

(56) References Cited

U.S. PATENT DOCUMENTS 4,571,702 A  2/1986 DeArras
8,063,692 B2  11/2011 Okano
(Continued)

FOREIGN PATENT DOCUMENTS

JP  2016-042352 A  3/2016
WO  WO-2009/078081  6/2009

OTHER PUBLICATIONS

Yamazaki.S et al., "Research, Development, and Application of Crystalline Oxide Semiconductor", SID Digest '12 : SID International Symposium Digest of Technical Papers, Jun. 5, 2012, vol. 43, No. 1, pp. 183-186.
(Continued)

*Primary Examiner* — Han Yang
(74) *Attorney, Agent, or Firm* — Nixon Peabody LLP; Jeffrey L. Costellia

(57) ABSTRACT

Power consumption is reduced. A semiconductor device includes an arithmetic processing circuit, a power supply circuit, a power management unit (PMU), and a power switch. The arithmetic processing circuit includes a storage circuit retaining generated data. The storage circuit includes a backup circuit including a transistor and a capacitor. When a control signal for transition to a resting state is input from the arithmetic processing circuit, the PMU performs voltage scaling operation for lowering a power supply potential of the arithmetic processing circuit. When the period of the resting state exceeds the set time, the PMU performs power gating operation for stopping power supply to the arithmetic
(Continued)

processing circuit. Data saving operation of the storage circuit is performed before the voltage scaling operation.

3 Claims, 44 Drawing Sheets

(51) Int. Cl.
  *G11C 11/4096* (2006.01)
  *H01L 29/786* (2006.01)
  *H01L 27/12* (2006.01)
  *H10B 99/00* (2023.01)
(52) U.S. Cl.
  CPC ...... *H01L 27/1225* (2013.01); *H01L 27/1255* (2013.01); *H01L 29/7869* (2013.01); *H01L 29/78648* (2013.01); *H10B 99/00* (2023.02)

(56) References Cited

U.S. PATENT DOCUMENTS

| | | | |
|---|---|---|---|
| 9,285,609 | B1 | 3/2016 | Rost |
| 9,438,234 | B2 | 9/2016 | Maehashi et al. |
| 10,090,023 | B2 | 10/2018 | Ohmaru et al. |
| 2002/0095609 | A1 | 7/2002 | Tokunaga |
| 2005/0235652 | A1 | 10/2005 | Iwasaki |
| 2007/0196099 | A1 | 8/2007 | Ishiyama et al. |
| 2008/0224749 | A1 | 9/2008 | Lin et al. |
| 2011/0093686 | A1 | 4/2011 | Penton et al. |
| 2011/0291740 | A1 | 12/2011 | Sofer et al. |
| 2012/0324258 | A1 | 12/2012 | Branover et al. |
| 2013/0073884 | A1 | 3/2013 | Ulmer et al. |
| 2013/0262780 | A1 | 10/2013 | Manne et al. |
| 2013/0326244 | A1 | 12/2013 | Koyama et al. |
| 2014/0068300 | A1 | 3/2014 | Nishijima et al. |
| 2014/0103346 | A1 | 4/2014 | Yamazaki |
| 2014/0138675 | A1 | 5/2014 | Yamazaki |
| 2014/0281616 | A1 | 9/2014 | Moran et al. |
| 2014/0291673 | A1 | 10/2014 | Yamazaki |
| 2015/0054571 | A1* | 2/2015 | Watanabe ............... H02M 3/07 327/536 |
| 2015/0070962 | A1 | 3/2015 | Ohmaru et al. |
| 2015/0241952 | A1 | 8/2015 | Asami et al. |
| 2015/0244352 | A1 | 8/2015 | Min |
| 2015/0370313 | A1 | 12/2015 | Tamura |
| 2016/0149573 | A1 | 5/2016 | Maehashi et al. |
| 2016/0172036 | A1 | 6/2016 | Augustine et al. |

OTHER PUBLICATIONS

Yamazaki.S et al., "Properties of crystalline In—Ga—Zn-oxide semiconductor and its transistor characteristics", Jpn. J. Appl. Phys. (Japanese Journal of Applied Physics) , Mar. 31, 2014, vol. 53, No. 4S, pp. 04ED18-1-04ED18-10.

* cited by examiner

FIG. 15A
Intermediate state
New crystalline phase
| Amorphous | Crystalline | Crystal |
|---|---|---|
| ·completely amorphous | ·CAAC<br>·nc<br>·CAC<br>excluding single crystal and poly crystal | ·single crystal<br>·poly crystal |
FIG. 15B
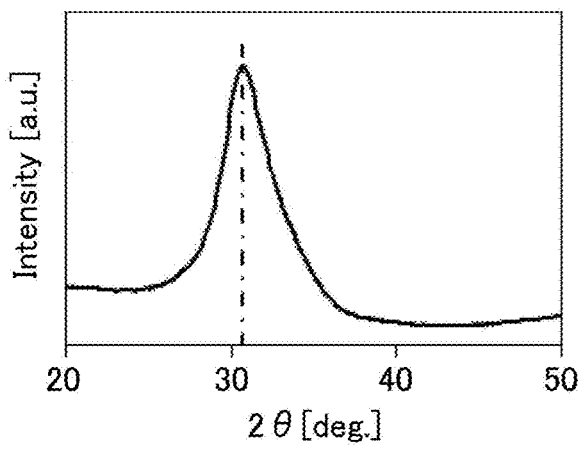
FIG. 15C
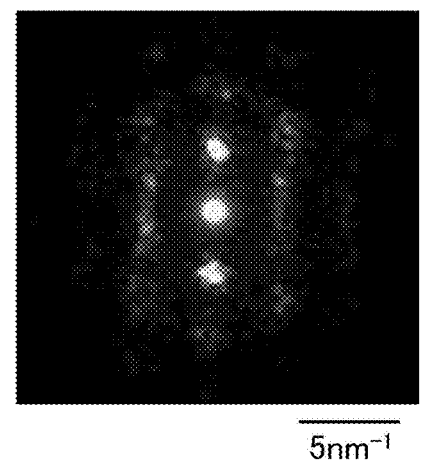

FIG. 23A
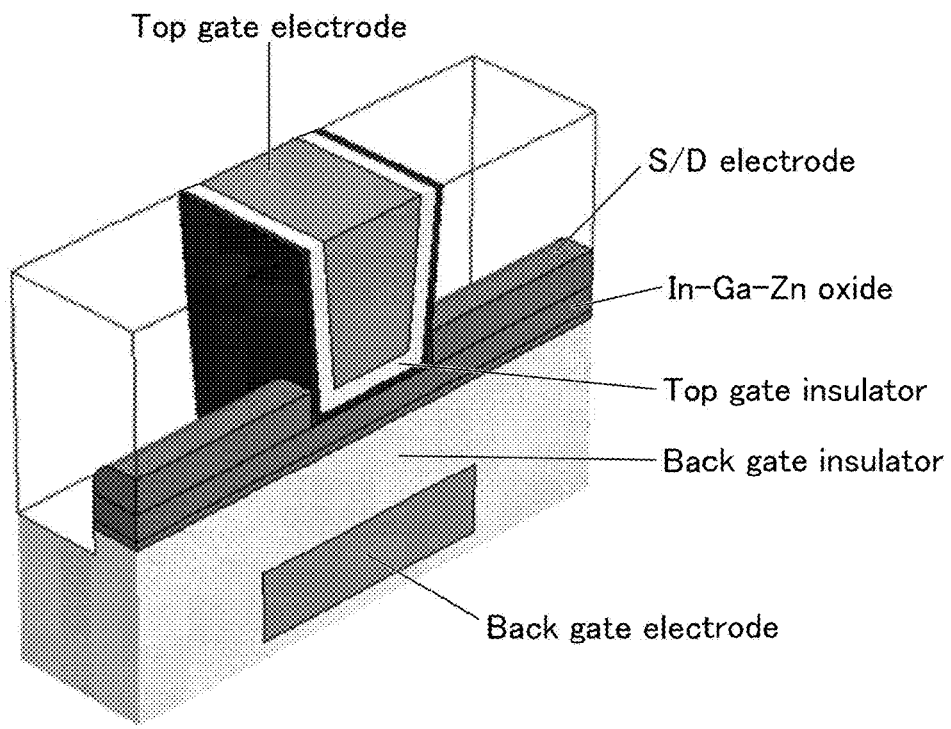
FIG. 23B
- Back gate electrode formation and gate insulator deposition
- IGZO deposition and channel formation
- SiOx deposition and planarization by CMP
- S/D electrode formation in a self aligned manner
- Top gate insulator deposition
- Top gate electrode formation
- Passivation and S/D electrode pad formation
FIG. 23C

FIG. 33A

| Supply voltage (V) | Backup time: TB1 (ns) | | | | | | | | | |
|---|---|---|---|---|---|---|---|---|---|---|
| | 100 | 66.7 | 50.0 | 40.0 | 33.3 | 28.6 | 25.0 | 22.2 | 20.0 | 18.2 |
| 3.6 | | | | | | | | | | |
| 3.5 | | | | | | | | | | |
| 3.4 | | | | | | | | | | |
| 3.3 | | | | | | | | | | |
| 3.2 | | | | Pass | | | | | | |
| 3.1 | | | | | | | | | | |
| 3.0 | | | | | | | | | | |
| 2.9 | | | | | | | | | | |
| 2.8 | | | | | | | | | | |
| 2.7 | | | | | | | | | | |
| 2.6 | | | | | | | | | | |
| 2.5 | | | | | | | | | | |
| 2.4 | | | | | | | | | | |
| 2.3 | | | | | | | | | | |
| 2.2 | | | | | | Fail | | | | |
| 2.1 | | | | | | | | | | |
| 2.0 | | | | | | | | | | |
| 1.9 | | | | | | | | | | |
| 1.8 | | | | | | | | | | |

FIG. 33B

| Supply voltage (V) | Restore time: TR1 (ns) | | | | | | | | | |
|---|---|---|---|---|---|---|---|---|---|---|
| | 100 | 66.7 | 50.0 | 40.0 | 33.3 | 28.6 | 25.0 | 22.2 | 20.0 | 18.2 |
| 3.6 | | | | | | | | | | |
| 3.5 | | | | | | | | | | |
| 3.4 | | | | | | | | | | |
| 3.3 | | | | | | | | | | |
| 3.2 | | | | Pass | | | | | | |
| 3.1 | | | | | | | | | | |
| 3.0 | | | | | | | | | | |
| 2.9 | | | | | | | | | | |
| 2.8 | | | | | | | | | | |
| 2.7 | | | | | | | | | | |
| 2.6 | | | | | | | | | | |
| 2.5 | | | | | | | | | | |
| 2.4 | | | | | | | | | | |
| 2.3 | | | | | | | | | | |
| 2.2 | | | | | | | | | | |
| 2.1 | | | | | | | Fail | | | |
| 2.0 | | | | | | | | | | |
| 1.9 | | | | | | | | | | |
| 1.8 | | | | | | | | | | |

SEMICONDUCTOR DEVICE, ELECTRONIC COMPONENT, AND ELECTRONIC DEVICE

BACKGROUND OF THE INVENTION

1. Field of the Invention

One embodiment of the present invention relates to a semiconductor device.

Note that one embodiment of the present invention is not limited to the above technical field. The technical field of the invention disclosed in this specification and the like relates to an object, a method, or a manufacturing method. One embodiment of the present invention relates to a process, a machine, manufacture, or a composition of matter.

Note that in this specification and the like, a semiconductor device generally means a device that can function by utilizing semiconductor characteristics. Thus, a semiconductor element such as a transistor or a diode and a circuit including a semiconductor element are semiconductor devices. A display device, a light-emitting device, a lighting device, an electro-optical device, an imaging device, a communication device, an electronic device, and the like may include a semiconductor element or a semiconductor circuit. Therefore, a display device, a light-emitting device, a lighting device, an electro-optical device, an imaging device, a communication device, an electronic device, and the like may be called a semiconductor device.

2. Description of the Related Art

Information terminals that are easy to carry, typified by smartphones, tablet terminals, and the like, have come into widespread use. With the widespread use of information terminals, various communication standards have been established. For example, the use of an LTE-Advanced standard called the fourth-generation mobile communication system (4G) has started.

With the development of information technology such as Internet of Things (IoT), the amount of data handled in information terminals has been recently showing an increasing tendency. In addition, the transmission speed of electronic devices such as information terminals needs to be improved.

In order to be compatible with various kinds of information technology such as IoT, a new communication standard called the fifth-generation mobile communication system (5G) that achieves higher transmission speed, more simultaneous connections, and shorter delay time than 4G has been examined. Note that 5G uses communication frequencies of a 3.7 GHz band, a 4.5 GHz band, and a 28 GHz band.

A 5G compatible semiconductor device is manufactured using a semiconductor containing one kind of element such as Si as its main component or a compound semiconductor containing a plurality of kinds of elements such as Ga and As as its main components. Furthermore, an oxide semiconductor, which is one kind of metal oxide, has attracted attention.

For oxide semiconductors, a c-axis-aligned crystalline (CAAC) structure and a nanocrystalline (nc) structure, which are neither a single crystal structure nor an amorphous structure, have been discovered (see Non-Patent Documents 1 and 2).

Non-Patent Documents 1 and 2 disclose a technique for forming a transistor with the use of an oxide semiconductor having the CAAC structure.

As techniques for reducing the power consumption of semiconductor devices, power gating (PG), clock gating (CG), and voltage scaling are known, for example. Patent Document 1 discloses a technique for effectively reducing power consumption among dynamic voltage and frequency scaling (DVFS) techniques and PG techniques, for example.

REFERENCES

Patent Document

[Patent Document 1] PCT International Publication No. 2009/078081

Non-Patent Documents

[Non-Patent Document 1] S. Yamazaki et al., SID Symposium Digest of Technical Papers, 2012, Volume 43, Issue 1, pp. 183-186.

[Non-Patent Document 2] S. Yamazaki et al., Japanese Journal of Applied Physics, 2014, Volume 53, Number 4S, pp. 04ED18-1-04ED18-10.

SUMMARY OF THE INVENTION

An object of one embodiment of the present invention is to provide a novel semiconductor device or a method for operating the novel semiconductor device. An object of one embodiment of the present invention is to reduce power consumption, for example, reduce power in a resting state. An object of one embodiment of the present invention is to shorten time needed to perform processing for transition from a resting state to a normal state or reduce energy needed to perform the processing.

Note that the description of a plurality of objects does not disturb the existence of each object. One embodiment of the present invention does not necessarily achieve all the objects described above. Other objects will be apparent from the description of the specification, the drawings, the claims, and the like, and such objects could be objects of one embodiment of the present invention.

One embodiment of the present invention is a semiconductor device including a power supply circuit, a power management unit, and an arithmetic processing circuit. The power supply circuit has a function of supplying power to the arithmetic processing circuit. The power management unit has a function of controlling power supply to the arithmetic processing circuit. The arithmetic processing circuit includes a first circuit and a second circuit. The first circuit has a function of retaining first data in a period during which power is supplied to the arithmetic processing circuit. The second circuit has a function of retaining the first data in a period during which power supply to the arithmetic processing circuit is stopped. The semiconductor device has a function of writing the first data to the second circuit in the period during which power is supplied to the arithmetic processing circuit, a function of stopping power supply to the arithmetic processing circuit, a function of restarting power supply to the arithmetic processing circuit, and a function of writing the first data retained in the second circuit to the first circuit.

Another embodiment of the present invention is a semiconductor device including a power supply circuit, a power management unit, an arithmetic processing circuit, and a power switch. The power supply circuit has a function of generating a power supply potential. The power switch is capable of controlling supply of the power supply potential to the arithmetic processing circuit. The arithmetic processing circuit includes a first circuit and a second circuit. The first circuit is capable of retaining data generated in the arithmetic processing circuit. The second circuit is capable of saving and retaining the data retained in the first circuit and capable of restoring the saved data to the first circuit. The power management unit is capable of controlling operation of saving data from the first circuit to the second circuit, capable of controlling operation of restoring data from the second circuit to the first circuit, capable of controlling operation of the power switch, and capable of controlling a change in magnitude of the power supply potential generated in the power supply circuit.

Another embodiment of the present invention is a semiconductor device including a power supply circuit, a power management unit, an arithmetic processing circuit, and a power switch. The arithmetic processing circuit includes a first circuit and a second circuit. The first circuit is capable of retaining data generated in the arithmetic processing circuit. The second circuit is capable of saving and retaining the data retained in the first circuit and capable of restoring the saved data to the first circuit. The power switch is capable of controlling supply of a power supply potential generated in the power supply circuit to the arithmetic processing circuit. The power supply circuit is capable of generating a first power supply potential and a second power supply potential. The power management unit is capable of controlling the supply of the power supply potential to the arithmetic processing circuit by controlling operation of the power supply circuit and the power switch. A power management mode of the power management unit has at least a first mode, a second mode, and a third mode. The first power supply potential is supplied in the first mode. The second power supply potential is supplied in the second mode. Supply of the first power supply potential and the second power supply potential is stopped in the third mode. The second power supply potential is lower than the first power supply potential and is capable of erasing data retained in the first circuit. The power management unit includes a third circuit capable of measuring time. The power management unit is capable of transferring from the first mode to the second mode in response to a first signal generated in the arithmetic processing circuit, capable of controlling operation of saving data from the first circuit to the second circuit in response to the first signal, capable of transferring from the second mode to the third mode in response to a second signal generated in the third circuit, capable of transferring from the third mode to the first mode in response to a third signal, and capable of controlling operation of restoring data from the second circuit to the first circuit in response to the third signal.

In the above embodiments, the first circuit can be a flip-flop circuit. Alternatively, in the above embodiments, the second circuit may include a first transistor and a capacitor. The capacitor may be electrically connected to a source or a drain of the first transistor. A conduction state of the first transistor may be controlled by the power management unit. A channel of the first transistor may include an oxide semiconductor.

A transistor has three terminals (nodes): a gate, a source, and a drain. A gate functions as a control terminal for controlling the conduction state of a transistor. Depending on the type of the transistor or levels of potentials applied to the terminals (nodes), one of a pair of input/output terminals (nodes) functions as a source and the other functions as a drain. In general, in an n-channel transistor, a node to which a lower potential is applied is referred to as a source, and a node to which a higher potential is applied is referred to as a drain. By contrast, in a p-channel transistor, a node to which a lower potential is applied is referred to as a drain, and a node to which a higher potential is applied is referred to as a source. In this specification, two terminals (nodes) except a gate are referred to as a first terminal (node) and a second terminal (node) in some cases.

In this specification, for easy understanding of a circuit configuration and circuit operation, one of input/output terminals (nodes) of a transistor is fixed as a source and the other is fixed as a drain in some cases. It is needless to say that, depending on a driving method, the magnitude relationship between potentials applied to three terminals of the transistor might be changed, and the source and the drain might be interchanged with each other. Thus, in one embodiment of the present invention, the distinction between the source and the drain of the transistor is not limited to that described in this specification and the drawings.

In this specification and the like, it might be possible for those skilled in the art to constitute one embodiment of the invention even when portions to which all the terminals of an active element (e.g., a transistor or a diode), a passive element (e.g., a capacitor or a resistor), or the like are connected are not specified. In other words, one embodiment of the invention can be clear even when connection portions are not specified. Furthermore, in the case where a connection portion is disclosed in this specification and the like, it can be determined that one embodiment of the invention in which a connection portion is not specified is disclosed in this specification and the like, in some cases. In particular, in the case where the number of portions to which the terminal is connected might be more than one, it is not necessary to specify the portions to which the terminal is connected. Therefore, it might be possible to constitute one embodiment of the invention by specifying only portions to which some terminals of an active element (e.g., a transistor or a diode), a passive element (e.g., a capacitor or a resistor), or the like are connected.

In this specification and the like, it might be possible for those skilled in the art to specify the invention when at least the connection portion of a circuit is specified. Alternatively, it might be possible for those skilled in the art to specify the invention when at least the function of a circuit is specified. In other words, one embodiment of the invention can be clear when the function of a circuit is specified. Furthermore, it can be determined that one embodiment of the invention in which a function is specified is disclosed in this specification and the like in some cases. Thus, when the connection portion of a circuit is specified, the circuit is disclosed as one embodiment of the invention even if a function is not specified, and one embodiment of the invention can be constituted. Alternatively, when the function of a circuit is specified, the circuit is disclosed as one embodiment of the invention even if a connection portion is not specified, and one embodiment of the invention can be constituted.

One embodiment of the present invention can provide a novel semiconductor device or a method for operating the novel semiconductor device. One embodiment of the present invention can reduce power consumption, for example, reduce power in a resting state. One embodiment of the present invention can shorten time needed to perform processing for transition from a resting state to a normal state or reduce energy needed to perform the processing.

Note that the description of these effects does not disturb the existence of other effects. One embodiment of the present invention does not need to have all the effects described above. In one embodiment of the present invention, other objects, effects, and novel features will be apparent from the description of the specification and the drawings.

BRIEF DESCRIPTION OF THE DRAWINGS

In the accompanying drawings:

FIG. 15A shows classification of crystal structures of IGZO, FIG. 15B shows an XRD spectrum of a CAAC-IGZO film, and FIG. 15C shows a nanobeam electron diffraction pattern of the CAAC-IGZO film;

FIG. 23A is a bird's-eye view of an IGZO-FET, FIG. 23B shows a manufacturing process flow chart of an IGZO-FET, and FIG. 23C is a cross-sectional TEM image of a stacked-layer structure of Si CMOS-FETs and IGZO-FETs;

FIG. 33A shows a shmoo plot of backup time, and FIG. 33B shows a shmoo plot of restoration time;

DETAILED DESCRIPTION OF THE INVENTION

Figure 1A:
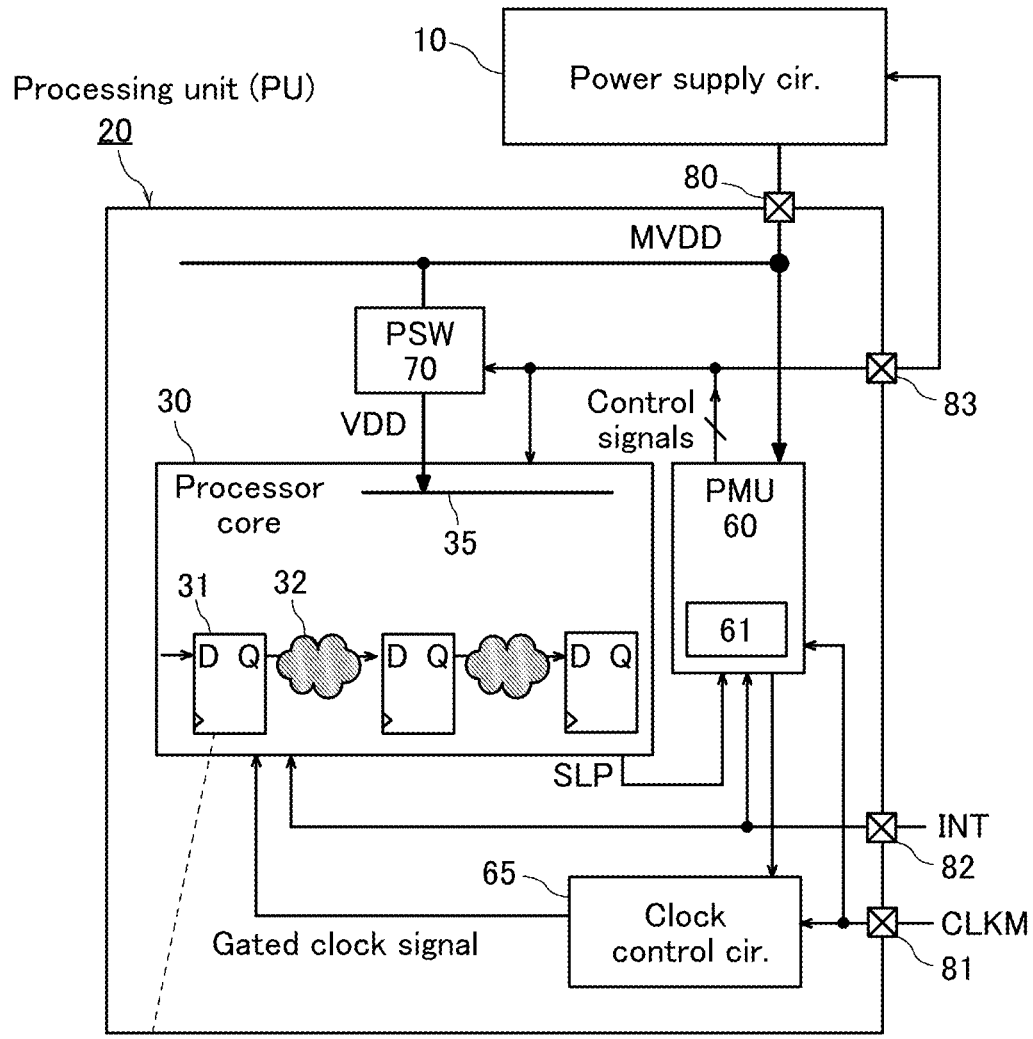
FIGS. 1A and 1B are Prior Art block diagrams showing a structure example of a semiconductor device.

Embodiments will be described in detail with reference to the drawings. Note that the present invention is not limited to the following description, and it will be readily appreciated by those skilled in the art that modes and details can be modified in various ways without departing from the spirit and the scope of the present invention. Therefore, the present invention should not be construed as being limited to the description in the following embodiments. Note that in the structures of the invention described below, the same portions or portions having similar functions are denoted by the same reference numerals in different drawings, and description of such portions is not repeated.

The position, size, range, and the like of each component illustrated in the drawings and the like are not accurately represented in some cases to facilitate understanding of the invention. Therefore, the disclosed invention is not necessarily limited to the position, size, range, and the like disclosed in the drawings and the like. For example, in the actual manufacturing process, a resist mask or the like might be unintentionally reduced in size by treatment such as etching, which is not illustrated in some cases for easy understanding.

In a top view (also referred to as a plan view), a perspective view, or the like, some components might not be illustrated for easy understanding of the drawings.

In this specification and the like, the term such as "electrode" or "wiring" does not limit the function of a component. For example, an "electrode" is used as part of a "wiring" in some cases, and vice versa. Furthermore, the term "electrode" or "wiring" can also mean a combination of a plurality of electrodes or wirings provided in an integrated manner, for example.

In this specification and the like, a "terminal" in an electric circuit refers to a portion that inputs or outputs current or voltage or receives or transmits a signal. Accordingly, part of a wiring or an electrode functions as a terminal in some cases.

Note that the term "over" or "under" in this specification and the like does not necessarily mean that a component is placed "directly over and in contact with" or "directly under and in contact with" another component. For example, the expression "electrode B over insulating layer A" does not necessarily mean that the electrode B is on and in direct contact with the insulating layer A and can mean the case where another component is provided between the insulating layer A and the electrode B.

Furthermore, functions of a source and a drain might be switched depending on operation conditions, e.g., when a transistor of opposite polarity is employed or a direction of current flow is changed in circuit operation. Therefore, it is difficult to define which is a source or a drain. Thus, the terms "source" and "drain" can be interchanged with each other in this specification.

In this specification and the like, the expression "electrically connected" includes the case where components are directly connected to each other and the case where components are connected through an object having any electric function. There is no particular limitation on an object having any electric function as long as electric signals can be transmitted and received between components that are connected through the object. Thus, even when the expression "electrically connected" is used, there is a case where no physical connection is made and a wiring just extends in an actual circuit.

In this specification and the like, the term "parallel" indicates that the angle formed between two straight lines is greater than or equal to −10° and less than or equal to 10°, for example, and accordingly also includes the case where the angle is greater than or equal to −5° and less than or equal to 5°. The terms "perpendicular" and "orthogonal" indicate that the angle formed between two straight lines is greater than or equal to 80° and less than or equal to 100°, for example, and accordingly also includes the case where the angle is greater than or equal to 85° and less than or equal to 95°.

In this specification and the like, the terms "identical", "the same", "equal", "uniform", and the like used in describing calculation values and actual measurement values allow for a margin of error of ±20% unless otherwise specified.

Note that voltage refers to a potential difference between a given potential and a reference potential (e.g., a ground potential or a source potential) in many cases. Therefore, the terms "voltage" and "potential" can be replaced with each other in many cases. In this specification and the like, "voltage" and "potential" can be replaced with each other unless otherwise specified.

Note that a "semiconductor" has characteristics of an "insulator" when the conductivity is sufficiently low, for example. Thus, a "semiconductor" and an "insulator" can be replaced with each other. In that case, a "semiconductor" and an "insulator" cannot be strictly distinguished from each other because a border therebetween is not clear. Accordingly, a "semiconductor" and an "insulator" in this specification can be replaced with each other in some cases.

Furthermore, a "semiconductor" has characteristics of a "conductor" when the conductivity is sufficiently high, for example. Thus, a "semiconductor" and a "conductor" can be replaced with each other. In that case, a "semiconductor" and a "conductor" cannot be strictly distinguished from each other because a border therebetween is not clear. Accordingly, a "semiconductor" and a "conductor" in this specification can be replaced with each other in some cases.

Note that the ordinal numbers such as "first" and "second" in this specification and the like are used in order to avoid confusion among components and do not denote the priority or the order such as the order of steps or the stacking order. A term without an ordinal number in this specification and the like might be provided with an ordinal number in a claim in order to avoid confusion among components. A term with an ordinal number in this specification and the like might be provided with a different ordinal number in a claim. A term with an ordinal number in this specification and the like might not be provided with an ordinal number in a claim and the like.

Note that in this specification and the like, an "on state" of a transistor refers to a state in which a source and a drain of the transistor are electrically short-circuited (also referred to as a "conduction state"). Furthermore, an "off state" of the transistor refers to a state in which the source and the drain of the transistor are electrically disconnected (also referred to as a "non-conduction state").

In this specification and the like, in some cases, "on-state current" means a current that flows between a source and a drain when a transistor is in an on state, and "off-state current" means a current that flows between a source and a drain when a transistor is in an off state.

In this specification and the like, a high power supply potential VDD (hereinafter, also simply referred to as "VDD", "H potential", or "H") is a power supply potential higher than a low power supply potential VSS (hereinafter, also simply referred to as "VSS", "L potential", or "L"). Moreover, VSS is a power supply potential lower than VDD. In addition, a ground potential (hereinafter, also simply referred to as "GND" or "GND potential") can be used as VDD or VSS. For example, in the case where a ground potential is used as VDD, VSS is lower than the ground potential, and in the case where a ground potential is used as VSS, VDD is higher than the ground potential.

In this specification and the like, a gate refers to part or the whole of a gate electrode and a gate wiring. A gate wiring refers to a wiring for electrically connecting at least one gate electrode of a transistor to another electrode or another wiring.

In this specification and the like, a source refers to part or the whole of a source region, a source electrode, and a source wiring. A source region refers to a region in a semiconductor layer, where the resistivity is lower than or equal to a given value. A source electrode refers to part of a conductive layer, which is connected to a source region. A source wiring refers to a wiring for electrically connecting at least one source electrode of a transistor to another electrode or another wiring.

In this specification and the like, a drain refers to part or the whole of a drain region, a drain electrode, and a drain wiring. A drain region refers to a region in a semiconductor layer, where the resistivity is lower than or equal to a given value. A drain electrode refers to part of a conductive layer, which is connected to a drain region. A drain wiring refers to a wiring for electrically connecting at least one drain electrode of a transistor to another electrode or another wiring.

In the drawings and the like, for easy understanding of the potential of a wiring, an electrode, or the like, "H" representing an H potential or "L" representing an L potential is sometimes written near the wiring, the electrode, or the like. In addition, enclosed "H" or "L" is sometimes written near a wiring, an electrode, or the like whose potential changes. Moreover, a symbol "x" is sometimes written on a transistor in an off state.

Embodiment 1

A semiconductor device capable of power gating, a power management mechanism of the semiconductor device, and the like are described.

<Structure Example 1 of Semiconductor Device>

A Prior Art semiconductor device and power management thereof are described with reference to FIGS. 1A and 1B. The semiconductor device in FIG. 1A includes Prior Art a power supply circuit 10 and a processing unit (PU) 20. The PU 20 has a function of executing an instruction. The PU 20 includes a plurality of functional circuits integrated over one chip. The PU 20 further includes a processor core 30, a power management unit (PMU) 60, a clock control circuit 65, a power switch (PSW) 70, and terminals 80 to 83. FIG. 1A shows an example in which the Prior Art power supply circuit 10 is provided over a chip different from a chip over which the PU 20 is provided. A power supply potential VDD is input from the power supply circuit 10 to the terminal 80. A reference clock signal CLKM is input from the outside to the terminal 81. A signal INT is input from the outside to the terminal 82. The signal INT is an interrupt signal for requesting interrupt processing. The signal INT is input to the PU 20 and the PMU 60. A control signal generated in the PMU 60 is output to the terminal 83, and the terminal 83 is electrically connected to the power supply circuit 10.

<Processor Core 30 and Storage Circuit 31>

The processor core 30 is capable of executing an instruction and can be referred to as an arithmetic processing circuit. The processor core 30 includes a storage circuit 31, a combinational circuit 32, and the like, and a variety of functional circuits are formed using these circuits. For example, the storage circuit 31 is included in a register.

Figure 1B:
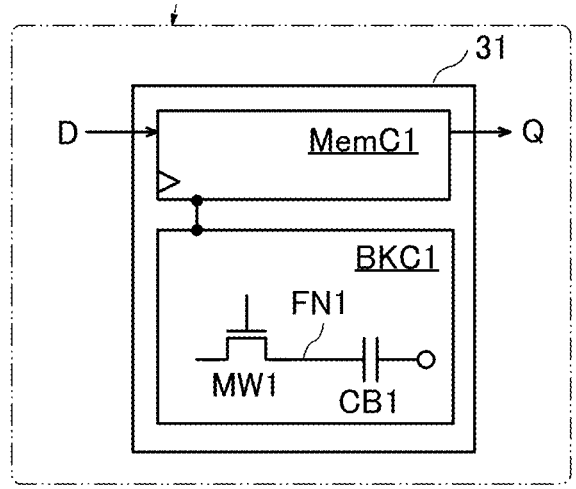

As shown in FIG. 1B, the storage circuit 31 includes a circuit MemC1 and a circuit BKC1. The circuit MemC1 has a function of retaining data generated in the processor core 30, and can be formed using a flip-flop circuit (FF) or a latch circuit, for example. The circuit BKC1 can function as a backup circuit of the circuit MemC1, and can retain data for a long time even when power supply is stopped or supply of a clock signal is stopped. The use of the storage circuit 31 enables power gating of the processor core 30. This is because the state of the processor core 30 at the time of power-off can be retained by saving data of the circuit MemC1 to the circuit BKC1 in the storage circuit 31 before power-off. When the power supply is restarted, data retained in the circuit BKC1 is written to the circuit MemC1; thus, the state of the processor core 30 at the time of power-off can be restored. Consequently, the PU 20 can perform normal processing immediately after the power supply is restarted.

The circuit BKC1 includes at least a retention circuit including one transistor (MW1) and one capacitor (CB1). The retention circuit in FIG. 1B has a circuit configuration similar to a 1T1C (one transistor and one capacitor) memory cell configuration of a standard dynamic random access memory (DRAM), and can perform write and read operations as in the standard DRAM. By control of the conduction state of the transistor MW1, charging and discharging of the capacitor CB1 are controlled. When the transistor MW1 is turned off, a node FN1 is brought into an electrically floating state. Fluctuation in the potential of the node FN1 can be inhibited by a significant reduction in the drain current of the transistor MW1 in an off state (off-state current); thus, the data retention time of the circuit BKC1 can be made longer. The data retention time of the circuit BKC1 is determined by the leakage current of the transistor MW1, the capacitance of the capacitor CB1, and the like. The use of the transistor MW1 having an extremely low off-state current eliminates the necessity of refreshing the circuit BKC1 while the PU 20 operates. Thus, the circuit BKC1 can be used as a nonvolatile storage circuit.

A transistor including an oxide semiconductor (OS), which is one kind of metal oxide, in a semiconductor layer where a channel is formed (such a transistor is also referred to as an "OS transistor" or "OS-FET") is preferably used as the transistor MW1. An oxide semiconductor has a band gap of 2 eV or more and thus has an extremely low off-state current. In an OS transistor, a normalized off-state current per micrometer of channel width at a source-drain voltage of 10 V can be less than or equal to $10 \times 10^{-21}$ Å (10 zA (zeptoampere)). When the transistor MW1 is an OS transistor, the circuit BKC1 can substantially function as a nonvolatile storage circuit while the PU 20 operates. In Embodiment 2, an OS transistor is described.

An oxide semiconductor film used for a semiconductor layer where a channel is formed may be formed of a single oxide semiconductor film or stacked oxide semiconductor films. An oxide semiconductor included in the semiconductor layer where a channel is formed is preferably an oxide containing at least one or more elements selected from In, Ga, Sn, and Zn. As such an oxide, an In—Sn—Ga—Zn oxide, an In—Ga—Zn oxide, an In—Sn—Zn oxide, an In—Al—Zn oxide, a Sn—Ga—Zn oxide, an Al—Ga—Zn oxide, a Sn—Al—Zn oxide, an In—Zn oxide, a Sn—Zn oxide, an Al—Zn oxide, a Zn—Mg oxide, a Sn—Mg oxide, an In—Mg oxide, an In—Ga oxide, an In oxide, a Sn oxide, a Zn oxide, or the like can be used.

Data is written with voltage in the circuit BKC1; thus, the write power of the circuit BKC1 can be lower than that of a magnetoresistive random access memory (MRAM) in which data is written with current. Furthermore, unlike in a flash memory, the number of data rewriting times is not limited because data is retained by the load capacitance of the node FN1.

In the circuit BKC1, energy required for data writing corresponds to energy required for charging and discharging of charge in the capacitor CB1. By contrast, in a storage circuit including a two-terminal memory element such as an MRAM, energy required for data writing corresponds to energy consumed when current flows to the memory element. In the MRAM, energy required for data writing is high because current continuously flows during a data writing period. As compared with such an MRAM, the circuit BKC1 can reduce energy consumed by data writing. Thus, as compared with a storage circuit in which a backup circuit is formed using an MRAM, the storage circuit 31 can frequently perform voltage scaling and power gating for reducing consumed energy, which leads to a reduction in the power consumption of the PU 20.

<Power Management>

The PMU 60 has a function of controlling power gating operation, clock gating operation, voltage scaling operation, and the like. Specifically, the PMU 60 is capable of controlling the power supply circuit 10, capable of controlling the storage circuit 31, capable of controlling the clock control circuit 65, and capable of controlling the PSW 70. Thus, the PMU 60 has a function of generating control signals for controlling the circuits 10, 31, 65, and 70. The PMU 60 includes a circuit 61. The circuit 61 is capable of measuring time. The PMU 60 is capable of performing power management on the basis of data on time obtained by the circuit 61.

The PSW 70 is capable of controlling supply of a power supply potential MVDD to the PU 20 in response to a control signal of the PMU 60. Here, a power supply potential supplied to the PU 20 through the PSW 70 is referred to as the power supply potential VDD. The processor core 30 may include a plurality of power domains. In that case, supply of power to the plurality of power domains may be controlled independently by the PSW 70. In addition, the processor core 30 may include a power domain that does not require power gating. In that case, a power supply potential may be supplied to this power domain without through the PSW 70.

The reference clock signal CLKM is input to the clock control circuit 65, and the clock control circuit 65 has a function of generating and outputting a gated clock signal. The clock control circuit 65 is capable of stopping supply of a clock signal to the processor core 30 in response to a control signal of the PMU 60. The power supply circuit 10 is capable of changing the magnitude of the potential VDD in response to a control signal of the PMU 60.

A signal SLP output from the processor core 30 to the PMU 60 is a trigger signal for transferring the processor core 30 to a resting state. When the signal SLP is input to the PMU 60, the PMU 60 generates a control signal for transition to a resting state and outputs the control signal to a functional circuit to be controlled. The power supply circuit 10 makes MVDD lower than that in normal operation in response to a control signal of the PMU 60. After the processor core 30 is in the resting state for a certain period of time, the PMU 60 controls the PSW 70 and stops power supply to the processor core 30. When the processor core 30 is transferred from a normal state to the resting state, the PMU 60 performs voltage scaling operation for lowering the power supply potential VDD of the processor core 30. When the period of the resting state exceeds the set time, the PMU 60 performs power gating operation for stopping supply of VDD to the processor core 30 in order to further reduce the power consumption of the processor core 30. Power management of the semiconductor device in FIGS. 1A and 1B is described below with reference to FIGS. 2A to 2D and FIG. 3.

Figure 2A:
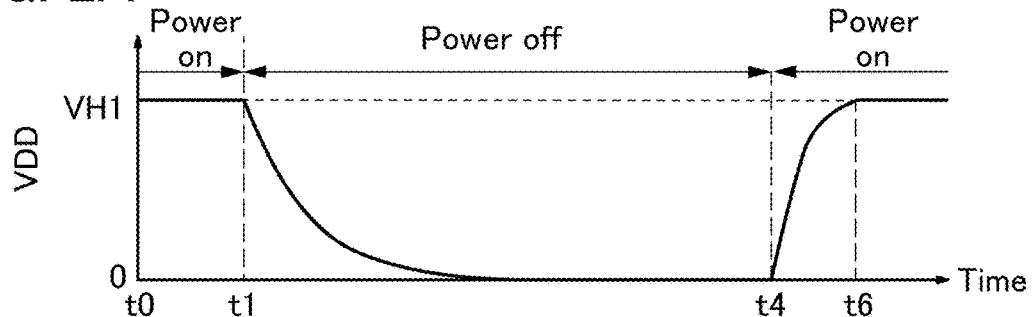
FIGS. 2A to 2D show Prior Art power management operation examples of semiconductor devices.
Figure 2B:
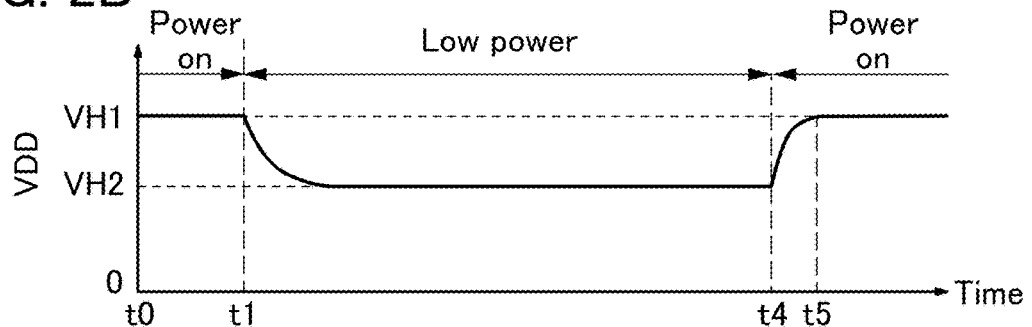
Figure 2C:
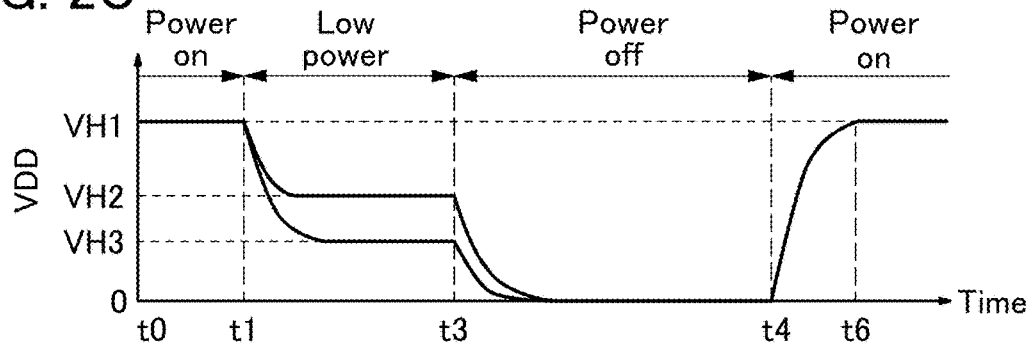
Figure 2D:
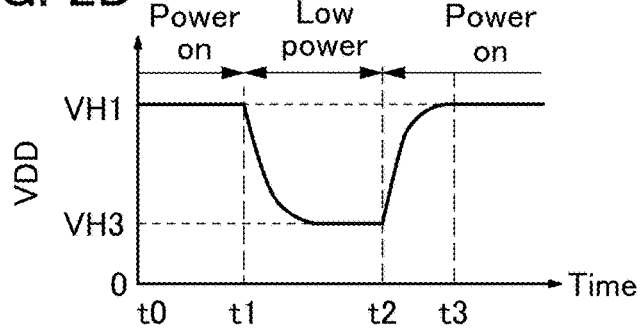
Figure 3:
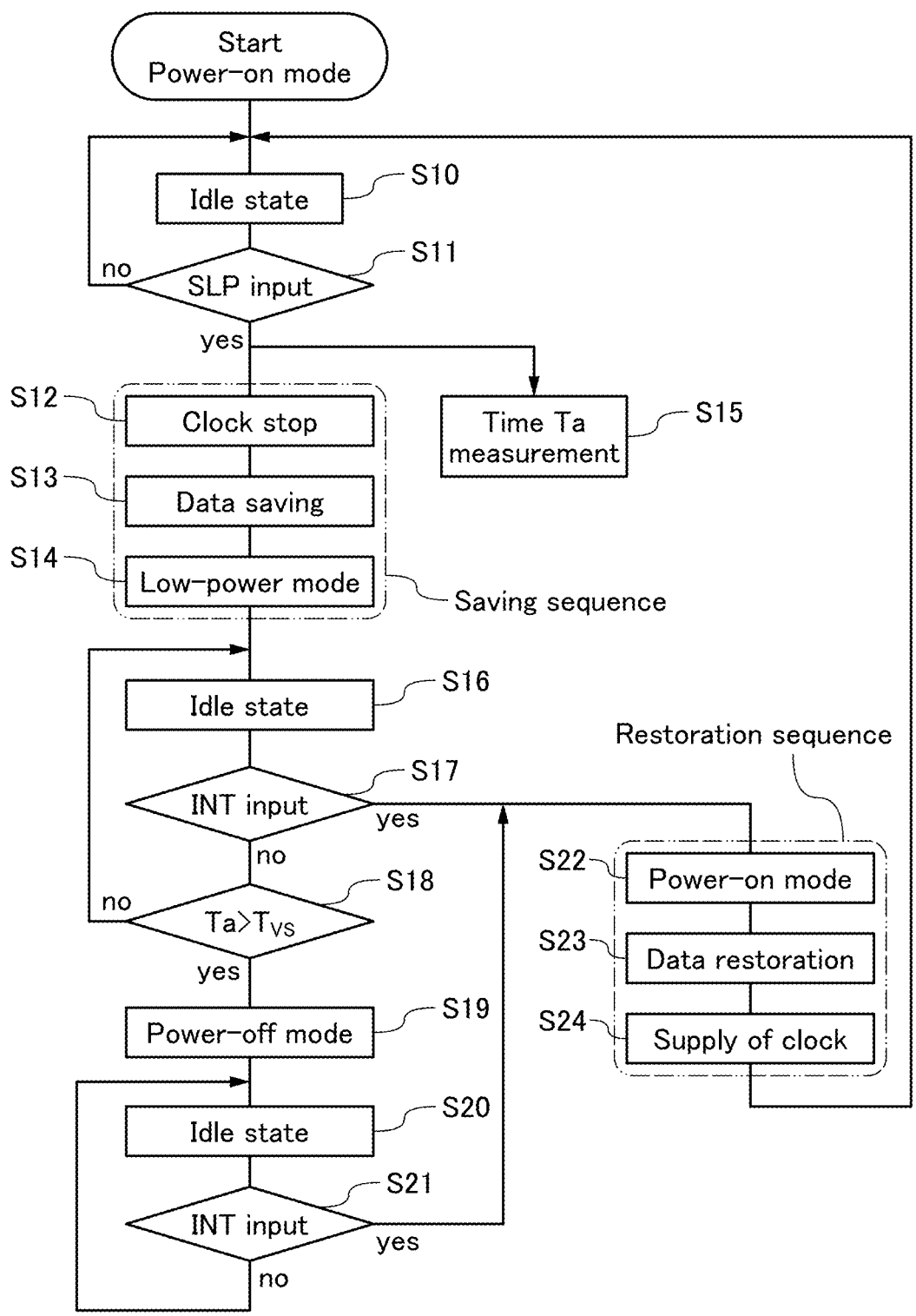
FIG. 3 is a Prior Art flow chart showing a power management operation example of a semiconductor device.

FIGS. 2A to 2D schematically show changes in the potential of a power supply line. The power supply potential VDD is supplied to the power supply line through the PSW 70. The horizontal axis in the graph shows the time elapsing between transition from the normal state to the resting state, and t0, t1, and the like each represent time. FIG. 2A shows an example in which only power gating is performed in the resting state. FIG. 2B shows an example in which only voltage scaling is performed in the resting state. FIGS. 2C and 2D each show an example in which voltage scaling and power gating are performed. In the normal state, the magnitude of the power supply potential MVDD supplied from the power supply circuit 10 is VH1.

In the following description, the power mode of the PU 20 is divided into three modes: a power-on mode, a power-off mode, and a low-power mode. In the power-on mode, the power supply potential VDD that enables normal processing is supplied to the PU 20. In the power-off mode, the supply of VDD is stopped by the PSW 70. In the low-power mode, the power supply potential VDD lower than that in the power-on mode is supplied.

The example in FIG. 2A is described. At the time t0, processing for transition to the resting state is started in the processor core 30. For example, data of the storage circuit 31 is backed up. The PMU 60 controls the PSW 70 and stops supply of power to the processor core 30 at the time t1. A power supply line 35 is self-discharged and its potential is decreased to 0 V. Consequently, leakage current of the processor core 30 in the resting state can be significantly lowered, so that power consumption in the resting state (hereinafter, referred to as standby power in some cases) can be reduced. In the case where the processor core 30 returns to the normal state in response to an interrupt request or the like from the outside, the PMU 60 controls the PSW 70 and restarts the supply of VDD. Here, at time t4, the supply of VDD is restarted. The potential of the power supply line 35 increases and becomes VH1 at time t6.

In the case of FIG. 2B, voltage scaling is performed; thus, at the time t1, the PMU 60 controls the power supply circuit 10 and lowers the potential of MVDD to VH2. The potential of the power supply line 35 eventually becomes VH2. At the time t4, when the power supply potential MVDD changes from VH2 to VH1, the potential of the power supply line 35 increases and becomes VH1 at time t5.

In the case of FIG. 2A, time taken for the return from the resting state to the normal state (overhead time) is time taken to increase the potential of the power supply line 35 from 0 V to VH1, and an energy overhead required for the return is energy required to charge the load capacitance of the power supply line 35 from 0 V to VH1. When the period of the power-off mode (t1 to t4) is sufficiently long, power gating is effective in reducing standby power of the PU 20. By contrast, when the period (t1 to t4) is short, power required for the return to the normal state is higher than power reduced by power-off; therefore, the effect of power gating cannot be obtained.

In the example of voltage scaling in FIG. 2B, the potential of the power supply line 35 is VH2 in the resting state; thus, the amount of standby power reduction is smaller than that in the example of power gating in FIG. 2A. In the example of FIG. 2B, fluctuation in the potential of the power supply line 35 is small; therefore, time taken for the return to the normal state is shorter than that in the example of FIG. 2A and energy required for the return to the normal state is lower than that in the example of FIG. 2A. Accordingly, the semiconductor device in FIGS. 1A and 1B can perform power management in which power gating and voltage scaling are combined to efficiently reduce the standby power of the PU 20. FIGS. 2C and 2D each show a power management example.

As shown in FIG. 2C, first, voltage scaling operation is performed in the resting state and the mode is transferred from the power-on mode to the low-power mode. As in FIG. 2B, at the time t1, the PMU 60 controls the power supply circuit 10 and lowers the potential of MVDD to VH2; thus, the potential of the power supply line 35 eventually becomes VH2. After a certain period of time from transition to the low-power mode (t1 to t3), the PMU 60 controls the PSW 70 and transfers the mode to the power-off mode. In the period (t3 to t4), power reduced by powering off the PU 20 by power gating is higher than power reduced by supplying VH2 to the PU 20 though the power reduced by powering off the PU 20 by power gating include power consumed by returning to the normal state.

For example, the potential VH2 is a power supply potential high enough to retain data in the circuit MemC1 of the storage circuit 31, and a potential VH3 is a potential at which data of the circuit MemC1 is lost. In the PU 20 of FIG. 1A, the circuit BKC1 can retain data even while power supply is stopped. When data of the storage circuit 31 is saved to the circuit BKC1 in the period (t0 to t1), VDD can be lowered to the potential VH3 at which data of the circuit MemC1 is lost in the low-power mode. Thus, the standby power of the PU 20 can be further reduced.

The PMU 60 is capable of returning the PU 20 to the normal state in response to an interrupt request or the like. The PMU 60 controls the power supply circuit 10 to increase the magnitude of MVDD to VH1 and controls the PSW 70 to restart the supply of VDD from the PU 20. After the time t4, the power-on mode continues. In the case where the potential of the power supply line 35 is stabilized at the time t6, the PU 20 can perform normal operation after the time t6.

FIG. 2D shows an example in which an interrupt request for the return to normal operation is input before the time t3. After the time t2, the power-on mode continues. At the time t2, the PMU 60 controls the power supply circuit 10 to change the magnitude of MVDD to the potential VH1 in the power-on mode. At the time t3, the potential of the power supply line 35 increases to VH1.

As shown in FIGS. 2C and 2D, time required to restore the potential of the power supply line 35 to VH1 in the resting state is longer when the mode returns from the power-off mode to the power-on mode than when the mode returns from the low-power mode to the power-on mode. Thus, the PMU 60 is capable of adjusting timing of returning the processor core 30 from the resting state to the normal state depending on the power mode. Accordingly, the processor core 30 can return from the resting state to the normal state in the minimum time.

In the resting state, transition time from the low-power mode to the power-off mode can be measured by the circuit 61 provided in the PMU 60. When the signal SLP is input from the PU 20, the PMU 60 starts time measurement in the circuit 61. After a certain period of time from transition to the low-power mode, the PMU 60 is transferred to the power-off mode. The PSW 70 is turned off by a control signal of the PMU 60, and the supply of VDD is stopped. In this manner, the PMU 60 can be transferred from the low-power mode to the power-off mode in response to an interrupt request based on measurement data of the circuit 61. A power management operation example of the PMU 60 is described below with reference to FIG. 3.

The PU 20 performs normal operation. The power mode is a power-on mode and the PMU 60 is in an idle state (Step S10). The PMU 60 is in the idle state until the signal SLP is input, and a saving sequence is executed with input of the signal SLP as a trigger (Step S11). In the saving sequence example of FIG. 3, first, the PMU 60 outputs a control signal to the clock control circuit 65 and stops output of a clock signal (Step S12). Next, a control signal for data saving is output to the storage circuit 31 (Step S13). In the storage circuit 31, data retained in the circuit MemC1 is saved to the circuit BKC1 in response to a control signal of the PMU 60. Finally, the PMU 60 controls the power supply circuit 10 to lower MVDD. Through these operations, the power mode is transferred to the low-power mode (Step S14). When the signal SLP is input, the PMU 60 controls the circuit 61 included therein and measures time Ta in the low-power mode (Step S15). Timing of operating the circuit 61 may be any timing as long as the saving sequence is executed. For example, the circuit 61 may operate when the signal SLP is input, when a control signal is output to the clock control circuit 65, when data saving is started, when data saving is terminated, or when a control signal is output to the power supply circuit 10.

After the saving sequence is executed, the PMU 60 is set in an idle state (Step S16), and monitors input of the signal INT and the measurement time Ta of the clock control circuit 65. When the signal INT is input, the sequence is transferred to a restoration sequence (Step S17). Then, whether the time Ta exceeds set time $T_{vs}$ is determined (Step S18). When the time Ta exceeds the time $T_{vs}$, the PMU 60 transfers the power mode to the power-off mode (Step S19). When the time Ta does not exceed the time $T_{vs}$, the PMU 60 remains in the idle state (Step S16). The time $T_{vs}$ is set such that standby power of the processor core 30 in the power-off mode can be lower than standby power of the processor core 30 in the low-power mode.

In Step S19, the PMU 60 outputs, to the PSW 70, a control signal for stopping supply of power to the processor core 30. After the mode is transferred to the power-off mode, the PMU 60 is set in the idle state again (Step S20), and input of the signal INT is monitored (Step S21). When the signal INT is input, the PMU 60 executes the restoration sequence.

In the restoration sequence, first, the PMU 60 is transferred from the power-off mode to the power-on mode (Step S22). The PMU 60 controls the power supply circuit 10 to output a power supply potential in normal operation. In addition, the PMU 60 controls the PSW 70 to restart the supply of VDD to the processor core 30. Next, a control signal is output to the storage circuit 31 and data of the storage circuit 31 is restored (Step S23). In the storage circuit 31, data retained in the circuit BKC1 is restored to the circuit MemC1 in response to a control signal of the PMU 60. The PMU 60 outputs a control signal for outputting a clock signal to the clock control circuit 65 (Step S24). The clock control circuit 65 restarts the output of a clock signal in response to a control signal of the PMU 60.

As compared with the case where the restoration sequence is executed in accordance with determination in Step S21, the potential of the power supply line 35 can be quickly stabilized in the case where the restoration sequence is executed in accordance with determination in Step S17 because the power mode returns from the low-power mode to the power-on mode. Thus, in the PMU 60, timing of executing Step S23 when the restoration sequence is executed in accordance with Step S17 is faster than that when the restoration sequence is executed in accordance with Step S21. Consequently, time taken to return the processor core 30 from the resting state to the normal state can be shortened.

As described above, in power management of the semiconductor device in FIGS. 1A and 1B, when the PU 20 is set in the resting state, first, time and energy overheads due to the return from the resting state to the normal state are suppressed while leakage current is reduced by lowering a power supply potential supplied to the processor core 30 with voltage scaling operation. When the PU 20 is in the resting state for a certain period of time, power gating operation is performed to reduce the leakage current of the processor core 30 as much as possible. Thus, the power consumption of the PU 20 in the resting state can be reduced without a decrease in the processing performance of the PU 20.

<<Structure Example 2 of Semiconductor Device>>

Figure 4A:
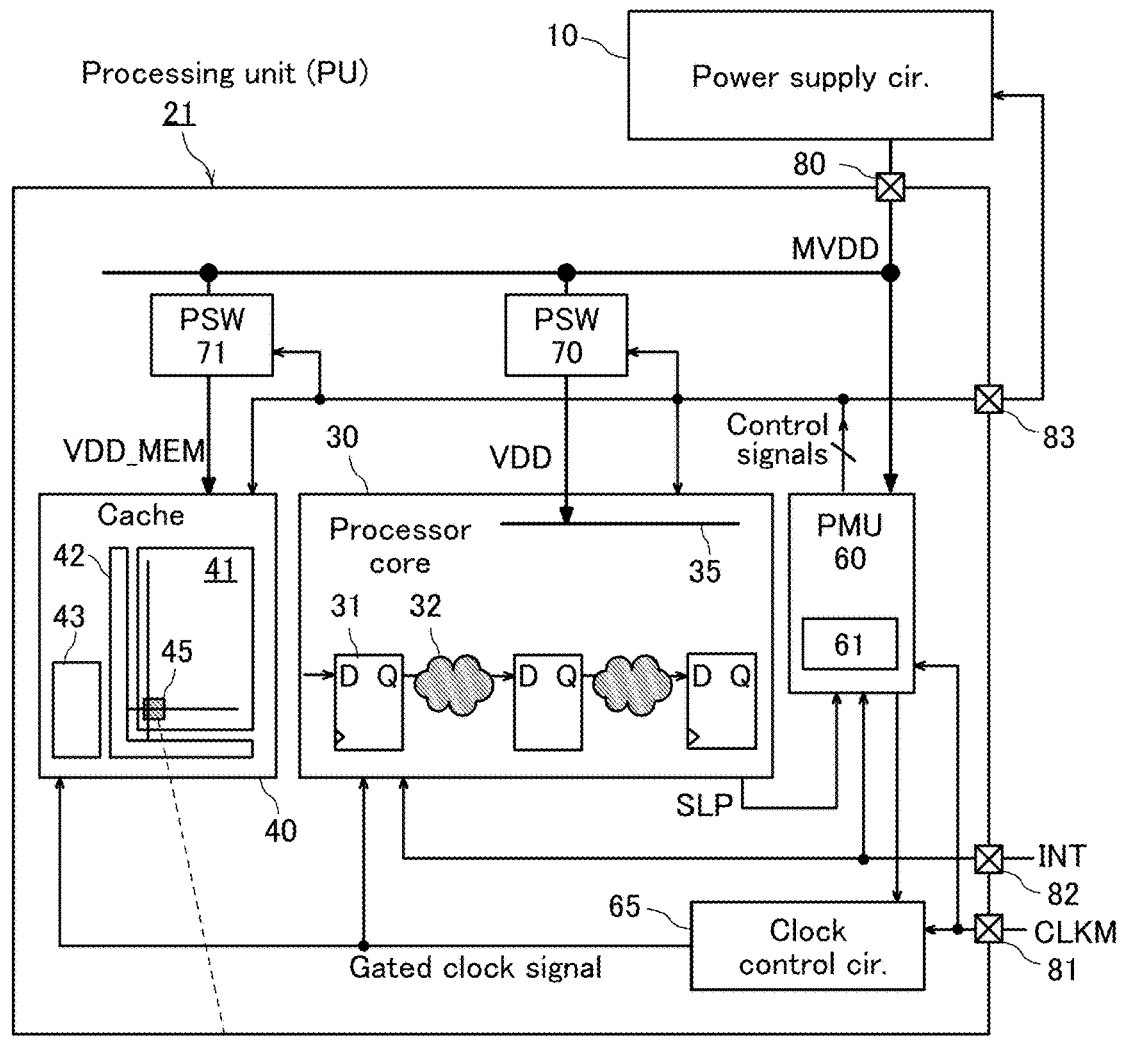
FIGS. 4A and 4B are Prior Art block diagrams showing a structure example of a semiconductor device.

FIG. 4A shows a modification example of the semiconductor device in FIG. 1A. A processing unit (PU) 21 in FIG. 4A is obtained by addition of a cache 40 and a power switch (PSW) 71 to the PU 20. The cache 40 can perform power gating and voltage scaling as in the PU 20, and the power mode of the cache 40 changes along with a change in the power mode of the PU 21. The PSW 71 controls supply of the power supply potential MVDD to the cache 40 and is controlled by the PMU 60. Here, a power supply potential input to the cache 40 through the PSW 71 is VDD_MEM. As in the processor core 30, a control signal from the PMU 60 and a gated clock signal from the clock control circuit 65 are input to the cache 40.

<Cache 40>

The cache 40 is a storage device having a function of temporarily storing frequently used data. The cache 40 includes a memory array 41, a peripheral circuit 42, and a control circuit 43. The memory array 41 includes a plurality of memory cells 45. The control circuit 43 controls operation of the cache 40 in response to a request from the processor core 30. For example, the control circuit 43 controls write and read operations of the memory array 41. The peripheral circuit 42 has a function of generating a signal for driving the memory array 41 in response to a control signal from the control circuit 43. The memory array 41 includes the memory cells 45 for retaining data.

Figure 4B:
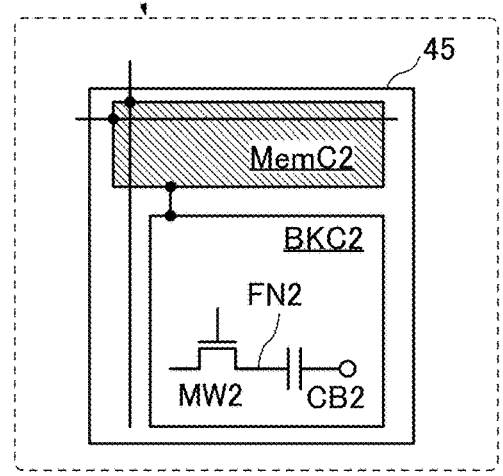

As shown in FIG. 4B, the memory cells 45 each include a circuit MemC2 and a circuit BKC2. The circuit MemC2 is a memory cell to be accessed in normal operation. For example, a static random access memory (SRAM) cell is used. The circuit BKC2 can function as a backup circuit of the circuit MemC2, and can retain data for a long time even while power supply is stopped or supply of a clock signal is stopped. When such memory cells 45 are provided, power gating of the cache 40 can be performed. Before the power supply is stopped, data of the circuit MemC2 is saved to the circuit BKC2 in each of the memory cells 45. After the power supply is restarted, data retained in the circuit BKC2 is restored to the circuit MemC2, so that the PU 21 can quickly return to the state before the power supply is stopped.

Like the circuit BKC1 in FIG. 1B, the circuit BKC2 in each of the memory cells 45 includes at least a retention circuit including one transistor (MW2) and one capacitor (CB2). In other words, the circuit BKC2 also includes a retention circuit having a configuration similar to that of a 1T1C memory cell of a standard DRAM. The transistor MW2 has an extremely low off-state current. As in the transistor MW1, an OS transistor is used as the transistor MW2. Such a structure can suppress fluctuation in the potential of a node FN2 that is electrically floating also in the circuit BKC2; thus, the circuit BKC2 can retain data for a long time. The data retention time of the circuit BKC2 is determined by the leakage current of the transistor MW2, the capacitance of the capacitor CB2, and the like. When the transistor MW2 has an extremely low off-state current, the circuit BKC2 can be used as a nonvolatile storage circuit that does not need refresh operation.

As in the PU 20, the PMU 60 performs power management (see FIG. 3) in the PU 21 in FIG. 4A. In Step S13 in FIG. 3, data saving operation of the storage circuit 31 and the cache 40 is performed. In Step S19, the PSW 70 and the PSW 71 are controlled to stop supply of power to the processor core 30 and the cache 40. In Step S22, the PSW 70 and the PSW 71 are controlled to restart the supply of power to the processor core 30 and the cache 40. In Step S23, data restoration operation of the storage circuit 31 and the cache 40 is performed.

Thus, like the semiconductor device in FIGS. 1A and 1B, the semiconductor device in FIGS. 4A and 4B can reduce power in the resting state of the PU 21 without a decrease in processing performance of the PU 21 by power management in which voltage scaling and power gating are combined.

<<Processor Core Structure Example>>

Figure 5:
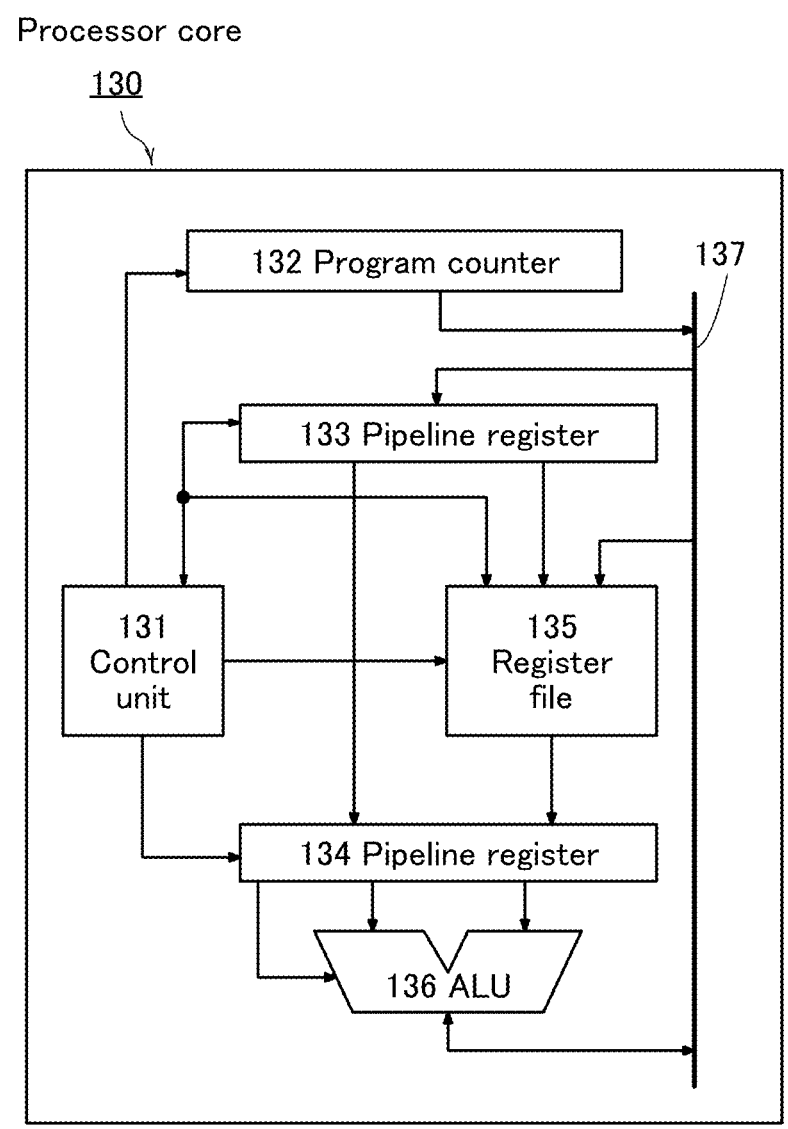
FIG. 5 is a Prior Art block diagram showing a processor core structure example.

FIG. 5 shows a Prior Art processor core structure example. A processor core 130 in FIG. 5 includes a control unit 131, a program counter 132, a pipeline register 133, a pipeline register 134, a register file 135, an arithmetic logic unit (ALU) 136, and a data bus 137. Data is transmitted between the processor core 130 and a peripheral circuit such as a PMU or a cache through the data bus 137.

The control unit 131 has a function of decoding and executing instructions contained in a program such as input applications by controlling the overall operations of the program counter 132, the pipeline register 133, the pipeline register 134, the register file 135, the ALU 136, and the data bus 137. The ALU 136 has a function of performing a variety of arithmetic operations such as four arithmetic operations and logic operations. The program counter 132 is a register having a function of storing the address of an instruction to be executed next.

The pipeline register 133 has a function of temporarily storing instruction data. The register file 135 includes a plurality of registers including a general-purpose register and can store data read out from a main memory, data obtained as a result of arithmetic operations in the ALU 136, or the like. The pipeline register 134 has a function of temporarily storing data used for arithmetic operations performed in the ALU 136, data obtained as a result of arithmetic operations in the ALU 136, or the like.

The storage circuit 31 in FIG. 1B is used as the register included in the processor core 130.

<Storage Circuit Structure Example>

Figure 6:
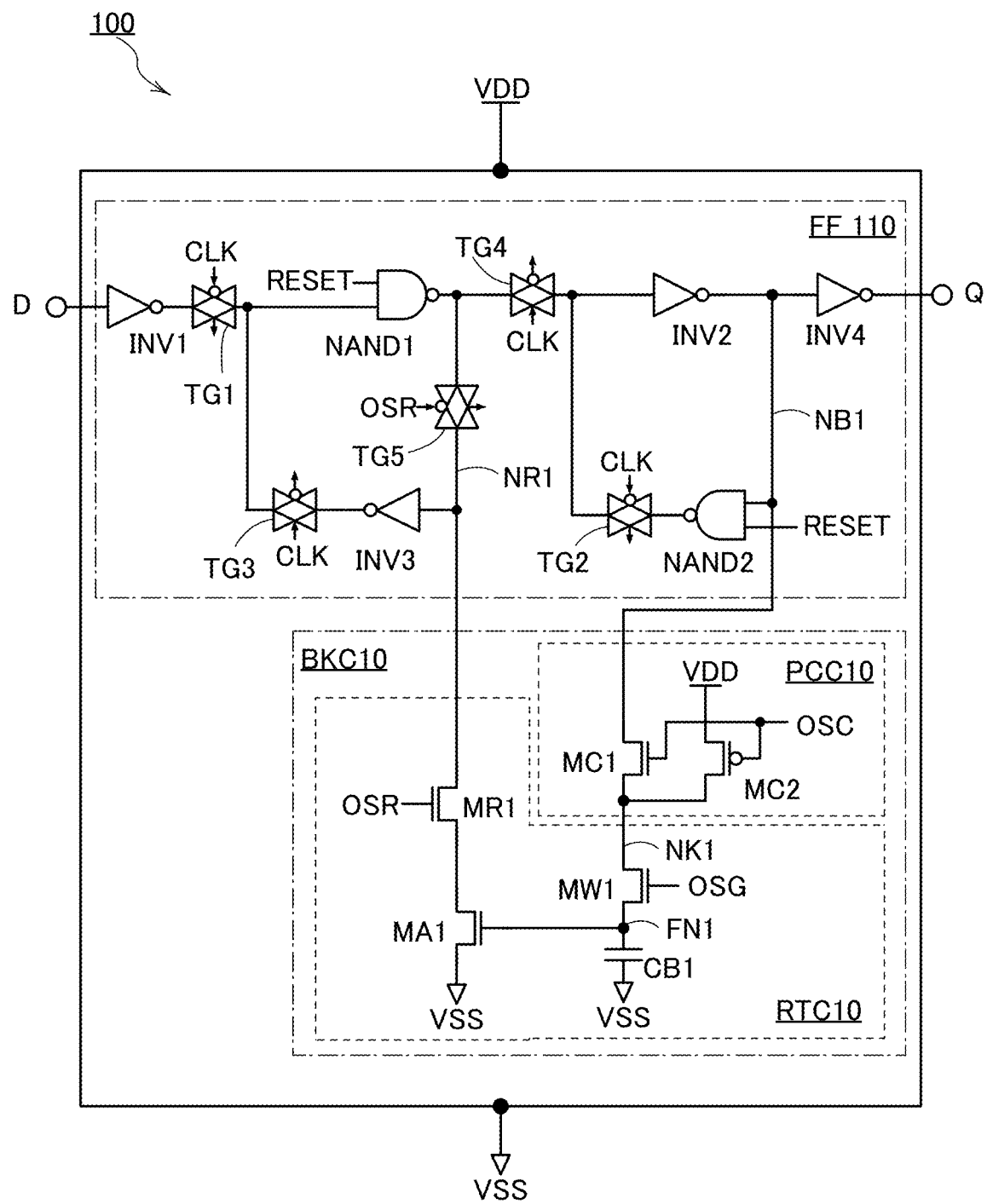
FIG. 6 is a Prior Art circuit diagram showing a storage circuit structure example.

A specific structure example of the storage circuit 31 in FIG. 1B is described. FIG. 6 is a Prior Art circuit diagram showing a storage circuit structure example. A storage circuit 100 in FIG. 6 functions as a flip-flop circuit.

A standard flip-flop circuit (FF), for example, a master slave FF can be used as the circuit MemC1. Such a structure example is shown in FIG. 6. An FF 110 includes transmission gates TG1, TG2, TG3, TG4, and TG5, inverter circuits INV1 and INV2, and NAND circuits NAND1 and NAND2. A signal RESET and a signal OSR are control signals output from the PMU 60. The signal OSR and an inverted signal of the signal OSR are input to TG5. A clock signal CLK and an inverted signal of the clock signal CLK are input to TG1 to TG4. One clocked inverter circuit may be provided instead of TG1 and INV1. One clocked NAND circuit may be provided instead of TG2 and NAND2. A clocked inverter circuit may be provided instead of TG3 and INV3. TG5 functions as a switch that controls conduction between an output node of NAND1 and a node NR1. A node NB1 is electrically connected to an input node of a circuit BKC10, and the node NR1 is electrically connected to an output node of the circuit BKC10.

The circuit BKC10 in FIG. 6 functions as a backup circuit of the FF 110. The circuit BKC10 includes a circuit RTC10 and a circuit PCC10. Signals OSG, OSC, and OSR input to the circuit BKC10 are control signals output from the PMU 60. A power supply potential VSS is a low power supply potential and, for example, may be a ground potential GND or 0 V. As in BKC1, the power supply potential VSS and the power supply potential VDD are input to the FF 110. In the storage circuit 100, supply of VDD is controlled by the PMU 60.

The circuit RTC10 includes the transistor MW1, a transistor MA1, a transistor MR1, the node FN1, and a node NK1. The circuit RTC10 has a function of retaining data, and here, includes a 3T gain-cell storage circuit. The transistor MW1 is an OS transistor serving as a write transistor. The transistor MR1 is a read transistor, and the transistor MA1 functions as an amplifier transistor and a read transistor. The node FN1 retains data. The node NK1 is a data input node. The node NR1 is a data output node of the circuit RTC10.

FIG. 6 shows a structure example in which the circuit BKC10 reads out data of a slave latch in the FF 110 in saving operation and restores the retained data to a master latch in restoration operation. Data to be saved may be data of the master latch. In addition, data may be restored to the slave latch. In that case, TG5 is provided in the slave latch.

The transistor MR1 and the transistor MA1 included in the circuit RTC10 may be either n-channel transistors or p-channel transistors, and the level of the potential of the signal OSR and the level of a power supply potential supplied to the transistor MA1 may be changed depending on the conductivity types of the transistor MR1 and the transistor MA1. In addition, a logic circuit of the FF 110 may be set as appropriate. For example, in the case where the transistor MR1 and the transistor MA1 are p-channel transistors, NAND1 and INV3 are replaced with each other in the master latch and INV2 and NAND2 are replaced with each other in the slave latch. Furthermore, VDD is input to the transistor MA1 instead of VSS.

Data is written with voltage in the circuit BKC10; thus, the write power of the circuit BKC10 can be lower than that of an MRAM in which data is written with current.

Furthermore, unlike in a flash memory, the number of data rewriting times is not limited because data is retained by the load capacitance of the node FN1.

In the circuit RTC10, energy required for data writing corresponds to energy required for charging and discharging of charge in the capacitor CB1. By contrast, in a storage circuit including a two-terminal memory element such as an MRAM, energy required for data writing corresponds to energy consumed when current flows to the memory element. Thus, as compared with an MRAM or the like in which current continuously flows during a data writing period, the circuit BKC10 can reduce energy consumed by data saving. Accordingly, as compared with the case of providing an MRAM, break even time (BET) can be shortened in the case of providing the circuit BKC10 as a backup circuit. Consequently, opportunities of performing power gating by which energy consumption can be reduced are increased, so that the power consumption of the semiconductor device can be reduced.

The circuit PCC10 includes a transistor MC1 and a transistor MC2. The circuit PCC10 has a function of precharging the node FN1. The circuit PCC10 is not necessarily provided. As described later, the data saving time of the circuit BKC10 can be shortened by provision of the circuit PCC10.

<Operation Example of Storage Circuit>

Figure 7:
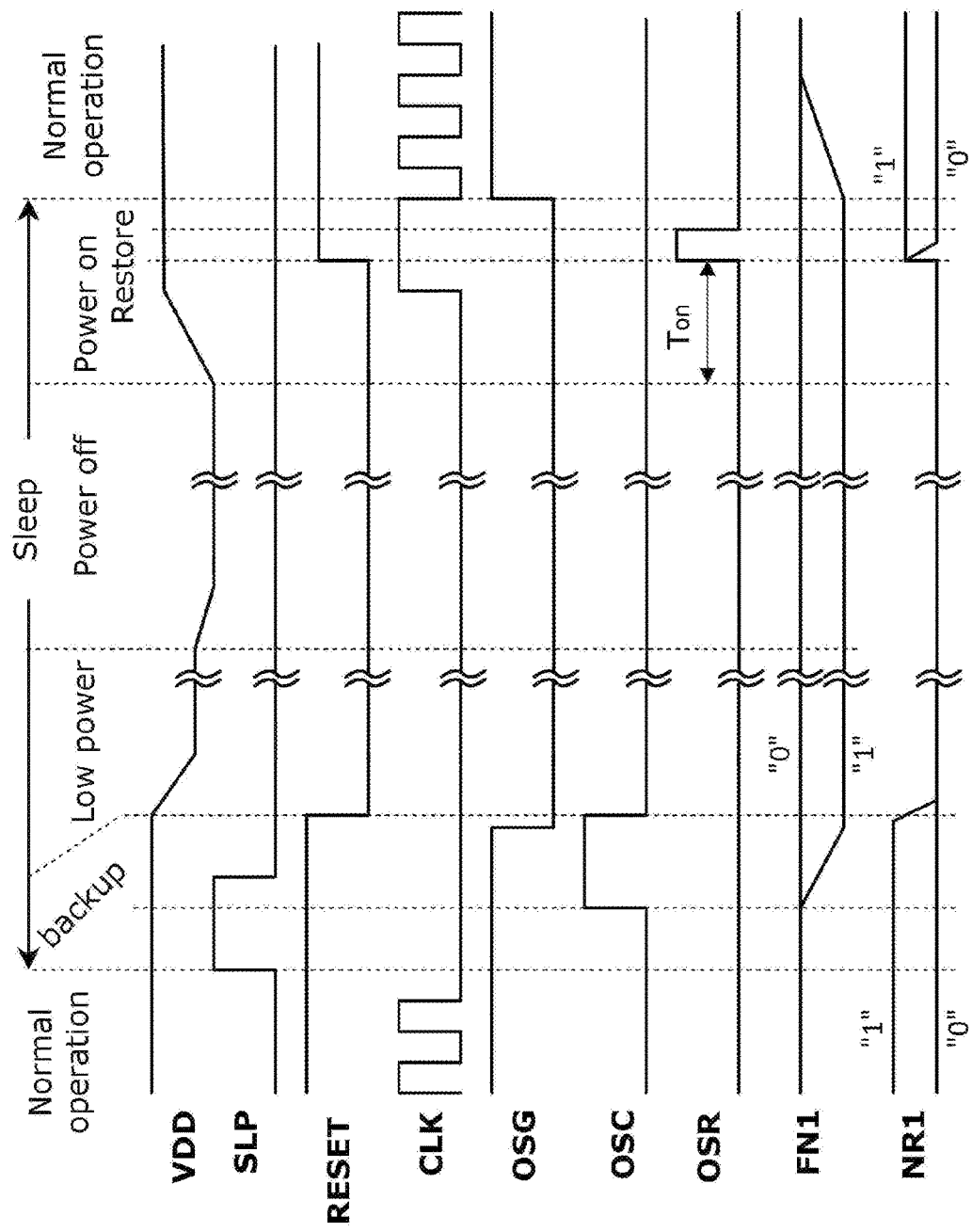
FIG. 7 is a Prior Art timing chart showing an operation example of a storage circuit.

FIG. 7 is a Prior Art timing chart showing an operation example of the storage circuit 100. FIG. 7 shows changes in waveforms of control signals SLP, RESET, CLK, OSG, and OSR and changes in the potentials of the power supply potential VDD, the node FN1, and the node NR1.

[Normal Operation]

The power supply potential VDD and the signal CLK are supplied to the storage circuit 100. The FF 110 functions as a sequential circuit. The signal RESET is kept at a high level; thus, NAND1 and NAND2 function as inverter circuits. In the circuit BKC1, the transistor MC1 is off and the transistors MC2 and MW1 are on, so that the potential of the node FN1 is precharged to a high level.

[Data Saving]

First, supply of the clock signal CLK is stopped. Thus, data rewriting of the node NB1 is stopped. In the example of FIG. 7, the potential level of the node NB1 is at a low level ("0") when the potential of the node NR1 is at a high level ("1"), and the potential level of the node NB1 is at the high level ("1") when the potential of the node NR1 is at the low level ("0"). While the signal OSC is at a high level, data of the node NB1 is saved to the node FN1. Specifically, since the transistor MC1 and the transistor MW1 are turned on, the node FN1 is electrically connected to the node NB1. When the signal OSG is set at a low level to turn off the transistor MW1, the node FN1 is brought into an electrically floating state and the circuit BKC10 retains data. The potential of the node FN1 is at a high level when the node NR1 is at the low level ("0"), and the potential of the node FN1 is at a low level when the node NR1 is at the high level ("1").

Data saving is terminated by setting the signal OSG at a low level. Thus, voltage scaling operation of the PU 20 can be performed immediately after the signal OSG is set at a low level. In addition, since the node FN1 is precharged to the high level by the transistor MC2 in the normal operation, charge transfer of the node FN1 is not needed in data saving operation in which the node FN1 is set at the high level. Thus, the circuit BKC10 can complete saving operation in a short time.

In the data saving operation, the signal CLK is inactive. Although the potential of the signal CLK is at a low level in the example of FIG. 7, the potential of the signal CLK may be at a high level.

[Voltage Scaling in Low-Power Mode]

The PMU 60 performs voltage scaling operation along with the signal OSC falling. Thus, the storage circuit 100 is transferred to the low-power mode.

[Power Gating in Power-Off Mode]

After a certain period of time from transition to the low-power mode, the PMU 60 performs power gating operation and the storage circuit 100 is transferred to the power-off mode.

[Power-on Mode]

The PMU 60 returns the storage circuit 100 to the power-on mode in response to an interrupt request. In the example of FIG. 7, when the potential of a power supply line for supplying VDD is stabilized, the signal CLK is set at a high level.

[Data Restoration]

While the signal OSR is at a high level, data restoration operation is performed.

When the signal RESET is set at a high level, the potential of the node NR1 is precharged to the high level ("1"). When the signal OSR is set at a high level, TG5 has high impedance and the transistor MR1 is turned on. The conduction state of the transistor MA1 is determined by the potential of the node FN1. When the node FN1 is at a high level, the transistor MA1 is on; thus, the potential of the node NR1 is decreased to the low level ("0"). When the node FN1 is at a low level, the potential of the node NR1 is kept at the high level. In other words, the FF 110 returns to the state before transition to the resting state.

As described above, rising of the signal RESET and the signal OSR enables high-level data to be restored to the node NR1. Thus, the returning operation period of the storage circuit 100 can be shortened.

FIG. 7 shows an example in which the mode is transferred from the power-off mode to the power-on mode. In the case where the mode is transferred from the low-power mode to the power-on mode, a period $T_{on}$ to stabilization of the potential of the power supply line for supplying VDD is shortened. In that case, rising of the signal OSR is preferably made faster than that when the mode is transferred from the power-off mode.

[Normal Operation]

By restarting the supply of the signal CLK, the storage circuit 100 returns to a state in which normal operation can be performed. When the signal OSG is set at a high level, the node FN1 is precharged to a high level by the circuit PCC10.

<<Cache>>

An example in which the cache 40 is formed using an SRAM is described.

<Memory Cell Structure Example>

Figure 8:
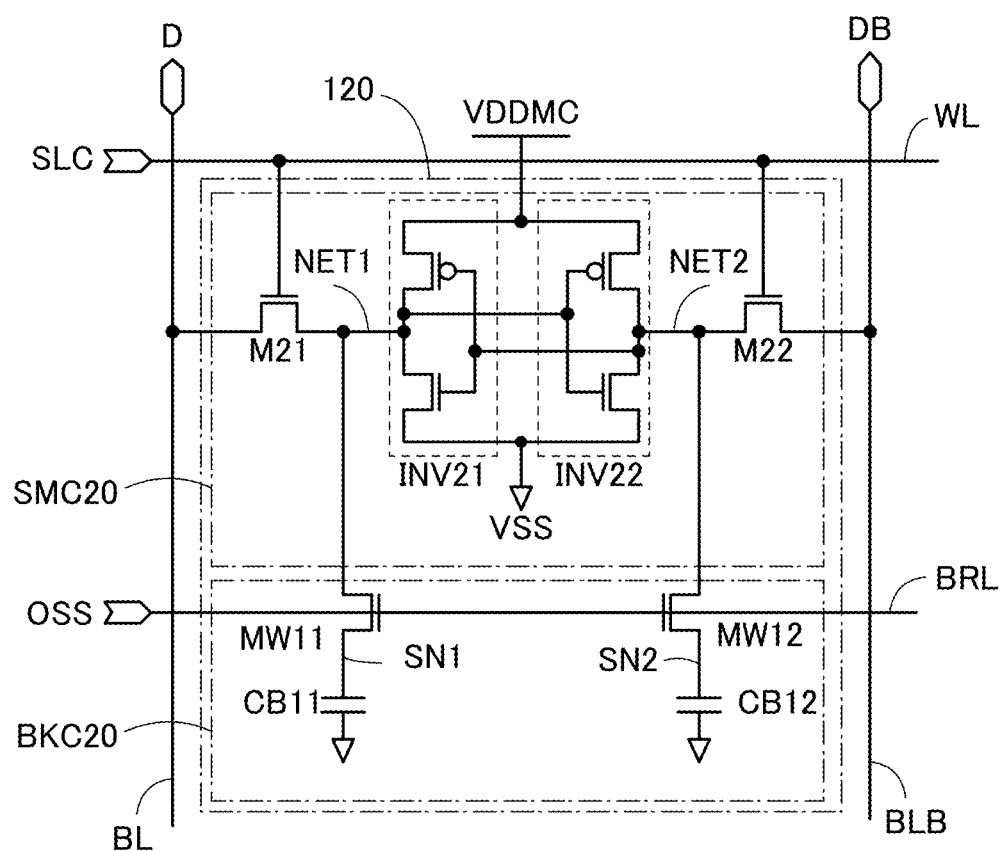
FIG. 8 is a Prior Art circuit diagram showing a cache memory cell structure example.

FIG. 8 shows a Prior Art cache memory cell structure example. A memory cell 120 in FIG. 8 includes a circuit SMC20 and a circuit BKC20. The circuit SMC20 has a circuit configuration similar to that of a standard SRAM memory cell. The circuit SMC20 in FIG. 8 includes an inverter circuit INV21, an inverter circuit INV22, a transistor M21, and a transistor M22.

The circuit BKC20 functions as a backup circuit of the circuit SMC20. The circuit BKC20 includes a transistor MW11, a transistor MW12, a capacitor CB11, and a capacitor CB12. The transistors MW11 and MW12 are OS transistors. The circuit BKC20 includes two 1T1C retention circuits, and a node SN1 and a node SN2 each retain data. A retention circuit formed using the transistor MW11 and the capacitor CB11 is capable of backing up data of a node NET1. A retention circuit formed using the transistor MW12 and the capacitor CB12 is capable of backing up data of a node NET2.

Power supply potentials VDDMC and VSS are supplied to the memory cell 120. The memory cell 120 is electrically connected to wirings WL, BL, BLB, and BRL. A signal SLC is input to the wiring WL. A data signal D and a data signal DB are input to the wiring BL and the wiring BLB at the time of data writing. Data is read out by detection of the potentials of the wiring BL and the wiring BLB. A signal OSS is input to the wiring BRL. The signal OSS is input from the PMU 60.

<Operation Example of Memory Cell>

Figure 9:
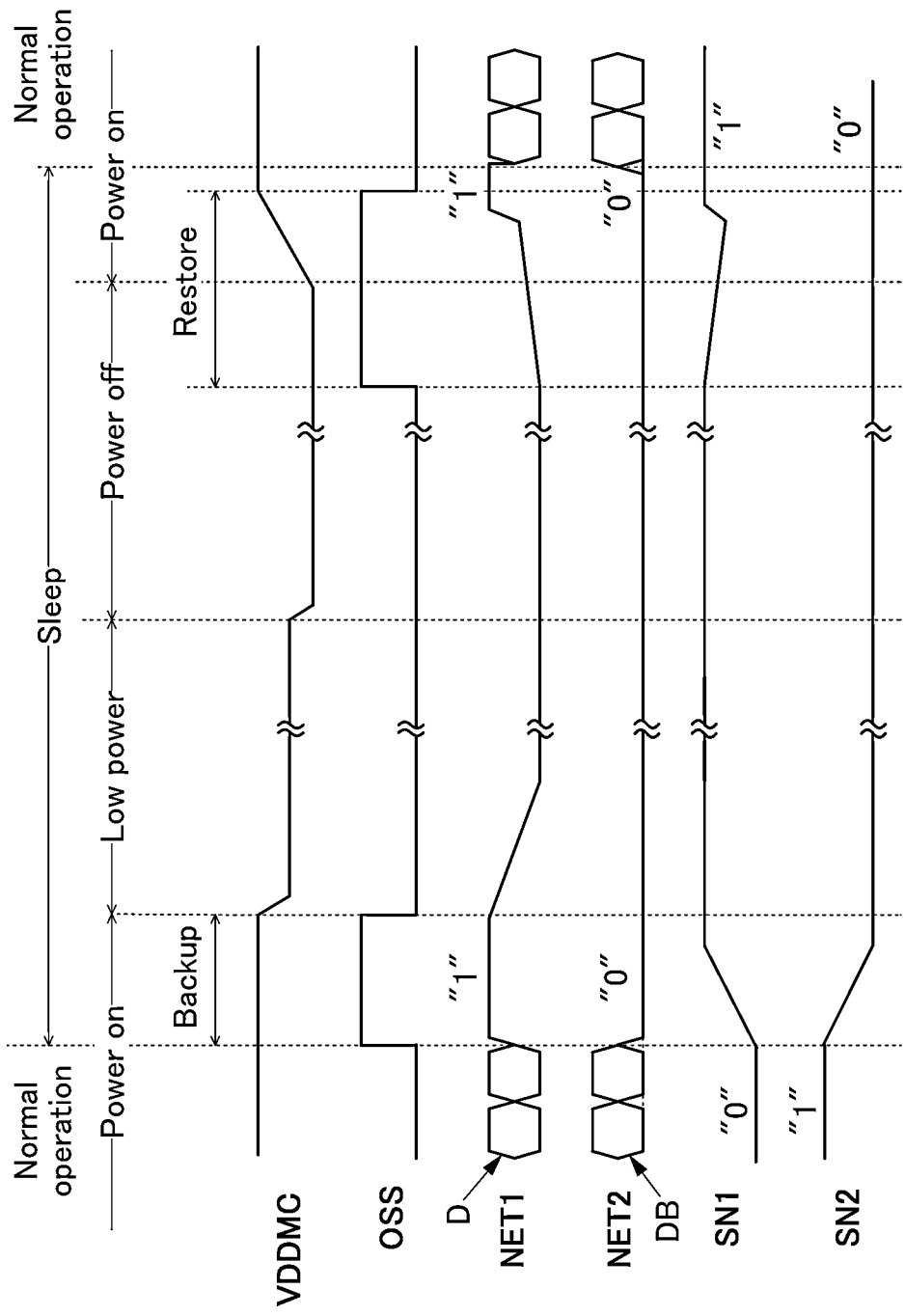
FIG. 9 is a Prior Art timing chart showing an operation example of a memory cell.

An operation example of the memory cell 120 is described. FIG. 9 is an example of a Prior Art timing chart of the memory cell 120.

[Normal Operation]

An access request is input to the circuit SMC20, and data is written and read out. In the circuit BKC20, the signal OSS is at a low level; thus, the node SN1 and the node SN2 are electrically floating and data is retained. In the example of FIG. 9, the potential of the node SN1 is at a low level ("0") and the potential of the node SN2 is at a high level ("1").

[Data Saving]

When the signal OSS is at a high level, the transistors MW11 and MW12 are turned on and the nodes SN1 and SN2 have the same potential levels as the nodes NET1 and NET2. In the example of FIG. 9, the potentials of the nodes SN1 and SN2 are set at a high level and a low level, respectively. The signal OSS is set at a low level and the circuit BKC20 retains data, so that data saving operation is terminated.

[Voltage Scaling in Low-Power Mode]

The PMU 60 performs voltage scaling operation along with the signal OSS falling. Thus, the cache 40 is transferred to the low-power mode.

[Power Gating in Power-Off Mode]

After a certain period of time from transition to the low-power mode, the PMU 60 performs power gating operation and the cache 40 is transferred to the power-off mode.

[Data Restoration in Power-on Mode]

The PMU 60 returns the cache 40 to a normal state in response to an interrupt request. The signal OSS is set at a high level to restore data retained in the circuit BKC20 to the circuit SMC20. While the signal OSS is at the high level, the PMU 60 performs voltage scaling operation and power gating operation and returns the storage circuit 100 to the power-on mode. In the example of FIG. 7, when the potential of the power supply line for supplying VDD is stabilized, the signal CLK is set at a high level. When the potential of a power supply line for supplying VDDMC is stabilized, the signal OSS is set at a low level to terminate data restoration operation. The nodes SN1 and SN2 return to the states immediately before the resting states.

[Normal Operation]

When the supply of VDDMC is restarted, the circuit SMC20 returns to a normal mode in which normal operation can be performed.

As described above, with the use of an OS transistor, a backup circuit capable of retaining data for a long time even when power supply is stopped can be provided. This backup circuit enables power gating of a processor core and a cache. In addition, when power management in which voltage scaling is combined with power gating is performed in a resting state, energy and time overheads due to the return from the resting state to a normal state can be reduced. Thus, power can be reduced efficiently without a decrease in the processing performance of a processing unit.

The structures, the compositions, the methods, and the like described in this embodiment can be combined as appropriate with any of the structures, the compositions, the methods, and the like described in the other embodiments and examples, for example.

Embodiment 2

In this embodiment, structures of transistors that can be used in the semiconductor device described in the above embodiment will be described. For example, a structure in which transistors having different electrical characteristics are stacked will be described. With such a structure, the degree of freedom in design of a semiconductor device can be increased. Stacking transistors having different electrical characteristics can increase the integration degree of the semiconductor device.

Figure 10:
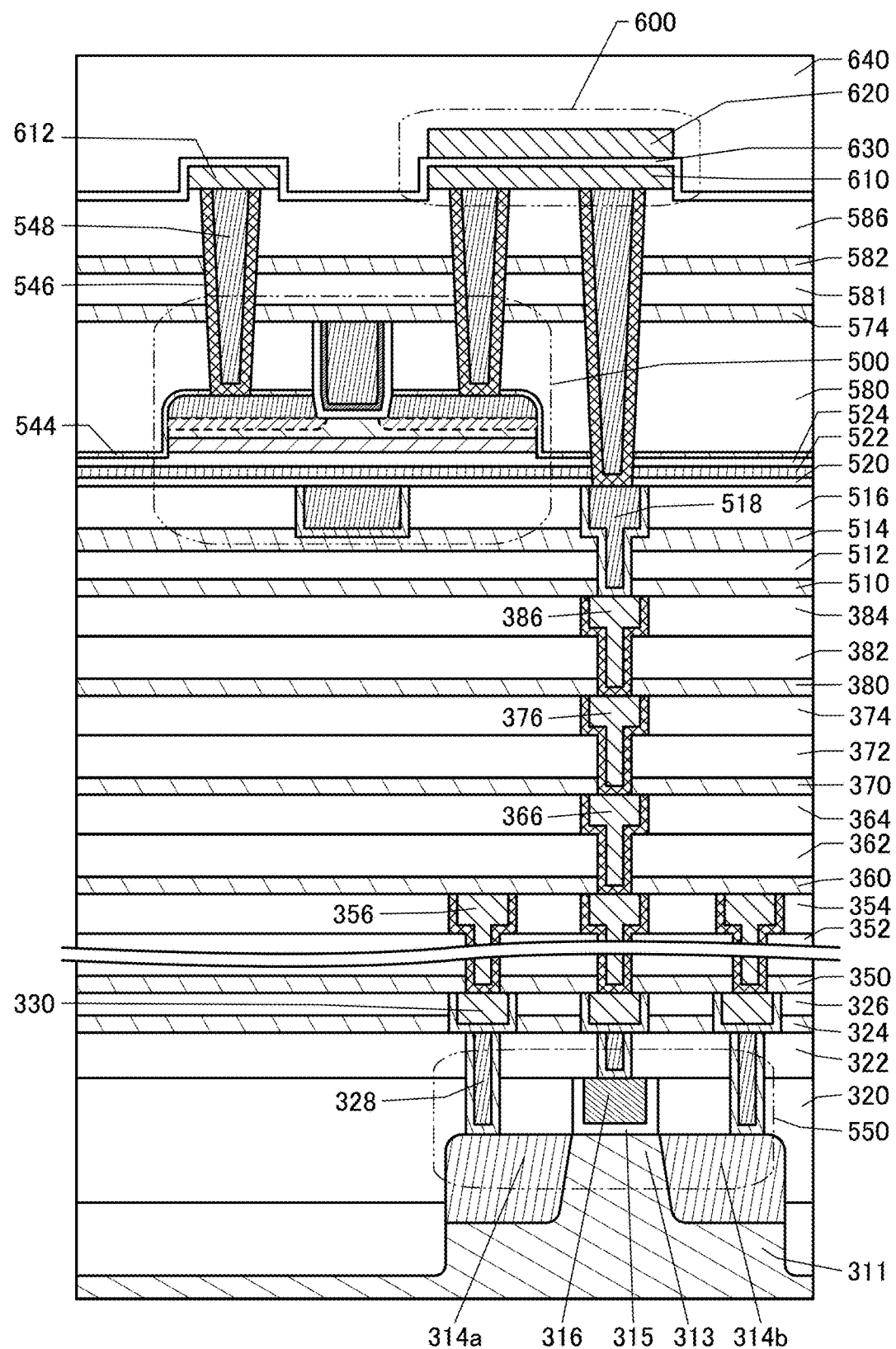
FIG. 10 illustrates a structure example of a semiconductor device.
Figure 12A:
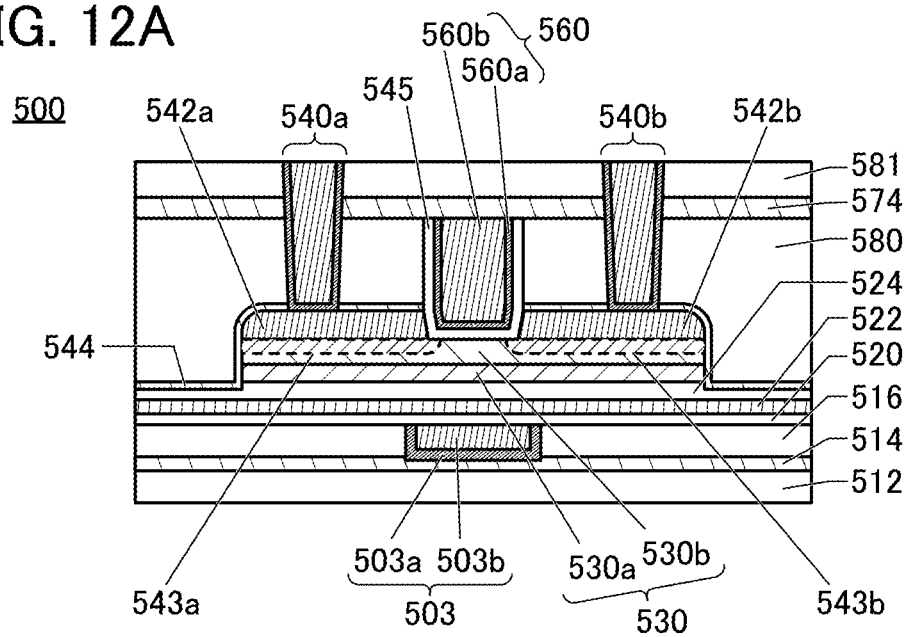
FIGS. 12A to 12C illustrate structure examples of transistors.
Figure 12B:
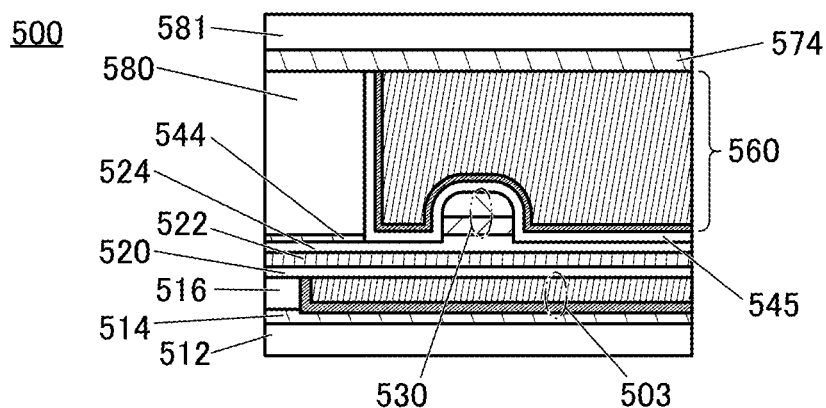
Figure 12C:
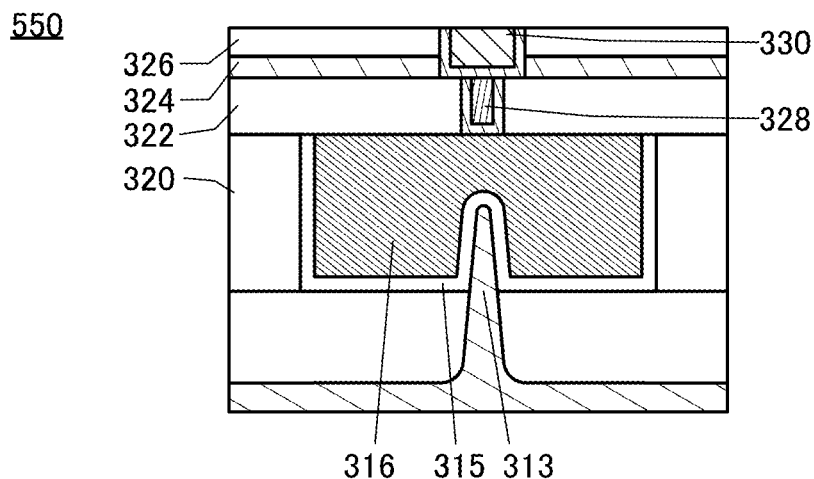

FIG. 10 illustrates part of a cross-sectional structure of a semiconductor device. The semiconductor device illustrated in FIG. 10 includes a transistor 550, a transistor 500, and a capacitor 600. FIG. 12A is a cross-sectional view of the transistor 500 in the channel length direction, FIG. 12B is a cross-sectional view of the transistor 500 in the channel width direction, and FIG. 12C is a cross-sectional view of the transistor 550 in the channel width direction. For example, the transistor 500 and the transistor 550 correspond to the transistor MW1 and the transistor MA1, respectively, described in the above embodiment. The capacitor 600 corresponds to the capacitor CB1.

The transistor 500 is an OS transistor and has an extremely low off-state current. Accordingly, data voltage or charge written to a storage node through the transistor 500 can be retained for a long time. In other words, the power consumption of the semiconductor device can be reduced because the storage node has a reduced frequency of refresh operation or requires no refresh operation.

In FIG. 10, the transistor 500 is provided above the transistor 550, and the capacitor 600 is provided above the transistor 550 and the transistor 500.

The transistor 550 is provided in and on a substrate 311 and includes a conductor 316, an insulator 315, a semiconductor region 313 that is part of the substrate 311, and a low-resistance region 314a and a low-resistance region 314b functioning as a source region and a drain region.

As illustrated in FIG. 12C, the top surface and the side surface in the channel width direction of the semiconductor region 313 of the transistor 550 is covered with the conductor 316 with the insulator 315 positioned therebetween. Such a Fin-type transistor 550 can have an increased effective channel width and thus have improved on-state characteristics. In addition, contribution of the electric field of the gate electrode can be increased, so that the off-state characteristics of the transistor 550 can be improved.

Note that the transistor 550 may be either a p-channel transistor or an n-channel transistor.

It is preferable that a region of the semiconductor region 313 where a channel is formed, a region in the vicinity thereof, the low-resistance regions 314a and 314b functioning as the source and drain regions, and the like contain a semiconductor such as a silicon-based semiconductor, further preferably single crystal silicon. Alternatively, a material containing germanium (Ge), silicon germanium (SiGe), gallium arsenide (GaAs), gallium aluminum arsenide (GaAlAs), or the like may be contained. Silicon whose effective mass is adjusted by applying stress to the crystal lattice and thereby changing the lattice spacing may be contained. Alternatively, the transistor 550 may be a HEMT with GaAs and GaAlAs, or the like.

The low-resistance regions 314a and 314b contain an element that imparts n-type conductivity (e.g., arsenic or phosphorus) or an element that imparts p-type conductivity (e.g., boron), in addition to a semiconductor material used for the semiconductor region 313.

The conductor 316 functioning as a gate electrode can be formed using a semiconductor material such as silicon containing the element that imparts n-type conductivity (e.g., arsenic or phosphorus) or the element that imparts p-type conductivity (e.g., boron), or a conductive material such as a metal material, an alloy material, or a metal oxide material.

Note that a material used for a conductor determines the work function; thus, selecting the material used for the conductor can adjust the threshold voltage of a transistor. Specifically, titanium nitride, tantalum nitride, or the like is preferably used for the conductor. Furthermore, in order to ensure the conductivity and embeddability of the conductor, a stacked layer of metal materials such as tungsten and aluminum is preferably used for the conductor. In particular, tungsten is preferable in terms of heat resistance.

The transistor 550 may be formed using a silicon on insulator (SOI) substrate, for example.

As the SOI substrate, any of the following substrates may be used: a separation by implanted oxygen (SIMOX) substrate formed in such a manner that an oxygen ion is implanted into a mirror-polished wafer, and then, an oxide layer is formed at a certain depth from the surface and defects generated in a surface layer are eliminated by high-temperature annealing, and an SOI substrate formed by a Smart-Cut method in which a semiconductor substrate is cleaved by utilizing growth of a minute void, which is formed by implantation of a hydrogen ion, by heat treatment; an epitaxial layer transfer (ELTRAN: registered trademark) method; or the like. A transistor formed using a single crystal substrate contains a single crystal semiconductor in a channel formation region.

Figure 11:
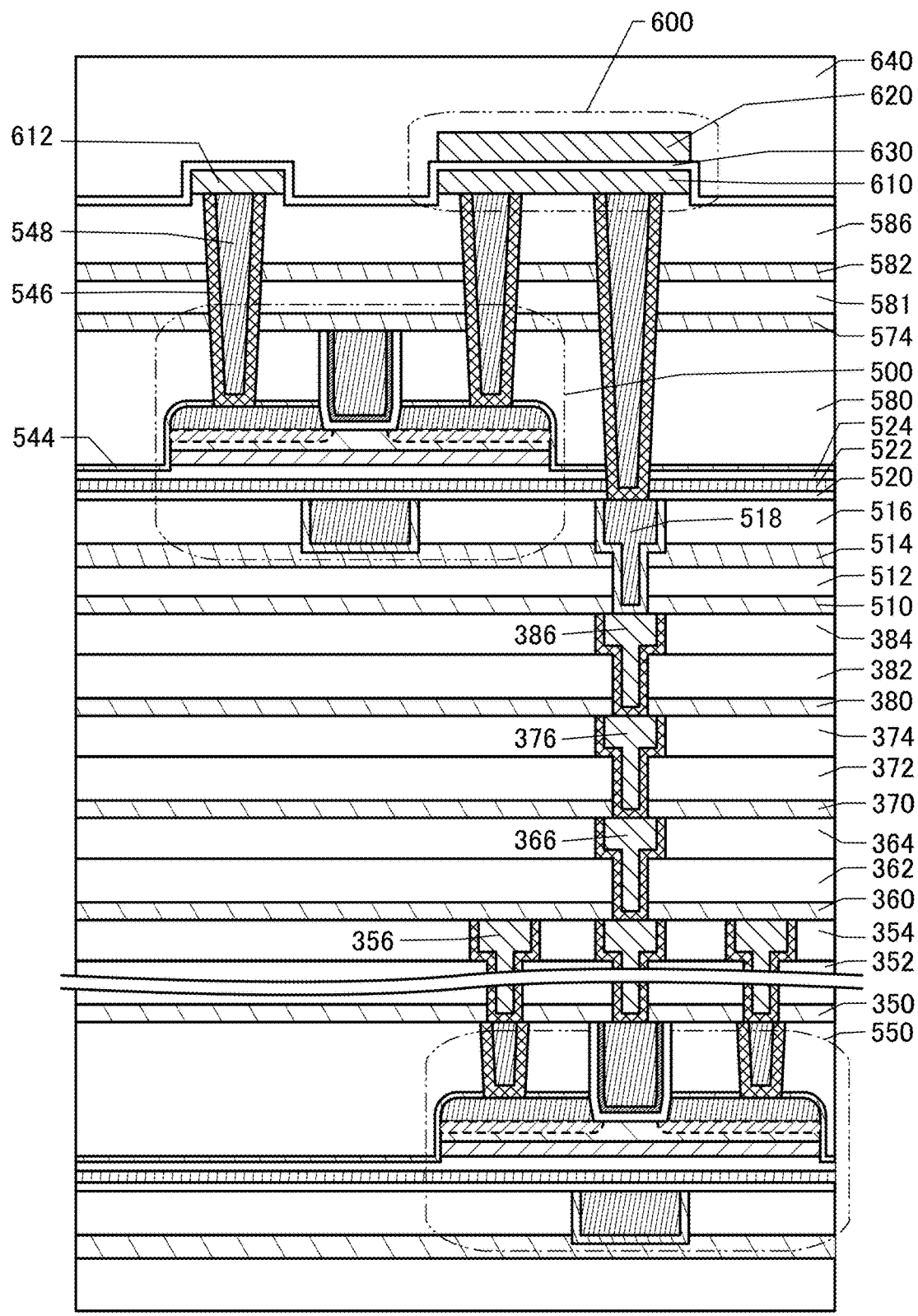
FIG. 11 illustrates a structure example of a semiconductor device.

Note that the transistor 550 illustrated in FIG. 10 is just an example and is not limited to the structure illustrated therein, and an appropriate transistor can be used in accordance with a circuit configuration or a driving method. For example, when the semiconductor device is composed of only OS transistors (i.e., transistors having the same polarity, e.g., only n-channel transistors), the transistor 550 has a structure similar to that of the transistor 500 as illustrated in FIG. 11. Note that the details of the transistor 500 will be described later.

An insulator 320, an insulator 322, an insulator 324, and an insulator 326 are stacked sequentially to cover the transistor 550.

The insulator 320, the insulator 322, the insulator 324, and the insulator 326 are formed using, for example, silicon oxide, silicon oxynitride, silicon nitride oxide, silicon nitride, aluminum oxide, aluminum oxynitride, aluminum nitride oxide, or aluminum nitride.

Note that in this specification, silicon oxynitride refers to a material that has a higher oxygen content than a nitrogen content, and silicon nitride oxide refers to a material that has a higher nitrogen content than an oxygen content. Moreover, in this specification, aluminum oxynitride refers to a material that has a higher oxygen content than a nitrogen content, and aluminum nitride oxide refers to a material that has a higher nitrogen content than an oxygen content.

The insulator 322 may function as a planarization film for eliminating a level difference caused by the transistor 550 or the like underlying the insulator 322. For example, the top surface of the insulator 322 may be planarized by planarization treatment using a chemical mechanical polishing (CMP) method or the like to increase the level of planarity.

The insulator 324 is preferably formed using a film having a barrier property that prevents hydrogen and impurities from diffusing from the substrate 311, the transistor 550, or the like into a region where the transistor 500 is provided.

For the film having a barrier property against hydrogen, for example, silicon nitride deposited by a CVD method can be used. Here, diffusion of hydrogen into a semiconductor element including an oxide semiconductor, such as the transistor 500, degrades the characteristics of the semiconductor element in some cases. Therefore, a film that inhibits hydrogen diffusion is preferably provided between the transistor 500 and the transistor 550. Specifically, the film that inhibits hydrogen diffusion is a film from which a small amount of hydrogen is released.

The amount of released hydrogen can be measured by thermal desorption spectroscopy (TDS), for example. The amount of hydrogen released from the insulator 324 that is converted into hydrogen atoms per unit area of the insulator 324 is less than or equal to $10 \times 10^{15}$ atoms/cm$^2$, preferably less than or equal to $5 \times 10^{15}$ atoms/cm$^2$ in TDS analysis in a film-surface temperature range of 50° C. to 500° C., for example.

Note that the dielectric constant of the insulator 326 is preferably lower than that of the insulator 324. For example, the dielectric constant of the insulator 326 is preferably lower than 4, further preferably lower than 3. For example, the dielectric constant of the insulator 326 is preferably 0.7 times or less that of the insulator 324, further preferably 0.6 times or less that of the insulator 324. In the case where a material with a low dielectric constant is used for an interlayer film, the parasitic capacitance between wirings can be reduced.

A conductor 328, a conductor 330, and the like that are connected to the capacitor 600 or the transistor 500 are embedded in the insulators 320, 322, 324, and 326. Note that the conductor 328 and the conductor 330 each function as a plug or a wiring. A plurality of conductors functioning as plugs or wirings are collectively denoted by the same reference numeral in some cases. In this specification and the like, a wiring and a plug connected to the wiring may be a single component. That is, part of a conductor functions as a wiring in some cases, and part of a conductor functions as a plug in other cases.

As a material for each of the plugs and wirings (e.g., the conductor 328 and the conductor 330), a conductive material such as a metal material, an alloy material, a metal nitride material, or a metal oxide material can be used in a single-layer structure or a stacked-layer structure. It is preferable to use a high-melting-point material that has both heat resistance and conductivity, such as tungsten or molybdenum, and it is particularly preferable to use tungsten. Alternatively, a low-resistance conductive material such as aluminum or copper is preferably used. The use of a low-resistance conductive material can reduce wiring resistance.

A wiring layer may be provided over the insulator 326 and the conductor 330. For example, an insulator 350, an insulator 352, and an insulator 354 are stacked sequentially in FIG. 10. Furthermore, a conductor 356 is formed in the insulator 350, the insulator 352, and the insulator 354. The conductor 356 functions as a plug or a wiring that is connected to the transistor 550. Note that the conductor 356 can be formed using a material similar to that for the conductor 328 and the conductor 330.

Note that for example, the insulator 350 is preferably formed using an insulator having a barrier property against hydrogen, like the insulator 324. Furthermore, the conductor 356 preferably includes a conductor having a barrier property against hydrogen. The conductor having a barrier property against hydrogen is formed particularly in an opening portion of the insulator 350 having a barrier property against hydrogen. In such a structure, the transistor 550 and the transistor 500 can be separated by a barrier layer, so that the hydrogen diffusion from the transistor 550 into the transistor 500 can be inhibited.

Note that as the conductor having a barrier property against hydrogen, tantalum nitride is preferably used, for example. By stacking tantalum nitride and tungsten, which has high conductivity, hydrogen diffusion from the transistor 550 can be inhibited while the conductivity of a wiring is ensured. In that case, a tantalum nitride layer having a barrier property against hydrogen is preferably in contact with the insulator 350 having a barrier property against hydrogen.

A wiring layer may be provided over the insulator 354 and the conductor 356. For example, an insulator 360, an insulator 362, and an insulator 364 are stacked sequentially in FIG. 10. Furthermore, a conductor 366 is formed in the insulator 360, the insulator 362, and the insulator 364. The conductor 366 functions as a plug or a wiring. Note that the conductor 366 can be formed using a material similar to that for the conductor 328 and the conductor 330.

Note that for example, the insulator 360 is preferably formed using an insulator having a barrier property against hydrogen, like the insulator 324. Furthermore, the conductor 366 preferably includes a conductor having a barrier property against hydrogen. The conductor having a barrier property against hydrogen is formed particularly in an opening portion of the insulator 360 having a barrier property against hydrogen. In such a structure, the transistor 550 and the transistor 500 can be separated by a barrier layer, so that the hydrogen diffusion from the transistor 550 into the transistor 500 can be inhibited.

A wiring layer may be provided over the insulator 364 and the conductor 366. For example, an insulator 370, an insulator 372, and an insulator 374 are stacked sequentially in FIG. 10. Furthermore, a conductor 376 is formed in the insulator 370, the insulator 372, and the insulator 374. The conductor 376 functions as a plug or a wiring. Note that the conductor 376 can be formed using a material similar to that for the conductor 328 and the conductor 330.

Note that for example, the insulator 370 is preferably formed using an insulator having a barrier property against hydrogen, like the insulator 324. Furthermore, the conductor 376 preferably includes a conductor having a barrier property against hydrogen. The conductor having a barrier property against hydrogen is formed particularly in an opening portion of the insulator 370 having a barrier property against hydrogen. In such a structure, the transistor 550 and the transistor 500 can be separated by a barrier layer, so that the hydrogen diffusion from the transistor 550 into the transistor 500 can be inhibited.

A wiring layer may be provided over the insulator 374 and the conductor 376. For example, an insulator 380, an insulator 382, and an insulator 384 are stacked sequentially in FIG. 10. Furthermore, a conductor 386 is formed in the insulator 380, the insulator 382, and the insulator 384. The conductor 386 functions as a plug or a wiring. Note that the conductor 386 can be formed using a material similar to that for the conductor 328 and the conductor 330.

Note that for example, the insulator 380 is preferably formed using an insulator having a barrier property against hydrogen, like the insulator 324. Furthermore, the conductor 386 preferably includes a conductor having a barrier property against hydrogen. The conductor having a barrier property against hydrogen is formed particularly in an opening portion of the insulator 380 having a barrier property against hydrogen. In such a structure, the transistor 550 and the transistor 500 can be separated by a barrier layer, so that the hydrogen diffusion from the transistor 550 into the transistor 500 can be inhibited.

Although the wiring layer including the conductor 356, the wiring layer including the conductor 366, the wiring layer including the conductor 376, and the wiring layer including the conductor 386 are described above, the semiconductor device of this embodiment is not limited thereto. The number of wiring layers similar to the wiring layer including the conductor 356 may be three or less, or five or more.

An insulator 510, an insulator 512, an insulator 514, and an insulator 516 are stacked sequentially over the insulator 384. A material having a barrier property against oxygen or hydrogen is preferably used for any of the insulator 510, the insulator 512, the insulator 514, and the insulator 516.

For example, each of the insulator 510 and the insulator 514 is preferably formed using a film having a barrier property against hydrogen and impurities diffusing from the substrate 311, a region where the transistor 550 is provided, or the like into a region where the transistor 500 is provided.

Therefore, each of the insulator 510 and the insulator 514 can be formed using a material similar to that for the insulator 324.

For the film having a barrier property against hydrogen, for example, silicon nitride deposited by a CVD method can be used. Here, diffusion of hydrogen into a semiconductor element including an oxide semiconductor, such as the transistor 500, degrades the characteristics of the semiconductor element in some cases. Therefore, a film that inhibits hydrogen diffusion is preferably provided between the transistor 500 and the transistor 550.

For the film having a barrier property against hydrogen used for each of the insulator 510 and the insulator 514, for example, a metal oxide such as aluminum oxide, hafnium oxide, or tantalum oxide is preferably used.

In particular, aluminum oxide has an excellent blocking effect that prevents permeation of oxygen and impurities such as hydrogen and moisture that cause a change in electrical characteristics of the transistor. Accordingly, the use of aluminum oxide can prevent entry of impurities such as hydrogen and moisture into the transistor 500 during and after a manufacturing process of the transistor. In addition, release of oxygen from the oxide contained in the transistor 500 can be prevented. Therefore, aluminum oxide is suitably used for a protective film of the transistor 500.

The insulator 512 and the insulator 516 can be formed using a material similar to that for the insulator 320, for example. In the case where a material with a relatively low dielectric constant is used for these insulators, the parasitic capacitance between wirings can be reduced. A silicon oxide film or a silicon oxynitride film can be used for the insulator 512 and the insulator 516, for example.

A conductor 518, a conductor included in the transistor 500 (e.g., a conductor 503), and the like are embedded in the insulator 510, the insulator 512, the insulator 514, and the insulator 516. Note that the conductor 518 functions as a plug or a wiring that is connected to the capacitor 600 or the transistor 550. The conductor 518 can be formed using a material similar to that for the conductor 328 and the conductor 330.

In particular, the conductor 518 in a region in contact with the insulator 510 and the insulator 514 is preferably a conductor having a barrier property against oxygen, hydrogen, and water. In such a structure, the transistor 550 and the transistor 500 can be separated by a layer having a barrier property against oxygen, hydrogen, and water, so that the hydrogen diffusion from the transistor 550 into the transistor 500 can be inhibited.

The transistor 500 is provided over the insulator 516.

As illustrated in FIGS. 12A and 12B, the transistor 500 includes the conductor 503 embedded in the insulator 514 and the insulator 516, an insulator 520 over the insulator 516 and the conductor 503, an insulator 522 over the insulator 520, an insulator 524 over the insulator 522, an oxide 530a over the insulator 524, an oxide 530b over the oxide 530a, a conductor 542a and a conductor 542b apart from each other over the oxide 530b, an insulator 580 that is over the conductor 542a and the conductor 542b and has an opening between the conductor 542a and the conductor 542b, an insulator 545 on a bottom surface and a side surface of the opening, and a conductor 560 that is over and in contact with the insulator 545.

As illustrated in FIGS. 12A and 12B, an insulator 544 is preferably provided between the insulator 580 and the oxide 530a, the oxide 530b, the conductor 542a, and the conductor 542b. In addition, as illustrated in FIGS. 12A and 12B, the conductor 560 preferably includes a conductor 560a provided inside the insulator 545 and a conductor 560b embedded inside the conductor 560a. Moreover, as illustrated in FIGS. 12A and 12B, an insulator 574 is preferably provided over the insulator 580, the conductor 560, and the insulator 545.

In this specification and the like, the oxide 530a and the oxide 530b may be collectively referred to as an oxide 530.

The transistor 500 has, in the region where the channel is formed and its vicinity, a structure in which the oxide 530a and the oxide 530b are stacked; however, the present invention is not limited thereto. For example, a single layer of the oxide 530b or a stacked-layer structure of three or more layers may be provided.

Although the conductor 560 has a two-layer structure in the transistor 500, the present invention is not limited thereto. For example, the conductor 560 may have a single-layer structure or a stacked-layer structure of three or more layers. The transistor 500 illustrated in FIG. 10, FIG. 11, and FIG. 12A is just an example and is not limited to the structure illustrated therein, and an appropriate transistor can be used in accordance with a circuit configuration, a driving method, or the like.

Here, the conductor 560 functions as a gate electrode of the transistor, and the conductor 542a and the conductor 542b function as a source electrode and a drain electrode. As described above, the conductor 560 is embedded in the opening of the insulator 580 and the region between the conductor 542a and the conductor 542b. The positions of the conductor 560, the conductor 542a, and the conductor 542b with respect to the opening of the insulator 580 are selected in a self-aligned manner. That is, in the transistor 500, the gate electrode can be positioned between the source electrode and the drain electrode in a self-aligned manner. Therefore, the conductor 560 can be formed without an alignment margin, resulting in a reduction in the footprint of the transistor 500. Accordingly, miniaturization and high integration of the semiconductor device can be achieved.

In addition, since the conductor 560 is formed in the region between the conductor 542a and the conductor 542b in a self-aligned manner, the conductor 560 has neither a region overlapping with the conductor 542a nor a region overlapping with the conductor 542b. Thus, parasitic capacitance between the conductor 560 and the conductors 542a and 542b can be reduced. As a result, the transistor 500 can have increased switching speed and excellent frequency characteristics.

The conductor 560 functions as a first gate (also referred to as a top gate) electrode in some cases. The conductor 503 functions as a second gate (also referred to as a bottom gate) electrode in some cases. In that case, by changing a potential applied to the conductor 503 independently of a potential applied to the conductor 560, the threshold voltage of the transistor 500 can be controlled. In particular, when a negative potential is applied to the conductor 503, the threshold voltage of the transistor 500 can be further increased, and the off-state current can be reduced. Thus, a drain current when a potential applied to the conductor 560 is 0 V can be smaller in the case where a negative potential is applied to the conductor 503 than in the case where the negative potential is not applied to the conductor 503.

The conductor 503 is provided to overlap with the oxide 530 and the conductor 560. Accordingly, in the case where potentials are applied to the conductor 560 and the conductor 503, an electric field generated from the conductor 560 and an electric field generated from the conductor 503 are connected, thereby covering the channel formation region in the oxide 530.

In this specification and the like, a transistor structure in which a channel formation region is electrically surrounded by the electric fields of a pair of gate electrodes (a first gate electrode and a second gate electrode) is referred to as a surrounded channel (s-channel) structure. The s-channel structure disclosed in this specification and the like is different from a Fin structure or a planar structure. With the use of the s-channel structure, a transistor with high resistance to a short-channel effect, i.e., a transistor in which a short-channel effect is unlikely to occur, can be obtained.

The conductor 503 has a structure similar to that of the conductor 518; a conductor 503a is formed in contact with an inner wall of the opening in the insulator 514 and the insulator 516, and a conductor 503b is formed inside the conductor 503a. Although the conductor 503a and the conductor 503b are stacked in the transistor 500, the present invention is not limited thereto. For example, the conductor 503 may have a single-layer structure or a stacked-layer structure of three or more layers.

The conductor 503a is preferably formed using a conductive material having a function of inhibiting diffusion of impurities such as a hydrogen atom, a hydrogen molecule, a water molecule, and a copper atom, that is, a conductive material through which the above impurities are less likely to pass. Alternatively, the conductor 503a is preferably formed using a conductive material having a function of inhibiting diffusion of oxygen (e.g., at least one of oxygen atoms, oxygen molecules, and the like), that is, a conductive material through which the above oxygen is less likely to pass. Note that in this specification, a function of inhibiting diffusion of impurities or oxygen means a function of inhibiting diffusion of any one or all of the above impurities and oxygen.

For example, when the conductor 503a has a function of inhibiting diffusion of oxygen, the conductivity of the conductor 503b can be prevented from being lowered because of oxidation.

In the case where the conductor 503 also functions as a wiring, the conductor 503b is preferably formed using a conductive material with high conductivity that contains tungsten, copper, or aluminum as its main component. Although the conductor 503 has a stacked layer of the conductor 503a and the conductor 503b in this embodiment, the conductor 503 may have a single-layer structure.

The insulator 520, the insulator 522, and the insulator 524 function as a second gate insulating film.

Here, an insulator containing oxygen more than that in the stoichiometric composition is preferably used as the insulator 524 in contact with the oxide 530. Such oxygen is easily released from the insulator by heating. In this specification and the like, oxygen released by heating is sometimes referred to as excess oxygen. That is, a region containing excess oxygen (also referred to as an excess-oxygen region) is preferably formed in the insulator 524. When such an insulator containing excess oxygen is provided in contact with the oxide 530, oxygen vacancies (also referred to as $V_O$) in the oxide 530 can be reduced, leading to an improvement in reliability of the transistor 500. When hydrogen enters the oxygen vacancies in the oxide 530, such defects (hereinafter, referred to as $V_OH$ in some cases) serve as donors and generate electrons serving as carriers in some cases. In other cases, bonding of part of hydrogen to oxygen bonded to a metal atom generates electrons serving as carriers. Thus, a transistor including an oxide semiconductor that contains a large amount of hydrogen is likely to have normally-on characteristics. Moreover, hydrogen in an oxide semiconductor is easily transferred by a stress such as heat or an electric field; thus, a large amount of hydrogen in an oxide semiconductor might reduce the reliability of a transistor. In one embodiment of the present invention, $V_OH$ in the oxide 530 is preferably reduced as much as possible so that the oxide 530 becomes a highly purified intrinsic or substantially highly purified intrinsic oxide. In order to obtain such an oxide semiconductor with sufficiently reduced $V_OH$, it is important to remove impurities such as moisture and hydrogen in the oxide semiconductor (this treatment is also referred to as dehydration or dehydrogenation treatment) and supply oxygen to the oxide semiconductor to fill oxygen vacancies (this treatment is also referred to as oxygen adding treatment). When an oxide semiconductor with sufficiently reduced $V_OH$ is used for a channel formation region of a transistor, the transistor can have stable electrical characteristics.

As the insulator including the excess-oxygen region, specifically, an oxide material that releases part of oxygen by heating is preferably used. An oxide that releases oxygen by heating is an oxide film in which the amount of released oxygen converted into oxygen atoms is greater than or equal to $1.0 \times 10^{18}$ atoms/cm$^3$, preferably greater than or equal to $1.0 \times 10^{19}$ atoms/cm$^3$, further preferably greater than or equal to $2.0 \times 10^{19}$ atoms/cm$^3$ or greater than or equal to $3.0 \times 10^{20}$ atoms/cm$^3$ in thermal desorption spectroscopy (TDS) analysis. In the TDS analysis, the film-surface temperature is preferably higher than or equal to 100° C. and lower than or equal to 700° C., or higher than or equal to 100° C. and lower than or equal to 400° C.

One or more of heat treatment, microwave treatment, and RF treatment may be performed in a state in which the insulator including the excess-oxygen region and the oxide 530 are in contact with each other. By the treatment, water or hydrogen in the oxide 530 can be removed. For example, in the oxide 530, dehydrogenation can be performed when a reaction in which a bond of $V_OH$ is cut occurs, i.e., a reaction of $V_OH \rightarrow V_O + H$ occurs. Part of hydrogen generated at this time is bonded to oxygen to be $H_2O$, and removed from the oxide 530 or an insulator near the oxide 530 in some cases. In other cases, part of hydrogen is gettered by the conductor 542a and/or the conductor 542b.

For the microwave treatment, for example, an apparatus including a power supply that generates high-density plasma or an apparatus including a power supply that applies RF to the substrate side is suitably used. For example, the use of an oxygen-containing gas and high-density plasma enables high-density oxygen radicals to be generated, and application of the RF to the substrate side allows the oxygen radicals generated by the high-density plasma to be efficiently introduced into the oxide 530 or an insulator in the vicinity of the oxide 530. The microwave treatment is performed under a pressure of 133 Pa or higher, preferably 200 Pa or higher, further preferably 400 Pa or higher. As a gas introduced into an apparatus for performing the microwave treatment, for example, oxygen and argon are used and the oxygen flow rate ($O_2/(O_2+Ar)$) is lower than or equal to 50%, preferably higher than or equal to 10% and lower than or equal to 30%.

In a manufacturing process of the transistor 500, the heat treatment is preferably performed with the surface of the oxide 530 exposed. For example, the heat treatment is performed at a temperature higher than or equal to 100° C. and lower than or equal to 450° C., preferably higher than or equal to 350° C. and lower than or equal to 400° C. The heat treatment is performed in a nitrogen gas atmosphere, an inert gas atmosphere, or an atmosphere containing an oxidizing gas at 10 ppm or more, 1% or more, or 10% or more. For example, the heat treatment is preferably performed in an oxygen atmosphere. Accordingly, oxygen can be supplied to the oxide 530 to reduce oxygen vacancies ($V_O$). The heat treatment may be performed under a reduced pressure. Alternatively, the heat treatment may be performed in such a manner that heat treatment is performed in a nitrogen gas atmosphere or an inert gas atmosphere, and then another heat treatment is performed in an atmosphere containing an oxidizing gas at 10 ppm or more, 1% or more, or 10% or more in order to compensate for released oxygen. Alternatively, the heat treatment may be performed in such a manner that heat treatment is performed in an atmosphere containing an oxidizing gas at 10 ppm or more, 1% or more, or 10% or more, and then another heat treatment is successively performed in a nitrogen gas atmosphere or an inert gas atmosphere.

Note that the oxygen adding treatment performed on the oxide 530 can promote a reaction in which oxygen vacancies in the oxide 530 are filled with supplied oxygen, i.e., a reaction of $V_O + O \rightarrow \text{null}$. Furthermore, hydrogen remaining in the oxide 530 reacts with supplied oxygen, so that the hydrogen can be removed as $H_2O$ (dehydrogenation). This can inhibit recombination of hydrogen remaining in the oxide 530 with oxygen vacancies and formation of $V_O H$.

In the case where the insulator 524 includes an excess-oxygen region, the insulator 522 preferably has a function of inhibiting diffusion of oxygen (e.g., oxygen atoms and oxygen molecules). That is, it is preferable that oxygen be less likely to pass through the insulator 522.

The insulator 522 preferably has a function of inhibiting diffusion of oxygen or impurities, in which case diffusion of oxygen contained in the oxide 530 to the insulator 520 side is prevented. In addition, the conductor 503 can be inhibited from reacting with oxygen in the insulator 524 or the oxide 530.

The insulator 522 preferably has a single-layer structure or a stacked-layer structure using an insulator containing what is called a high-k material such as aluminum oxide, hafnium oxide, an oxide containing aluminum and hafnium (hafnium aluminate), tantalum oxide, zirconium oxide, lead zirconate titanate (PZT), strontium titanate ($SrTiO_3$), or ($Ba,Sr$)$TiO_3$ (BST), for example. With miniaturization and high integration of a transistor, a problem such as generation of leakage current sometimes arises because of a thin gate insulating film. When a high-k material is used for an insulator functioning as the gate insulating film, a gate potential at the time of operating the transistor can be reduced while the physical thickness of the gate insulating film is kept.

It is particularly preferable to use an insulator containing an oxide of one or both of aluminum and hafnium, which is an insulating material having a function of inhibiting diffusion of impurities, oxygen, and the like, that is, an insulating material through which the above oxygen is less likely to pass. Aluminum oxide, hafnium oxide, an oxide containing aluminum and hafnium (hafnium aluminate), or the like is preferably used for the insulator containing an oxide of one or both of aluminum and hafnium. The insulator 522 formed of such a material functions as a layer that inhibits release of oxygen from the oxide 530 and entry of impurities such as hydrogen from the periphery of the transistor 500 into the oxide 530.

Alternatively, aluminum oxide, bismuth oxide, germanium oxide, niobium oxide, silicon oxide, titanium oxide, tungsten oxide, yttrium oxide, or zirconium oxide may be added to the insulator, for example. Alternatively, the insulator may be subjected to nitriding treatment. Silicon oxide, silicon oxynitride, or silicon nitride may be stacked over the insulator.

It is preferable that the insulator 520 be thermally stable. For example, silicon oxide and silicon oxynitride are preferred because of their thermal stability. Furthermore, combination of an insulator which is a high-k material and silicon oxide or silicon oxynitride enables the insulator 520 to have a stacked-layer structure that is thermally stable and has a high dielectric constant.

Note that the transistor 500 in FIGS. 12A and 12B includes the insulator 520, the insulator 522, and the insulator 524 as the second gate insulating film having a three-layer structure; however, the second gate insulating film may have a single-layer structure, a two-layer structure, or a stacked-layer structure of four or more layers. In that case, the stacked layers are not necessarily formed of the same material and may be formed of different materials.

In the transistor 500, a metal oxide functioning as an oxide semiconductor is used as the oxide 530 including a channel formation region. For example, as the oxide 530, a metal oxide such as an In-M-Zn oxide (M is one or more of aluminum, gallium, yttrium, copper, vanadium, beryllium, boron, titanium, iron, nickel, germanium, zirconium, molybdenum, lanthanum, cerium, neodymium, hafnium, tantalum, tungsten, magnesium, and the like) is preferably used.

The metal oxide functioning as an oxide semiconductor may be formed by a sputtering method or an atomic layer deposition (ALD) method. Note that the metal oxide functioning as an oxide semiconductor will be described in detail in another embodiment.

The metal oxide functioning as the channel formation region in the oxide 530 has a band gap of 2 eV or more, preferably 2.5 eV or more. The use of a metal oxide having such a wide band gap can reduce the off-state current of a transistor.

When the oxide 530a is provided below the oxide 530b in the oxide 530, impurities can be inhibited from diffusing into the oxide 530b from the components formed below the oxide 530a.

The oxide 530 preferably has a stacked-layer structure of oxide layers that differ in the atomic ratio of metal atoms. Specifically, the atomic ratio of the element M to constituent elements in the metal oxide used as the oxide 530a is preferably greater than that in the metal oxide used as the oxide 530b. Moreover, the atomic ratio of the element M to In in the metal oxide used as the oxide 530a is preferably greater than that in the metal oxide used as the oxide 530b. Moreover, the atomic ratio of In to the element M in the metal oxide used as the oxide 530b is preferably greater than that in the metal oxide used as the oxide 530a.

The energy of the conduction band minimum of the oxide 530a is preferably higher than that of the oxide 530b. In other words, the electron affinity of the oxide 530a is preferably smaller than that of the oxide 530b.

Here, the energy level of the conduction band minimum is gradually varied at a junction portion of the oxide 530a and the oxide 530b. In other words, the energy level of the conduction band minimum at a junction portion of the oxide 530a and the oxide 530b is continuously varied or continuously connected. To vary the energy level gradually, the density of defect states in a mixed layer formed at the interface between the oxide 530a and the oxide 530b is preferably made low.

Specifically, when the oxide 530a and the oxide 530b contain the same element (as a main component) in addition to oxygen, a mixed layer with a low density of defect states can be formed. For example, in the case where the oxide 530b is an In—Ga—Zn oxide, it is preferable to use an In—Ga—Zn oxide, a Ga—Zn oxide, gallium oxide, or the like as the oxide 530a.

At this time, the oxide 530b serves as a main carrier path. When the oxide 530a has the above structure, the density of defect states at the interface between the oxide 530a and the oxide 530b can be made low. Thus, the influence of interface scattering on carrier conduction is small, and the transistor 500 can have high on-state current.

The conductor 542a and the conductor 542b functioning as the source electrode and the drain electrode are provided over the oxide 530b. For the conductor 542a and the conductor 542b, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing any of the above metal elements as its component; an alloy containing a combination of the above metal elements; or the like. For example, tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like is preferably used. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen. Furthermore, a metal nitride film such as a tantalum nitride film is preferable because it has a barrier property against hydrogen or oxygen.

Although the conductor 542a and the conductor 542b have a single-layer structure in FIG. 12A, they may have a stacked-layer structure of two or more layers. For example, a tantalum nitride film and a tungsten film may be stacked. Alternatively, a titanium film and an aluminum film may be stacked. Other examples include a two-layer structure in which an aluminum film is stacked over a tungsten film, a two-layer structure in which a copper film is stacked over a copper-magnesium-aluminum alloy film, a two-layer structure in which a copper film is stacked over a titanium film, and a two-layer structure in which a copper film is stacked over a tungsten film.

Other examples include a three-layer structure in which a titanium film or a titanium nitride film, an aluminum film or a copper film, and a titanium film or a titanium nitride film are stacked in this order and a three-layer structure in which a molybdenum film or a molybdenum nitride film, an aluminum film or a copper film, and a molybdenum film or a molybdenum nitride film are stacked in this order. Note that a transparent conductive material containing indium oxide, tin oxide, or zinc oxide may be used.

As illustrated in FIG. 12A, a region 543a and a region 543b are sometimes formed as low-resistance regions at and near the interface between the oxide 530 and the conductor 542a and the interface between the oxide 530 and the conductor 542b. In that case, the region 543a functions as one of a source region and a drain region, and the region 543b functions as the other of the source region and the drain region. A channel formation region is formed in a region between the region 543a and the region 543b.

When the conductor 542a and the conductor 542b are provided in contact with the oxide 530, the oxygen concentrations of the region 543a and the region 543b sometimes decrease. In addition, a metal compound layer that contains the metal contained in the conductor 542a and the conductor 542b and the component of the oxide 530 is sometimes formed in the region 543a and the region 543b. In such cases, the region 543a and the region 543b each have increased carrier density to be a low-resistance region.

The insulator 544 is provided to cover the conductor 542a and the conductor 542b and inhibits oxidation of the conductor 542a and the conductor 542b. Here, the insulator 544 may be provided to cover the side surface of the oxide 530 and to be in contact with the insulator 524.

A metal oxide containing one or more of hafnium, aluminum, gallium, zirconium, tungsten, titanium, tantalum, nickel, germanium, neodymium, lanthanum, magnesium, and the like can be used as the insulator 544. For the insulator 544, silicon nitride oxide or silicon nitride can be used, for example.

It is particularly preferable to use, as the insulator 544, an insulator containing an oxide of one or both of aluminum and hafnium, for example, aluminum oxide, hafnium oxide, or an oxide containing aluminum and hafnium (hafnium aluminate). In particular, hafnium aluminate has higher heat resistance than a hafnium oxide film and thus is less likely to be crystallized by heat treatment in a later step. Therefore, it is preferable to use hafnium aluminate. Note that the insulator 544 is not necessarily provided when the conductor 542a and the conductor 542b are oxidation-resistant or do not significantly lose the conductivity even after absorbing oxygen. Design is determined as appropriate in consideration of required transistor characteristics.

The insulator 544 can inhibit impurities such as water and hydrogen contained in the insulator 580 from diffusing into the oxide 530b through the insulator 545. Moreover, the oxidation of the conductor 560 due to excess oxygen in the insulator 580 can be inhibited.

The insulator 545 functions as a first gate insulating film. The insulator 545 is preferably formed using an insulator which contains excess oxygen and from which oxygen is released by heating, like the insulator 524.

Specifically, any of silicon oxide, silicon oxynitride, silicon nitride oxide, silicon nitride, silicon oxide to which fluorine is added, silicon oxide to which carbon is added, silicon oxide to which carbon and nitrogen are added, and porous silicon oxide each containing excess oxygen can be used. In particular, silicon oxide and silicon oxynitride, which have thermal stability, are preferable.

When an insulator containing excess oxygen is provided as the insulator 545, oxygen can be effectively supplied from the insulator 545 to the channel formation region of the oxide 530b. As in the insulator 524, the concentration of impurities such as water and hydrogen in the insulator 545 is preferably lowered. The thickness of the insulator 545 is preferably greater than or equal to 1 nm and less than or equal to 20 nm.

Furthermore, in order that excess oxygen of the insulator 545 can be efficiently supplied to the oxide 530, a metal oxide may be provided between the insulator 545 and the conductor 560. The metal oxide preferably inhibits diffusion of oxygen from the insulator 545 into the conductor 560. Providing the metal oxide that inhibits diffusion of oxygen inhibits diffusion of excess oxygen from the insulator 545 into the conductor 560. That is, a reduction in the amount of excess oxygen supplied to the oxide 530 can be suppressed. Moreover, oxidization of the conductor 560 due to excess oxygen can be suppressed. The metal oxide is formed using a material that can be used for the insulator 544.

Note that the insulator 545 may have a stacked-layer structure like the second gate insulating film. With miniaturization and high integration of a transistor, a problem such as generation of leakage current sometimes arises because of a thin gate insulating film. Thus, when an insulator functioning as a gate insulating film has a stacked-layer structure of a high-k material and a thermally stable material, a gate potential at the time of operating the transistor can be reduced while the physical thickness of the gate insulating film is kept. Furthermore, the stacked-layer structure can be thermally stable and have a high dielectric constant.

Although the conductor 560 functioning as the first gate electrode has a two-layer structure in FIGS. 12A and 12B, the conductor 560 may have a single-layer structure or a stacked-layer structure of three or more layers.

The conductor 560a is preferably formed using a conductive material having a function of inhibiting diffusion of impurities such as a hydrogen atom, a hydrogen molecule, a water molecule, a nitrogen atom, a nitrogen molecule, a nitrogen oxide molecule (e.g., $N_2O$, NO, and $NO_2$), and a copper atom. Alternatively, the conductor 560a is preferably formed using a conductive material having a function of inhibiting diffusion of oxygen (e.g., at least one of oxygen atoms, oxygen molecules, and the like). When the conductor 560a has a function of inhibiting diffusion of oxygen, the conductivity of the conductor 560b can be prevented from being lowered because of oxidization due to oxygen in the insulator 545. As a conductive material having a function of inhibiting diffusion of oxygen, for example, tantalum, tantalum nitride, ruthenium, or ruthenium oxide is preferably used. The conductor 560a can be formed using an oxide semiconductor that can be used for the oxide 530. In that case, when the conductor 560b is formed by a sputtering method, the conductor 560a can have a reduced electric resistance and become a conductor. Such a conductor can be referred to as an oxide conductor (OC) electrode.

Furthermore, the conductor 560b is preferably formed using a conductive material containing tungsten, copper, or aluminum as its main component. The conductor 560b also functions as a wiring and thus is preferably a conductor having high conductivity. For example, a conductive material containing tungsten, copper, or aluminum as its main component can be used. The conductor 560b may have a stacked-layer structure, for example, a stacked-layer structure of titanium or titanium nitride and any of the above conductive materials.

The insulator 580 is provided over the conductor 542a and the conductor 542b with the insulator 544 positioned therebetween. The insulator 580 preferably includes an excess-oxygen region. For example, the insulator 580 preferably contains silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like. In particular, silicon oxide and silicon oxynitride, which have thermal stability, are preferable. Silicon oxide and porous silicon oxide are particularly preferable because an excess-oxygen region can be formed easily in a later step.

The insulator 580 preferably includes an excess-oxygen region. When the insulator 580 from which oxygen is released by heating is provided, oxygen in the insulator 580 can be efficiently supplied to the oxide 530. The concentration of impurities such as water and hydrogen in the insulator 580 is preferably lowered.

The opening of the insulator 580 is formed to overlap with a region between the conductor 542a and the conductor 542b. Thus, the conductor 560 is embedded in the opening of the insulator 580 and the region between the conductor 542a and the conductor 542b.

The gate length needs to be short for miniaturization of the semiconductor device without a reduction in the conductivity of the conductor 560. When the conductor 560 is made thick to achieve this, the conductor 560 might have a shape with a high aspect ratio. Even when having a shape with a high aspect ratio, the conductor 560 can be formed without collapsing during the process because the conductor 560 is embedded in the opening of the insulator 580 in this embodiment.

The insulator 574 is preferably provided in contact with the top surfaces of the insulator 580, the conductor 560, and the insulator 545. When the insulator 574 is formed by a sputtering method, the insulator 545 and the insulator 580 can include an excess-oxygen region. Therefore, oxygen can be supplied from the excess-oxygen region to the oxide 530.

For example, a metal oxide containing one or more of hafnium, aluminum, gallium, yttrium, zirconium, tungsten, titanium, tantalum, nickel, germanium, magnesium, and the like can be used as the insulator 574.

In particular, aluminum oxide has a high barrier property, and even a thin aluminum oxide film having a thickness greater than or equal to 0.5 nm and less than or equal to 3.0 nm can inhibit diffusion of hydrogen and nitrogen. Thus, aluminum oxide deposited by a sputtering method can serve as not only an oxygen supply source but also a barrier film against impurities such as hydrogen.

The insulator 581 functioning as an interlayer film is preferably provided over the insulator 574. As in the insulator 524 or the like, the concentration of impurities such as water and hydrogen in the insulator 581 is preferably lowered.

A conductor 540a and a conductor 540b are provided in the openings formed in the insulator 581, the insulator 574, the insulator 580, and the insulator 544. The conductor 540a and the conductor 540b are provided to face each other with the conductor 560 positioned therebetween. The conductor 540a and the conductor 540b have a structure similar to that of a conductor 546 and a conductor 548 described later.

An insulator 582 is provided over the insulator 581. A material having a barrier property against oxygen or hydrogen is preferably used for the insulator 582. Thus, the insulator 582 can be formed using a material similar to that for the insulator 514. For the insulator 582, a metal oxide such as aluminum oxide, hafnium oxide, or tantalum oxide is preferably used, for example.

In particular, aluminum oxide has an excellent blocking effect that prevents permeation of oxygen and impurities such as hydrogen and moisture that cause a change in electrical characteristics of the transistor. Accordingly, the use of aluminum oxide can prevent entry of impurities such as hydrogen and moisture into the transistor 500 during and after a manufacturing process of the transistor. In addition, release of oxygen from the oxide contained in the transistor 500 can be prevented. Therefore, aluminum oxide is suitably used for a protective film of the transistor 500.

An insulator 586 is provided over the insulator 582. The insulator 586 can be formed using a material similar to that for the insulator 320. In the case where a material with a relatively low dielectric constant is used for the insulator, the parasitic capacitance between wirings can be reduced. For example, a silicon oxide film, a silicon oxynitride film, or the like can be used for the insulator 586.

The conductor 546, the conductor 548, and the like are embedded in the insulator 520, the insulator 522, the insulator 524, the insulator 544, the insulator 580, the insulator 574, the insulator 581, the insulator 582, and the insulator 586.

The conductor 546 and the conductor 548 function as plugs or wirings that are connected to the capacitor 600, the transistor 500, or the transistor 550. The conductor 546 and the conductor 548 can be formed using a material similar to that for the conductor 328 and the conductor 330.

After the transistor 500 is formed, an opening may be formed to surround the transistor 500 and an insulator having a high barrier property against hydrogen or water may be formed to cover the opening. Surrounding the transistor 500 by the insulator having a high barrier property can prevent entry of moisture and hydrogen from the outside. Alternatively, a plurality of transistors 500 may be collectively surrounded by the insulator having a high barrier property against hydrogen or water. When an opening is formed to surround the transistor 500, for example, the formation of an opening reaching the insulator 522 or the insulator 514 and the formation of the insulator having a high barrier property in contact with the insulator 522 or the insulator 514 are suitable because these formation steps can also serve as some of the manufacturing steps of the transistor 500. The insulator having a high barrier property against hydrogen or water is formed using a material similar to that for the insulator 522 or the insulator 514, for example.

The capacitor 600 is provided above the transistor 500. The capacitor 600 includes a conductor 610, a conductor 620, and an insulator 630.

A conductor 612 may be provided over the conductor 546 and the conductor 548. The conductor 612 functions as a plug or a wiring that is connected to the transistor 500. The conductor 610 functions as an electrode of the capacitor 600. The conductor 612 and the conductor 610 can be formed at the same time.

The conductor 612 and the conductor 610 can be formed using a metal film containing an element selected from molybdenum, titanium, tantalum, tungsten, aluminum, copper, chromium, neodymium, and scandium; a metal nitride film containing any of the above elements as its component (a tantalum nitride film, a titanium nitride film, a molybdenum nitride film, or a tungsten nitride film); or the like. Alternatively, it is possible to use a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added.

The conductor 612 and the conductor 610 each have a single-layer structure in this embodiment; however, the structure is not limited thereto, and a stacked-layer structure of two or more layers may be used. For example, between a conductor having a barrier property and a conductor having high conductivity, a conductor that is highly adhesive to the conductor having a barrier property and the conductor having high conductivity may be formed.

The conductor 620 is provided to overlap with the conductor 610 with the insulator 630 positioned therebetween. Note that the conductor 620 can be formed using a conductive material such as a metal material, an alloy material, or a metal oxide material. It is preferable to use a high-melting-point material that has both heat resistance and conductivity, such as tungsten or molybdenum, and it is particularly preferable to use tungsten. In the case where the conductor 620 is formed concurrently with another component such as a conductor, copper (Cu), aluminum (Al), or the like, which is a low-resistance metal material, is used.

An insulator 640 is provided over the conductor 620 and the insulator 630. The insulator 640 can be formed using a material similar to that for the insulator 320. The insulator 640 may function as a planarization film that covers a roughness thereunder.

With the use of the structure, a semiconductor device that includes a transistor including an oxide semiconductor can be miniaturized or highly integrated.

Examples of a substrate that can be used for the semiconductor device of one embodiment of the present invention include a glass substrate, a quartz substrate, a sapphire substrate, a ceramic substrate, a metal substrate (e.g., a stainless steel substrate, a substrate including stainless steel foil, a tungsten substrate, and a substrate including tungsten foil), a semiconductor substrate (e.g., a single crystal semiconductor substrate, a polycrystalline semiconductor substrate, and a compound semiconductor substrate), and a silicon on insulator (SOI) substrate. Alternatively, a plastic substrate having heat resistance to the processing temperature in this embodiment may be used. Examples of a glass substrate include a barium borosilicate glass substrate, an aluminosilicate glass substrate, an aluminoborosilicate glass substrate, and a soda lime glass substrate. Alternatively, crystallized glass or the like can be used.

Alternatively, a flexible substrate, an attachment film, paper including a fibrous material, a base film, or the like can be used as the substrate. Examples of a material for a flexible substrate, an attachment film, a base film, or the like include plastic typified by polyethylene terephthalate (PET), polyethylene naphthalate (PEN), polyether sulfone (PES), and polytetrafluoroethylene (PTFE). Another example is a synthetic resin such as acrylic. Other examples include polypropylene, polyester, polyvinyl fluoride, and polyvinyl chloride. Alternatively, polyamide, polyimide, an aramid resin, an epoxy resin, an inorganic vapor deposition film, and paper can be used. Specifically, the use of a semiconductor substrate, a single crystal substrate, an SOI substrate, or the like enables the manufacture of small-sized transistors with a small variation in characteristics, size, shape, or the like and with high current capability. A circuit using such transistors achieves lower power consumption or higher integration.

A flexible substrate may be used as the substrate, and a transistor, a resistor, a capacitor, and/or the like may be formed directly over the flexible substrate. Alternatively, a separation layer may be provided between the substrate and the transistor, the resistor, the capacitor, and/or the like. The separation layer can be used when part or the whole of a semiconductor device formed over the separation layer is separated from the substrate and transferred to another substrate. In such a case, the transistor, the resistor, the capacitor, and/or the like can be transferred to a substrate having low heat resistance or a flexible substrate. As the separation layer, a stack of inorganic films, namely a tungsten film and a silicon oxide film, an organic resin film of polyimide or the like formed over a substrate, or a silicon film containing hydrogen can be used, for example.

That is, a semiconductor device may be formed over one substrate and then transferred to another substrate. Examples of a substrate to which a semiconductor device is transferred include, in addition to the above-described substrates over which transistors can be formed, a paper substrate, a cellophane substrate, an aramid film substrate, a polyimide film substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupro, rayon, or regenerated polyester), or the like), a leather substrate, and a rubber substrate. With the use of any of these substrates, a flexible semiconductor device or a highly durable semiconductor device can be manufactured, high heat resistance can be provided, or a reduction in weight or thickness can be achieved.

Providing a semiconductor device over a flexible substrate can suppress an increase in weight and can produce a non-breakable semiconductor device.

<Modification Example 1 of Transistor>

Figure 13A:
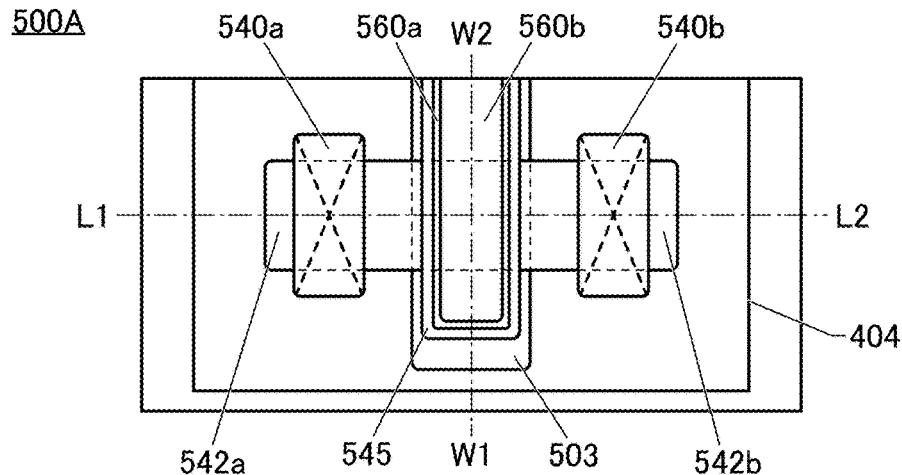
FIGS. 13A to 13C illustrate a structure example of a transistor.
Figure 13B:
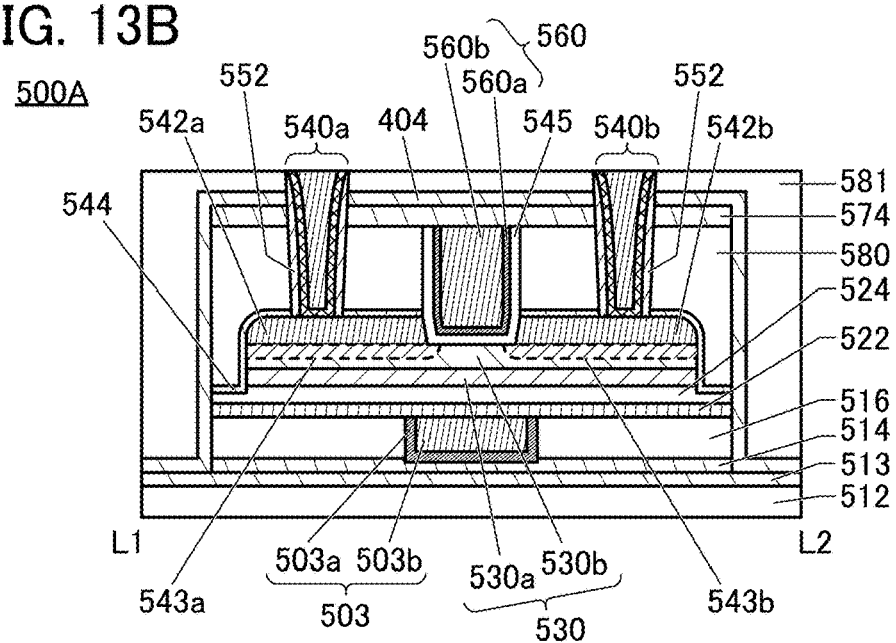
Figure 13C:
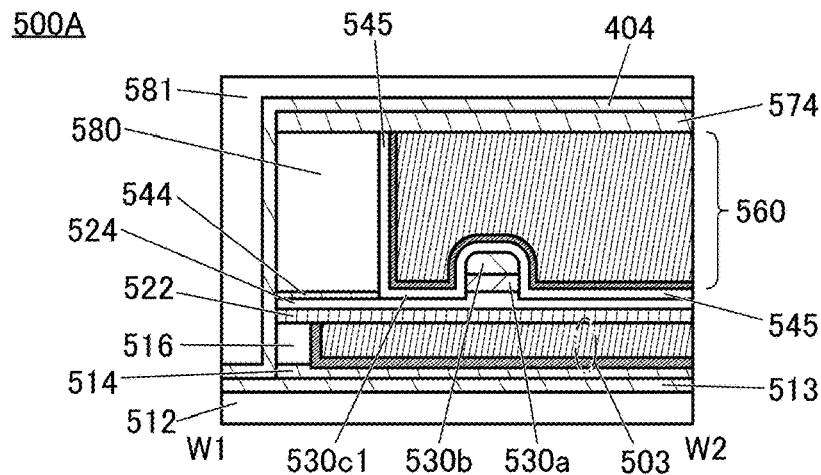

A transistor 500A illustrated in FIGS. 13A to 13C is a modification example of the transistor 500 having the structure illustrated in FIGS. 12A and 12B. FIG. 13A is a top view of the transistor 500A, FIG. 13B is a cross-sectional view of the transistor 500A in the channel length direction, and FIG. 13C is a cross-sectional view of the transistor 500A in the channel width direction. Note that for simplification, some components are not illustrated in the top view in FIG. 13A. The structure illustrated in FIGS. 13A to 13C can be used for other transistors (e.g., the transistor 550) included in the semiconductor device of one embodiment of the present invention.

The transistor 500A having the structure illustrated in FIGS. 13A to 13C is different from the transistor 500 having the structure illustrated in FIGS. 12A and 12B in including an insulator 552, an insulator 513, and an insulator 404. The transistor 500A is different from the transistor 500 having the structure illustrated in FIGS. 12A and 12B also in that the insulators 552 are provided in contact with the side surfaces of the conductor 540*a* and the conductor 540*b*. The transistor 500A is different from the transistor 500 having the structure illustrated in FIGS. 12A and 12B also in not including the insulator 520.

In the transistor 500A having the structure illustrated in FIGS. 13A to 13C, the insulator 513 is provided over the insulator 512. The insulator 404 is provided over the insulator 574 and the insulator 513.

In the transistor 500A having the structure illustrated in FIGS. 13A to 13C, the insulator 514, the insulator 516, the insulator 522, the insulator 524, the insulator 544, the insulator 580, and the insulator 574 are patterned and covered with the insulator 404. That is, the insulator 404 is in contact with the top surfaces of the insulator 574 and the insulator 513 and the side surfaces of the insulator 574, the insulator 580, the insulator 544, the insulator 524, the insulator 522, the insulator 516, and the insulator 514. With such a structure, the oxide 530 and the like are isolated from the outside by the insulator 404 and the insulator 513.

The insulator 513 and the insulator 404 preferably have high capability of inhibiting diffusion of hydrogen (e.g., at least one of hydrogen atoms, hydrogen molecules, and the like) or water molecules. For example, the insulator 513 and the insulator 404 are preferably formed using silicon nitride or silicon nitride oxide with a high hydrogen barrier property. This can inhibit diffusion of hydrogen or the like into the oxide 530, thereby suppressing the degradation of the characteristics of the transistor 500A. Thus, the reliability of the semiconductor device of one embodiment of the present invention can be increased.

The insulator 552 is provided in contact with the insulator 581, the insulator 404, the insulator 574, the insulator 580, and the insulator 544. The insulator 552 preferably has a function of inhibiting diffusion of hydrogen or water molecules. For example, as the insulator 552, an insulator such as silicon nitride, aluminum oxide, or silicon nitride oxide that has a high hydrogen barrier property is preferably used. In particular, silicon nitride is suitably used for the insulator 552 because of its high hydrogen barrier property. The use of a material having a high hydrogen barrier property for the insulator 552 can inhibit diffusion of impurities such as water and hydrogen from the insulator 580 and the like into the oxide 530 through the conductor 540*a* and the conductor 540*b*. Furthermore, oxygen contained in the insulator 580 can be inhibited from being absorbed by the conductor 540*a* and the conductor 540*b*. In this manner, the reliability of the semiconductor device of one embodiment of the present invention can be increased.

<Modification Example 2 of Transistor>

Figure 14A:
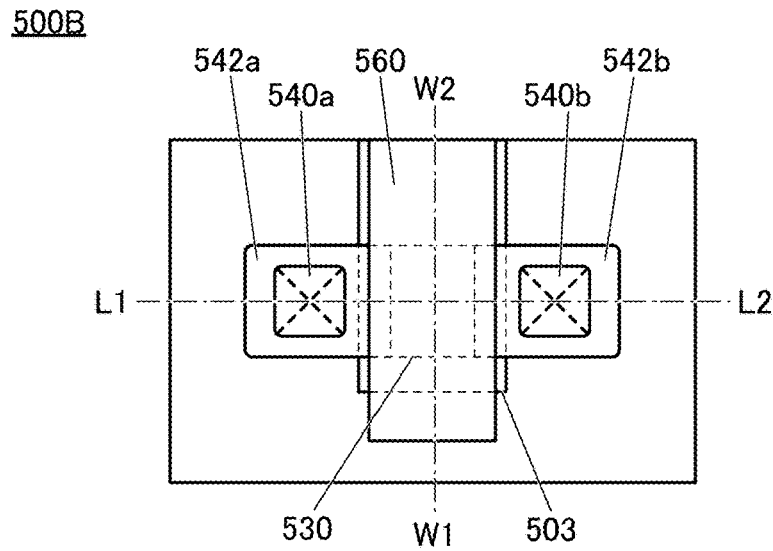
FIGS. 14A to 14C illustrate a structure example of a transistor.
Figure 14B:
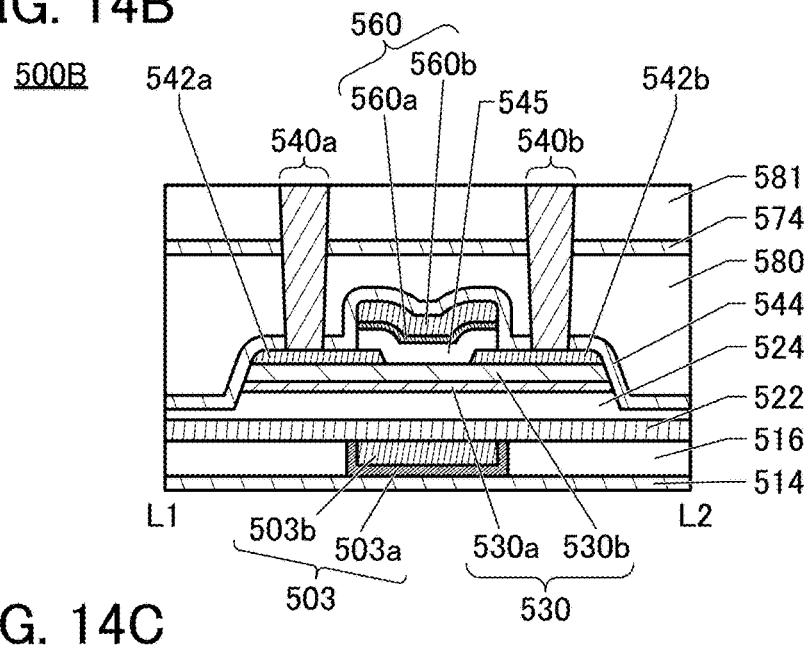
Figure 14C:
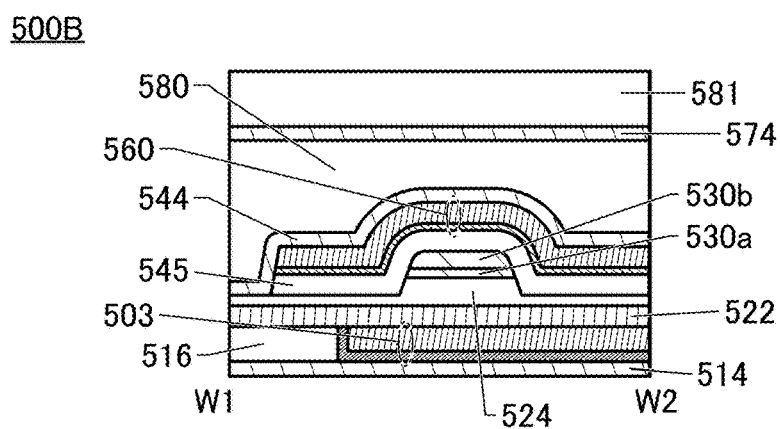

A structure example of a transistor 500B is described with reference to FIGS. 14A to 14C. FIG. 14A is a top view of the transistor 500B. FIG. 14B is a cross-sectional view taken along the dashed-dotted line L1-L2 in FIG. 14A. FIG. 14C is a cross-sectional view taken along the dashed-dotted line W1-W2 in FIG. 14A. Note that for simplification of the drawing, some components are not illustrated in the top view in FIG. 14A.

The transistor 500B is a modification example of the transistor 500 and can be replaced with the transistor 500. Therefore, differences of the transistor 500B from the transistor 500 are mainly described to avoid repeated description.

The conductor 560 functioning as the first gate electrode includes the conductor 560*a* and the conductor 560*b* over the conductor 560*a*. The conductor 560*a* is preferably formed using a conductive material having a function of inhibiting diffusion of impurities such as a hydrogen atom, a hydrogen molecule, a water molecule, and a copper atom. Alternatively, the conductor 560*a* is preferably formed using a conductive material having a function of inhibiting diffusion of oxygen (e.g., at least one of oxygen atoms, oxygen molecules, and the like).

When the conductor 560*a* has a function of inhibiting oxygen diffusion, the range of choices for the material of the conductor 560*b* can be expanded. That is, the conductor 560*a* inhibits oxidation of the conductor 560*b*, thereby preventing a decrease in conductivity of the conductor 560*b*.

The insulator 544 is preferably provided to cover the top surface and the side surface of the conductor 560 and the side surface of the insulator 545. Note that the insulator 544 is preferably formed using an insulating material having a function of inhibiting diffusion of oxygen and impurities such as water and hydrogen. For example, aluminum oxide or hafnium oxide is preferably used. Alternatively, for example, a metal oxide such as magnesium oxide, gallium oxide, germanium oxide, yttrium oxide, zirconium oxide, lanthanum oxide, neodymium oxide, or tantalum oxide; silicon nitride oxide; or silicon nitride can be used.

The insulator 544 can inhibit the oxidation of the conductor 560. In addition, the insulator 544 can inhibit diffusion of impurities such as water and hydrogen contained in the insulator 580 into the transistor 500B.

The transistor 500B has a structure in which the conductor 560 overlaps with part of the conductor 542*a* and part of the conductor 542*b* and thus tends to have larger parasitic capacitance than the transistor 500. Thus, the transistor 500B tends to have a lower operation frequency than the transistor 500. However, the transistor 500B does not require a step of embedding the conductor 560, the insulator 545, and the like in the opening formed in the insulator 580 and the like; thus, the productivity of the transistor 500B is higher than that of the transistor 500.

The structures, the compositions, the methods, and the like described in this embodiment can be combined as appropriate with any of the structures, the compositions, the methods, and the like described in the other embodiments and examples, for example.

Embodiment 3

In this embodiment, an oxide semiconductor, which is one kind of metal oxide, will be described.

A metal oxide preferably contains at least indium or zinc. In particular, indium and zinc are preferably contained. In addition to them, aluminum, gallium, yttrium, tin, or the like is preferably contained. Furthermore, one or more elements selected from boron, silicon, titanium, iron, nickel, germanium, zirconium, molybdenum, lanthanum, cerium, neodymium, hafnium, tantalum, tungsten, magnesium, cobalt, and the like may be contained.

<Classification of Crystal Structure>

First, the classification of crystal structures of an oxide semiconductor will be described with reference to FIG. 15A. FIG. 15A shows the classification of crystal structures of an oxide semiconductor, typically IGZO (a metal oxide containing In, Ga, and Zn).

As shown in FIG. 15A, an oxide semiconductor is roughly classified into "Amorphous", "Crystalline", and "Crystal". The term "Amorphous" includes a completely amorphous structure. The term "Crystalline" includes c-axis-aligned crystalline (CAAC), nanocrystalline (nc), and cloud-aligned composite (CAC) structures. Note that the term "Crystalline" excludes single crystal, poly crystal, and completely amorphous structures. The term "Crystal" includes single crystal and poly crystal structures.

Note that the structures in the thick frame in FIG. 15A are in an intermediate state between "Amorphous" and "Crystal", and belong to a new crystalline phase. That is, these structures are completely different from "Amorphous" and "Crystal", which are energetically unstable.

A crystal structure of a film or a substrate can be evaluated with an X-ray diffraction (XRD) spectrum. FIG. 15B shows an XRD spectrum, which is obtained by grazing-incidence XRD (GIXD) measurement, of a CAAC-IGZO film classified into "Crystalline". Note that a GIXD method is also called a thin film method or a Seemann-Bohlin method. The XRD spectrum that is shown in FIG. 15B and obtained by GIXD measurement is hereinafter simply referred to as an XRD spectrum. The CAAC-IGZO film in FIG. 15B has an atomic ratio of In:Ga:Zn=4:2:3 or a neighborhood thereof. The CAAC-IGZO film in FIG. 15B has a thickness of 500 nm.

As shown in FIG. 15B, a clear peak indicating crystallinity is observed in the XRD spectrum of the CAAC-IGZO film. Specifically, a peak indicating c-axis alignment is observed at around $2\theta=31°$ in the XRD spectrum of the CAAC-IGZO film. As shown in FIG. 15B, the peak at around $2\theta=31°$ is asymmetric with the angle at which the peak intensity is observed as the axis.

A crystal structure of a film or a substrate can also be evaluated with a diffraction pattern obtained by a nanobeam electron diffraction (NBED) method (such a pattern is also referred to as a nanobeam electron diffraction pattern). FIG. 15C shows a diffraction pattern of the CAAC-IGZO film. FIG. 15C shows a diffraction pattern obtained by the NBED method in which an electron beam is incident in the direction parallel to the substrate. The CAAC-IGZO film in FIG. 15C has an atomic ratio of In:Ga:Zn=4:2:3 or a neighborhood thereof. In the nanobeam electron diffraction method, electron diffraction is performed with a probe diameter of 1 nm.

As shown in FIG. 15C, a plurality of spots indicating c-axis alignment are observed in the diffraction pattern of the CAAC-IGZO film.

<<Oxide Semiconductor Structure>>

Oxide semiconductors might be classified in a manner different from the one in FIG. 15A when classified in terms of the crystal structure. For example, oxide semiconductors are classified into a single crystal oxide semiconductor and a non-single-crystal oxide semiconductor. Examples of the non-single-crystal oxide semiconductor include the above-described CAAC-OS and nc-OS. Other examples of the non-single-crystal oxide semiconductor include a polycrystalline oxide semiconductor, an amorphous-like oxide semiconductor (a-like OS), and an amorphous oxide semiconductor.

Here, the CAAC-OS, the nc-OS, and the a-like OS will be described in detail.

[CAAC-OS]

The CAAC-OS is an oxide semiconductor including a plurality of crystal regions whose c-axes are aligned in a particular direction. Note that the particular direction is the thickness direction of a CAAC-OS film, the normal direction of the surface where the CAAC-OS film is formed, or the normal direction of the surface of the CAAC-OS film. The crystal region has a periodic atomic arrangement. When an atomic arrangement is regarded as a lattice arrangement, the crystal region refers to a region with a regular lattice arrangement. Moreover, in some cases, the CAAC-OS includes a region where a plurality of crystal regions are connected to each other in the a-b plane direction, and this region has distortion. Note that distortion refers to a portion where the direction of a lattice arrangement changes between a region with a regular lattice arrangement and another region with a regular lattice arrangement in the region where the plurality of crystal regions are connected to each other. That is, the CAAC-OS is an oxide semiconductor that has c-axis alignment and does not have clear alignment in the a-b plane direction.

Note that the plurality of crystal regions are each formed of one or more minute crystals (crystals each of which has a maximum diameter less than 10 mu). The maximum diameter of a crystal region formed of one minute crystal is less than 10 nm. The size of a crystal region formed of a plurality of minute crystals may be approximately several tens of nanometers.

In an In-M-Zn oxide (an element M is one or more elements selected from aluminum, gallium, yttrium, tin, titanium, and the like), the CAAC-OS tends to have a layered crystal structure (also referred to as a layered structure) in which a layer containing indium (In) and oxygen (hereinafter, referred to as an In layer) and a layer containing the element M, zinc (Zn), and oxygen (hereinafter, referred to as an (M,Zn) layer) are stacked. Indium and the element M can be replaced with each other. Thus, the (M,Zn) layer contains indium in some cases. The In layer contains the element M in some cases, and contains Zn in other cases. The layered structure is observed as a lattice image in a high-resolution TEM image, for example.

For example, when the CAAC-OS film is subjected to structural analysis by out-of-plane XRD measurement with an XRD apparatus using $\theta/2\theta$ scanning, a peak indicating c-axis alignment is observed at or around $2\theta=31°$. Note that the position of the peak indicating c-axis alignment (the value of $2\theta$) sometimes changes with the kind, composition, and the like of a metal element contained in the CAAC-OS.

For example, a plurality of bright spots are observed in the electron diffraction pattern of the CAAC-OS film. Note that one spot and another spot are observed point-symmetrically with a spot of the incident electron beam passing through a sample (also referred to as a direct spot) as the symmetric center.

When the crystal region is observed from the particular direction, a lattice arrangement in the crystal region is basically a hexagonal lattice arrangement; however, a unit lattice is not always a regular hexagon and is a non-regular hexagon in some cases. A pentagonal lattice arrangement, a heptagonal lattice arrangement, and the like are included in the distortion in some cases. Note that a clear grain boundary cannot be observed even in the vicinity of the distortion in the CAAC-OS. That is, formation of a grain boundary is inhibited by the distortion of a lattice arrangement. This is probably because the CAAC-OS can tolerate distortion owing to a low density of arrangement of oxygen atoms in the a-b plane direction, an interatomic bond distance changed by substitution of a metal atom, and the like.

A crystal structure in which a clear grain boundary is observed is what is called a polycrystal structure. It is highly probable that the grain boundary becomes a recombination center and traps carriers and thus decreases the on-state current and field-effect mobility of a transistor, for example. Thus, the CAAC-OS in which a clear grain boundary is not observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a grain boundary as compared with an In oxide.

The CAAC-OS is an oxide semiconductor which has high crystallinity and in which a clear grain boundary is not observed. Thus, in the CAAC-OS, a reduction in electron mobility due to the grain boundary is less likely to occur. Entry of impurities, formation of defects, or the like might decrease the crystallinity of an oxide semiconductor. This means that the CAAC-OS can be referred to as an oxide semiconductor having small amounts of impurities and defects (e.g., oxygen vacancies). Thus, an oxide semiconductor including the CAAC-OS is physically stable. Accordingly, the oxide semiconductor including the CAAC-OS is resistant to heat and has high reliability. In addition, the CAAC-OS is stable with respect to high temperatures in the manufacturing process (i.e., thermal budget). Accordingly, the use of the CAAC-OS for the OS transistor can extend a degree of freedom of the manufacturing process.

[nc-OS]

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. In other words, the nc-OS includes a minute crystal. Note that the size of the minute crystal is, for example, greater than or equal to 1 nm and less than or equal to 10 nm, particularly greater than or equal to 1 nm and less than or equal to 3 nm; thus, the minute crystal is also referred to as a nanocrystal. There is no regularity of crystal orientation between different nanocrystals in the nc-OS. Thus, the orientation in the whole film is not observed. Accordingly, in some cases, the nc-OS cannot be distinguished from an a-like OS or an amorphous oxide semiconductor, depending on an analysis method. For example, when an nc-OS film is subjected to structural analysis by out-of-plane XRD measurement with an XRD apparatus using θ/2θ scanning, a peak indicating crystallinity is not observed. Furthermore, a halo pattern is shown in a selected-area electron diffraction pattern of the nc-OS film obtained by using an electron beam having a probe diameter larger than the diameter of a nanocrystal (e.g., larger than or equal to 50 nm). Meanwhile, in some cases, a plurality of spots in a ring-like region with a direct spot as the center are observed in an electron diffraction pattern (also referred to as nanobeam electron diffraction pattern) of the nc-OS film, which is obtained using an electron beam with a probe diameter nearly equal to or smaller than the diameter of a nanocrystal (e.g., 1 nm or larger and 30 nm or smaller).

[a-like OS]

The a-like OS is an oxide semiconductor having a structure between those of the nc-OS and the amorphous oxide semiconductor. The a-like OS has a void or a low-density region. That is, the a-like OS has lower crystallinity than the nc-OS and the CAAC-OS. Moreover, the a-like OS has higher hydrogen concentration than the nc-OS and the CAAC-OS.

<<Oxide Semiconductor Structure>>

Next, the above-described CAC-OS will be described in detail. Note that the CAC-OS relates to the material composition.

[CAC-OS]

The CAC-OS has, for example, a composition in which elements included in a metal oxide are unevenly distributed. Materials including unevenly distributed elements each have a size greater than or equal to 0.5 nm and less than or equal to 10 nm, preferably greater than or equal to 1 nm and less than or equal to 3 nm, or a similar size. Note that in the following description of a metal oxide, a state in which one or more metal elements are unevenly distributed and regions including the metal element(s) are mixed is referred to as a mosaic pattern or a patch-like pattern. The regions each have a size greater than or equal to 0.5 nm and less than or equal to 10 nm, preferably greater than or equal to 1 nm and less than or equal to 3 nm, or a similar size.

In addition, the CAC-OS has a composition in which materials are separated into a first region and a second region to form a mosaic pattern, and the first region is distributed in the film. This composition is hereinafter also referred to as a cloud-like composition. That is, the CAC-OS is a composite metal oxide having a composition in which the first region and the second region are mixed.

Note that the atomic ratios of In, Ga, and Zn to the metal elements contained in the CAC-OS in an In—Ga—Zn oxide are denoted by [In], [Ga], and [Zn], respectively. For example, the first region in the CAC-OS in the In—Ga—Zn oxide has [In] higher than that in the composition of the CAC-OS film. Moreover, the second region in the CAC-OS in the In—Ga—Zn oxide has [Ga] higher than that in the composition of the CAC-OS film. For example, the first region has higher [In] and lower [Ga] than the second region. Moreover, the second region has higher [Ga] and lower [In] than the first region.

Specifically, the first region includes indium oxide, indium zinc oxide, or the like as its main component. The second region includes gallium oxide, gallium zinc oxide, or the like as its main component. That is, the first region can be rephrased as a region containing In as its main component. The second region can be rephrased as a region containing Ga as its main component.

Note that a clear boundary between the first region and the second region cannot be observed in some cases.

For example, energy dispersive X-ray spectroscopy (EDX) is used to obtain EDX mapping, and according to the EDX mapping, the CAC-OS in the In—Ga—Zn oxide has a composition in which the region containing In as its main component (the first region) and the region containing Ga as its main component (the second region) are unevenly distributed and mixed.

In the case where the CAC-OS is used for a transistor, a switching function (on/off switching function) can be given to the CAC-OS owing to the complementary action of the conductivity derived from the first region and the insulating property derived from the second region. That is, the CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, high on-state current ($I_{on}$), high field-effect mobility ($\mu$), and excellent switching operation can be achieved.

An oxide semiconductor can have any of various structures that show various different properties. Two or more of the amorphous oxide semiconductor, the polycrystalline oxide semiconductor, the a-like OS, the CAC-OS, the nc-OS, and the CAAC-OS may be included in an oxide semiconductor of one embodiment of the present invention.

<Transistor Including Oxide Semiconductor>

Next, a transistor including the above oxide semiconductor is described.

When the oxide semiconductor is used for a transistor, the transistor can have high field-effect mobility. In addition, the transistor can have high reliability.

An oxide semiconductor with a low carrier concentration is preferably used for the transistor. For example, the carrier concentration of an oxide semiconductor is lower than or equal to $1\times10^{17}$ cm$^{-3}$, preferably lower than or equal to $1\times10^{15}$ cm$^{-3}$, further preferably lower than or equal to $1\times10^{13}$ cm$^{-3}$, still further preferably lower than or equal to $1\times10^{11}$ cm$^{-3}$, yet further preferably lower than $1\times10^{10}$ cm$^{-3}$, and higher than or equal to $1\times10^{-9}$ cm$^{-3}$. In order to reduce the carrier concentration of an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. Note that an oxide semiconductor with a low carrier concentration may be referred to as a highly purified intrinsic or substantially highly purified intrinsic oxide semiconductor.

A highly purified intrinsic or substantially highly purified intrinsic oxide semiconductor film has a low density of defect states and accordingly has a low density of trap states in some cases.

Charges trapped by the trap states in an oxide semiconductor take a long time to be released and may behave like fixed charges. Thus, a transistor whose channel formation region is formed in an oxide semiconductor having a high density of trap states has unstable electrical characteristics in some cases.

Thus, a reduction in the concentration of impurities in the oxide semiconductor is effective in stabilizing electrical characteristics of the transistor. In order to reduce the concentration of impurities in the oxide semiconductor, the concentration of impurities in a film that is adjacent to the oxide semiconductor is preferably reduced. Examples of impurities include hydrogen, nitrogen, alkali metal, alkaline earth metal, iron, nickel, and silicon.

<Impurity>

The influence of impurities in the oxide semiconductor is described here.

When silicon or carbon, which is a Group 14 element, is contained in an oxide semiconductor, defect states are formed in the oxide semiconductor. Thus, the concentration of silicon or carbon in the oxide semiconductor and in the vicinity of an interface with the oxide semiconductor (measured by secondary ion mass spectrometry (SIMS)) is lower than or equal to $2\times10^{18}$ atoms/cm$^3$, preferably lower than or equal to $2\times10^{17}$ atoms/cm$^3$.

When the oxide semiconductor contains alkali metal or alkaline earth metal, defect states are formed and carriers are generated, in some cases. Accordingly, a transistor including an oxide semiconductor that contains alkali metal or alkaline earth metal tends to have normally-on characteristics. Thus, the concentration of alkali metal or alkaline earth metal in the oxide semiconductor measured by SIMS is set lower than or equal to $1\times10^{18}$ atoms/cm$^3$, preferably lower than or equal to $2\times10^{16}$ atoms/cm$^3$.

An oxide semiconductor containing nitrogen easily becomes n-type by generation of electrons serving as carriers and an increase in carrier concentration. Thus, a transistor including an oxide semiconductor that contains nitrogen as the semiconductor tends to have normally-on characteristics. When nitrogen is contained in the oxide semiconductor, trap states are sometimes formed in the oxide semiconductor. This might result in unstable electrical characteristics of the transistor. Thus, the concentration of nitrogen in the oxide semiconductor, which is measured by SIMS, is lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

Hydrogen contained in an oxide semiconductor reacts with oxygen bonded to a metal atom to be water, and thus causes an oxygen vacancy in some cases. Entry of hydrogen into the oxygen vacancy generates an electron serving as a carrier in some cases. Furthermore, in some cases, bonding of part of hydrogen to oxygen bonded to a metal atom generates an electron serving as a carrier. Thus, a transistor including an oxide semiconductor that contains hydrogen tends to have normally-on characteristics. Accordingly, hydrogen in the oxide semiconductor is preferably reduced as much as possible. Specifically, the hydrogen concentration in the oxide semiconductor measured by SIMS is lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$.

When an oxide semiconductor with sufficiently reduced impurity concentration is used for a channel formation region in a transistor, the transistor can have stable electrical characteristics.

The structures, the compositions, the methods, and the like described in this embodiment can be combined as appropriate with any of the structures, the compositions, the methods, and the like described in the other embodiments and examples, for example.

Embodiment 4

In this embodiment, application examples of the above-described semiconductor device will be described.

[Semiconductor Wafer and Chip]

Figure 16A:
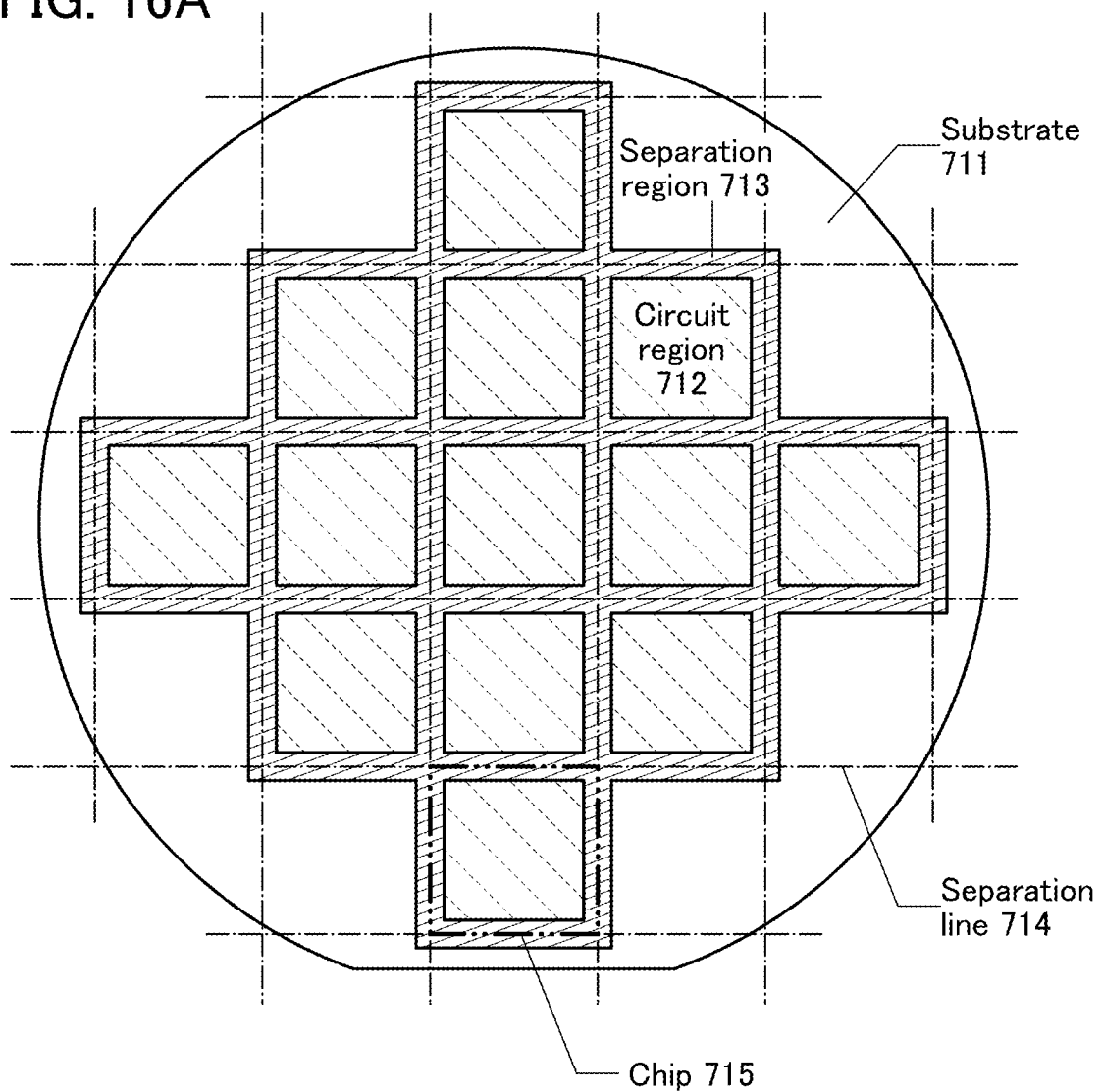
FIG. 16A is a top view of a semiconductor wafer.

FIG. 16A is a top view of a substrate 711 before dicing treatment. As the substrate 711, a semiconductor substrate (also referred to as a "semiconductor wafer") can be used, for example. A plurality of circuit regions 712 are provided over the substrate 711. A semiconductor device, a CPU, an RF tag, an image sensor, or the like of one embodiment of the present invention can be provided in the circuit region 712.

Figure 16B:
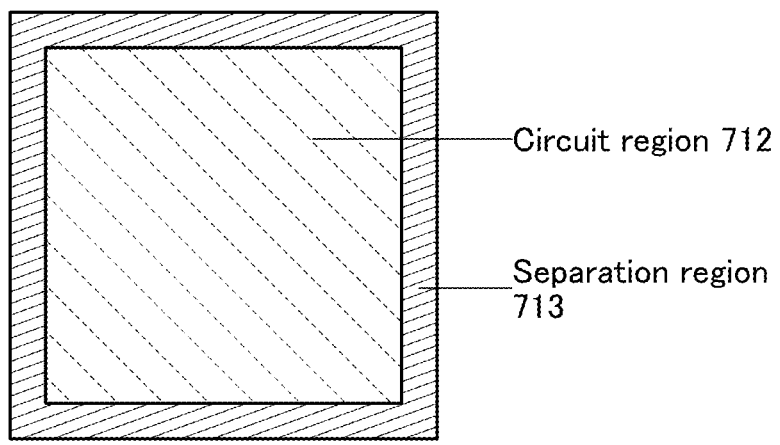
FIG. 16B is a top view of a chip.

The plurality of circuit regions 712 are each surrounded by a separation region 713. Separation lines (also referred to as "dicing lines") 714 are set at a position overlapping with the separation regions 713. The substrate 711 can be cut along the separation lines 714 into chips 715 including the circuit regions 712. FIG. 16B is an enlarged view of the chip 715.

A conductive layer or a semiconductor layer may be provided in the separation regions 713. Providing a conductive layer or a semiconductor layer in the separation regions 713 relieves ESD that might be caused in a dicing step, preventing a decrease in the yield of the dicing step. A dicing step is generally performed while letting pure water whose specific resistance is decreased by dissolution of a carbonic acid gas or the like flow to a cut portion, in order to cool down a substrate, remove swarf, and prevent electrification, for example. Providing a conductive layer or a semiconductor layer in the separation regions 713 allows a reduction in the usage of the pure water. Therefore, the cost of manufacturing semiconductor devices can be reduced. Moreover, semiconductor devices can be manufactured with improved productivity.

For a semiconductor layer provided in the separation regions 713, a material having a band gap of 2.5 eV or more and 4.2 eV or less, preferably 2.7 eV or more and 3.5 eV or less is preferably used. The use of such a material allows accumulated charges to be released slowly; thus, the rapid move of charges due to ESD can be suppressed and electrostatic breakdown is less likely to occur.

[Electronic Component]

Figure 17A:
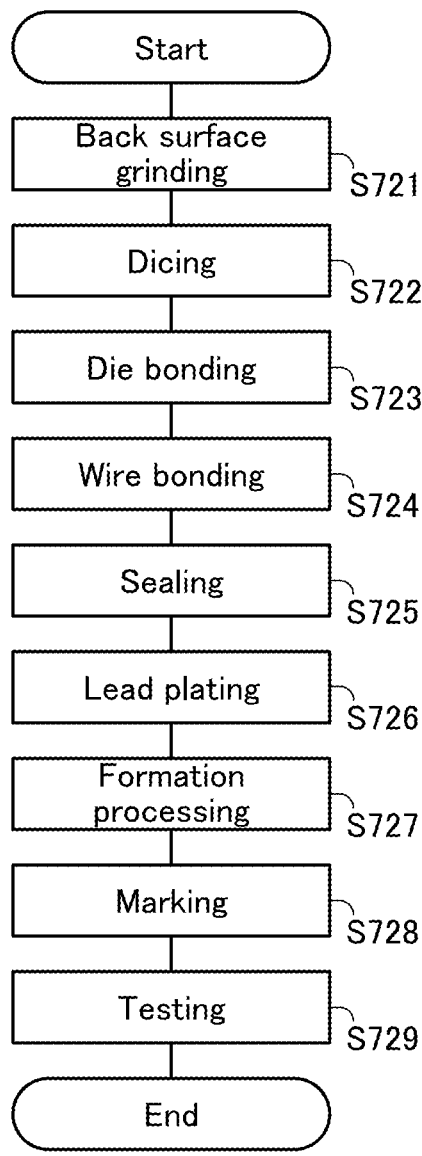
FIG. 17A is a flow chart showing a manufacturing process example of an electronic component.
Figure 17B:
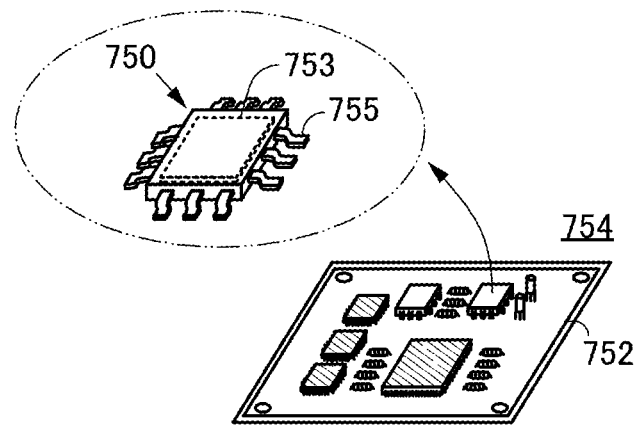
FIG. 17B is a schematic perspective view of an electronic component.

FIGS. 17A and 17B show an example in which the chip 715 is used in an electronic component. Note that the electronic component is also referred to as a semiconductor package or an IC package. This electronic component has a plurality of standards and names depending on a terminal extraction direction and a terminal shape.

The electronic component is completed when the semiconductor device described in the above embodiment is combined with components other than the semiconductor device in an assembly process (post-process).

The post-process will be described with reference to a flow chart in FIG. 17A. After an element substrate including the semiconductor device described in the above embodiment is completed in a pre-process, a back surface grinding step in which a back surface (a surface where a semiconductor device and the like are not formed) of the element substrate is ground is performed (Step S721). When the element substrate is thinned by grinding, warpage or the like of the element substrate is reduced, so that the size of the electronic component can be reduced.

Next, the element substrate is divided into a plurality of chips (chips 715) in a dicing step (Step S722). Then, the divided chips are separately picked up to be bonded to a lead frame in a die bonding step (Step S723). To bond a chip and a lead frame in the die bonding step, a method such as resin bonding or tape-automated bonding is selected as appropriate depending on products. Note that the chip may be bonded to an interposer substrate instead of the lead frame.

Next, a wire bonding step for electrically connecting a lead of the lead frame and an electrode on the chip through a metal fine line (wire) is performed (Step S724). A silver line or a gold line can be used as the metal fine line. Ball bonding or wedge bonding can be used as the wire bonding.

The wire-bonded chip is subjected to a sealing step (molding step) of sealing the chip with an epoxy resin or the like (Step S725). Through the sealing step, the inside of the electronic component is filled with a resin, so that a circuit portion incorporated in the chip and a wire for connecting the chip to the lead can be protected from external mechanical force, and deterioration of characteristics (a decrease in reliability) due to moisture or dust can be reduced.

Subsequently, the lead of the lead frame is plated in a lead plating step (Step S726). This plating process prevents rust of the lead and enables more reliable soldering at the time of mounting the electronic component on a printed circuit board in a later step. Then, the lead is cut and processed in a formation step (Step S727).

Next, a printing (marking) step is performed on a surface of the package (Step S728). After a testing step (Step S729) for checking whether an external shape is good and whether there is a malfunction, for example, the electronic component is completed.

FIG. 17B is a schematic perspective view of a completed electronic component. FIG. 17B is a schematic perspective view illustrating a quad flat package (QFP) as an example of the electronic component. An electronic component 750 in FIG. 17B includes a lead 755 and a semiconductor device 753. As the semiconductor device 753, the semiconductor device described in the above embodiment or the like can be used.

The electronic component 750 in FIG. 17B is mounted on a printed circuit board 752, for example. A plurality of electronic components 750 are combined and electrically connected to each other over the printed circuit board 752; thus, a substrate on which the electronic components are mounted (a circuit board 754) is completed. The completed circuit board 754 is provided in an electronic device or the like.

[Electronic Device]

Next, examples of electronic devices each including the semiconductor device of one embodiment of the present invention or the above-described electronic component will be described with reference to FIG. 18.

Examples of electronic devices including the semiconductor device of one embodiment of the present invention or the electronic component include display devices of televisions, monitors, and the like; lighting devices; desktop personal computers; laptop personal computers; word processors; image reproduction devices that reproduce still images and moving images stored in recording media such as digital versatile discs (DVDs); portable CD players; radios; tape recorders; headphone stereos; stereos; table clocks; wall clocks; cordless phone handsets; transceivers; mobile phones; car phones; portable game machines; tablet terminals; large-sized game machines such as pachinko machines; calculators; portable information terminals; electronic notebooks; e-book readers; electronic translators; audio input devices; video cameras; digital still cameras; electric shavers; high-frequency heating appliances such as microwave ovens; electric rice cookers; electric washing machines; electric vacuum cleaners; water heaters; electric fans; hair dryers; air-conditioning systems such as air conditioners, humidifiers, and dehumidifiers; dishwashers; dish dryers; clothes dryers; futon dryers; electric refrigerators; electric freezers; electric refrigerator-freezers; freezers for preserving DNA; flashlights; tools such as chain saws; smoke detectors; and medical equipment such as dialyzers. Other examples include industrial equipment such as guide lights, traffic lights, conveyor belts, elevators, escalators, industrial robots, power storage systems, and power storage devices for leveling the amount of power supply and smart grid.

In addition, moving objects and the like driven by electric motors using electric power from the power storage devices are also included in the category of electronic devices. Examples of the moving objects include electric vehicles (EVs), hybrid electric vehicles (HEVs) that include both an internal-combustion engine and a motor, plug-in hybrid electric vehicles (PHEVs), tracked vehicles in which caterpillar tracks are substituted for wheels of these vehicles, motorized bicycles including motor-assisted bicycles, motorcycles, electric wheelchairs, golf carts, boats, ships, submarines, helicopters, aircraft, rockets, artificial satellites, space probes, planetary probes, and spacecraft.

The semiconductor device of one embodiment of the present invention or the electronic component can be used for a communication device or the like incorporated in any of the electronic devices.

The electronic devices may include a sensor (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), for example.

The electronic devices can have a variety of functions such as a function of displaying a variety of data (a still image, a moving image, a text image, and the like) on a display portion, a touch panel function, a function of displaying a calendar, date, time, and the like, a function of executing a variety of software (programs), a wireless communication function, and a function of reading out a program or data stored in a recording medium, for example.

Figure 18:
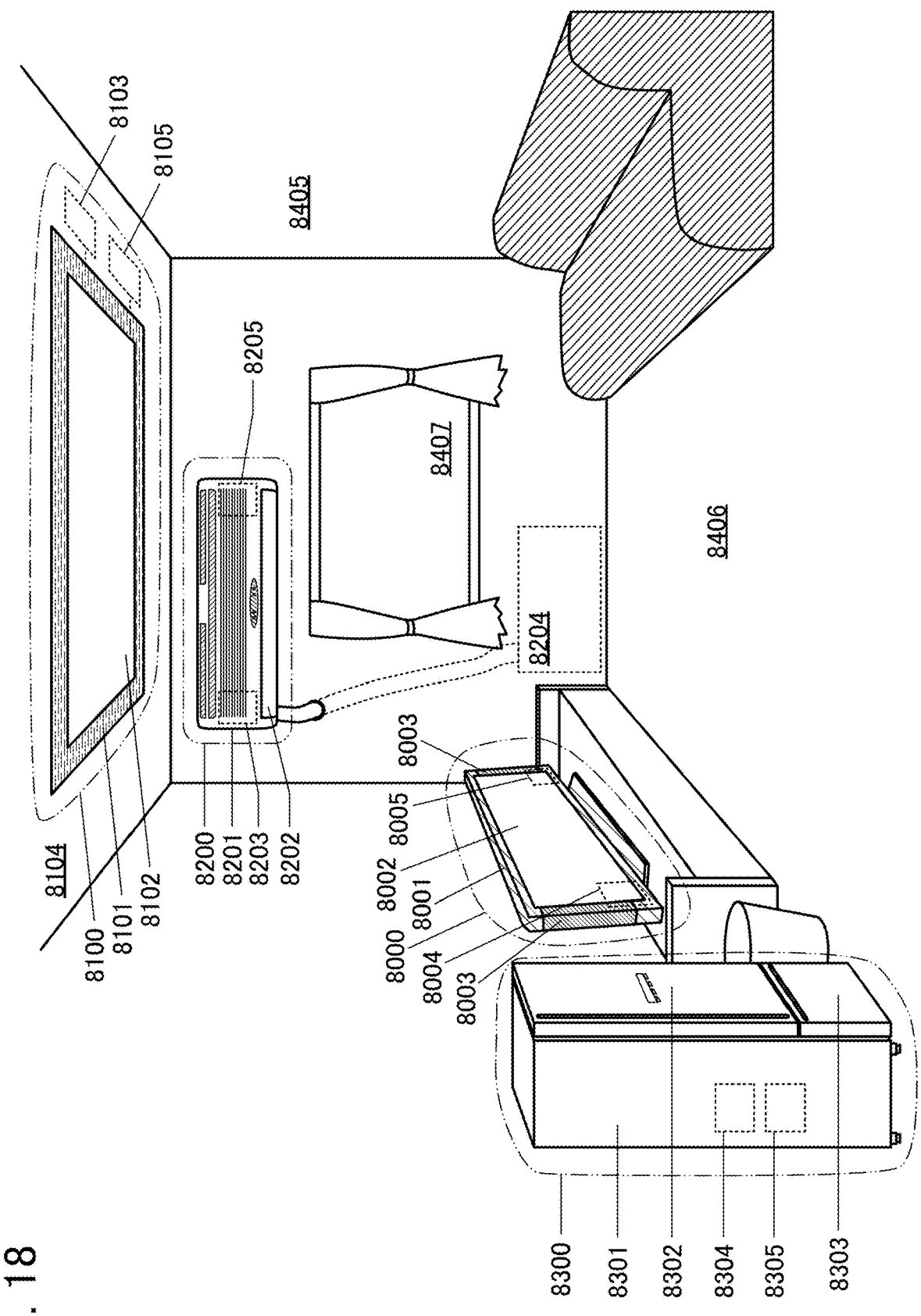
FIG. 18 illustrates examples of electronic devices.

FIG. 18 and FIGS. 19A to 19F illustrate examples of electronic devices. In FIG. 18, a display device 8000 is an example of an electronic device including a semiconductor device 8004 of one embodiment of the present invention. Specifically, the display device 8000 corresponds to a display device for TV broadcast reception and includes a housing 8001, a display portion 8002, speaker portions 8003, the semiconductor device 8004, a power storage device 8005, and the like. The semiconductor device 8004 of one embodiment of the present invention is provided in the housing 8001. The semiconductor device 8004 can retain control data, a control program, or the like. The semiconductor device 8004 has a communication function, and the display device 8000 can function as an IoT device. The display device 8000 can receive electric power from a commercial power supply. Alternatively, the display device 8000 can use electric power stored in the power storage device 8005.

A display device such as a liquid crystal display device, a light-emitting display device in which a light-emitting element such as an organic EL element is provided in each pixel, an electrophoresis display device, a digital micromirror device (DMD), a plasma display panel (PDP), or a field emission display (FED) can be used for the display portion 8002.

Note that the display device includes, in its category, all of information display devices for personal computers, advertisement displays, and the like besides TV broadcast reception.

In FIG. 18, an installation lighting device 8100 is an example of an electronic device including a semiconductor device 8103 of one embodiment of the present invention. Specifically, the lighting device 8100 includes a housing 8101, a light source 8102, the semiconductor device 8103, a power storage device 8105, and the like. Although FIG. 18 illustrates the case where the semiconductor device 8103 is provided in a ceiling 8104 on which the housing 8101 and the light source 8102 are installed, the semiconductor device 8103 may be provided in the housing 8101. The semiconductor device 8103 can retain data such as emission luminance of the light source 8102, a control program, or the like. The semiconductor device 8103 has a communication function, and the lighting device 8100 can function as an IoT device. The lighting device 8100 can receive electric power from a commercial power supply. Alternatively, the lighting device 8100 can use electric power stored in the power storage device.

Although FIG. 18 illustrates the installation lighting device 8100 provided in the ceiling 8104 as an example, the semiconductor device of one embodiment of the present invention can be used in an installation lighting device provided in, for example, a wall 8405, a floor 8406, a window 8407, or the like other than the ceiling 8104. Alternatively, the semiconductor device of one embodiment of the present invention can be used in a tabletop lighting device or the like.

As the light source 8102, an artificial light source that emits light artificially by using electric power can be used. Specific examples of the artificial light source include an incandescent lamp, a discharge lamp such as a fluorescent lamp, and light-emitting elements such as an LED and an organic EL element.

In FIG. 18, an air conditioner including an indoor unit 8200 and an outdoor unit 8204 is an example of an electronic device including a semiconductor device 8203 of one embodiment of the present invention. Specifically, the indoor unit 8200 includes a housing 8201, an air outlet 8202, the semiconductor device 8203, a power storage device 8205, and the like. Although FIG. 18 illustrates the case where the semiconductor device 8203 is provided in the indoor unit 8200, the semiconductor device 8203 may be provided in the outdoor unit 8204. Alternatively, the semiconductor devices 8203 may be provided in both the indoor unit 8200 and the outdoor unit 8204. The semiconductor device 8203 can retain control data, a control program, or the like of the air conditioner. The semiconductor device 8203 has a communication function, and the air conditioner can function as an IoT device. The air conditioner can receive electric power from a commercial power supply. Alternatively, the air conditioner can use electric power stored in the power storage device 8205.

Although FIG. 18 illustrates the split-type air conditioner including the indoor unit and the outdoor unit as an example, the semiconductor device of one embodiment of the present invention can be used in an air conditioner in which the functions of an indoor unit and an outdoor unit are integrated in one housing.

In FIG. 18, an electric refrigerator-freezer 8300 is an example of an electronic device including a semiconductor device 8304 of one embodiment of the present invention. Specifically, the electric refrigerator-freezer 8300 includes a housing 8301, a refrigerator door 8302, a freezer door 8303, the semiconductor device 8304, a power storage device 8305, and the like. In FIG. 18, the power storage device 8305 is provided in the housing 8301. The semiconductor device 8304 can retain control data, a control program, or the like of the electric refrigerator-freezer 8300. The semiconductor device 8304 has a communication function, and the electric refrigerator-freezer 8300 can function as an IoT device. The electric refrigerator-freezer 8300 can receive electric power from a commercial power supply. Alternatively, the electric refrigerator-freezer 8300 can use electric power stored in the power storage device 8305.

Figure 19A:
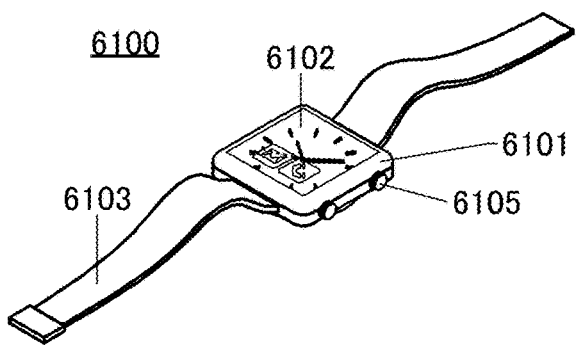
FIGS. 19A to 19F each illustrate an example of an electronic device.

FIG. 19A illustrates an example of a watch-type portable information terminal. A portable information terminal 6100 includes a housing 6101, a display portion 6102, a band 6103, operation buttons 6105, and the like. The portable information terminal 6100 further includes a secondary battery and the semiconductor device of one embodiment of the present invention or the electronic component. The portable information terminal 6100 including the semiconductor device of one embodiment of the present invention or the electronic component can function as an IoT device.

Figure 19B:
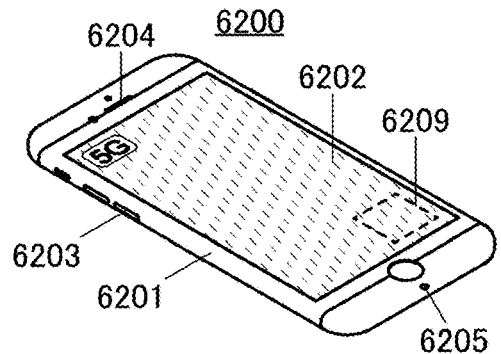

FIG. 19B illustrates an example of a portable information terminal. A portable information terminal 6200 includes a display portion 6202 incorporated in a housing 6201, operation buttons 6203, a speaker 6204, a microphone 6205, and the like.

The portable information terminal 6200 further includes a fingerprint sensor 6209 in a region overlapping with the display portion 6202. The fingerprint sensor 6209 may be an organic optical sensor. Since a fingerprint differs between individuals, the fingerprint sensor 6209 can perform personal authentication when acquiring fingerprint patterns. As a light source for acquiring fingerprint patterns with the fingerprint sensor 6209, light emitted from the display portion 6202 can be used.

The portable information terminal 6200 further includes a secondary battery and the semiconductor device of one embodiment of the present invention or the electronic component. The portable information terminal 6200 including the semiconductor device of one embodiment of the present invention or the electronic component can function as an IoT device.

Figure 19C:
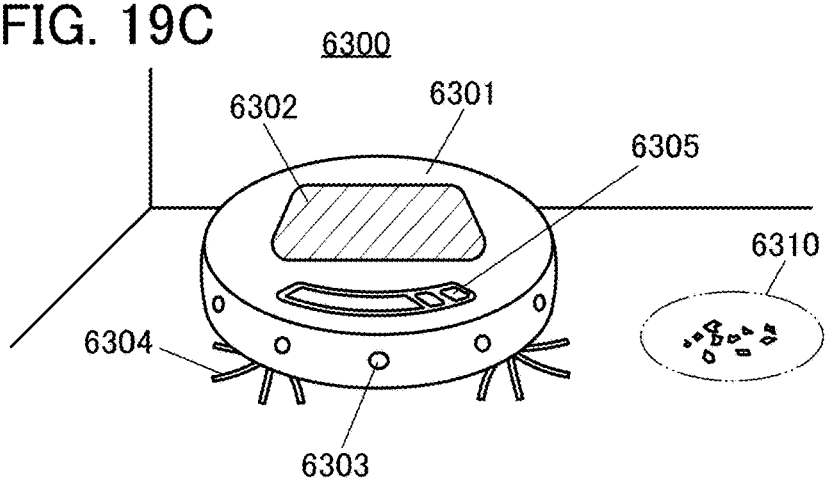

FIG. 19C illustrates an example of a cleaning robot. A cleaning robot 6300 includes a display portion 6302 placed on the top surface of a housing 6301, a plurality of cameras 6303 placed on the side surface of the housing 6301, a brush 6304, operation buttons 6305, a variety of sensors, and the like. Although a tire, an inlet, and the like are not illustrated, the cleaning robot 6300 is provided with the tire, the inlet, and the like. The cleaning robot 6300 is self-propelled, detects dust 6310, and sucks up the dust through the inlet provided on the bottom surface.

For example, the cleaning robot 6300 can determine whether there is an obstacle such as a wall, furniture, or a step by analyzing images taken by the cameras 6303. In the case where the cleaning robot 6300 detects an object that is likely to be caught in the brush 6304 (e.g., a wire) by image analysis, the rotation of the brush 6304 can be stopped. The cleaning robot 6300 further includes a secondary battery and the semiconductor device of one embodiment of the present invention or the electronic component. The cleaning robot 6300 including the semiconductor device of one embodiment of the present invention or the electronic component can function as an IoT device.

Figure 19D:
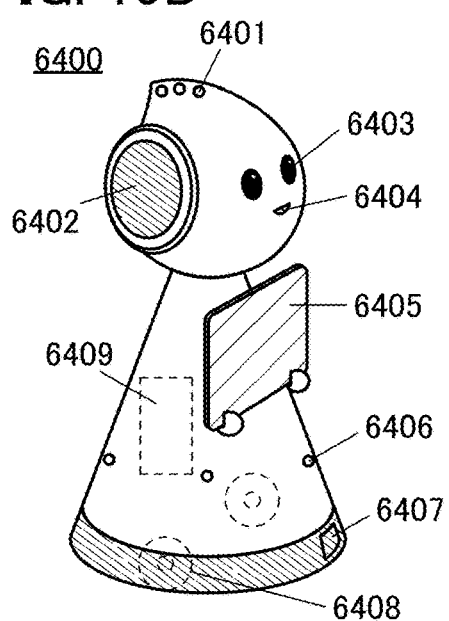

FIG. 19D illustrates an example of a robot. A robot 6400 illustrated in FIG. 19D includes an arithmetic device 6409, an illuminance sensor 6401, a microphone 6402, an upper camera 6403, a speaker 6404, a display portion 6405, a lower camera 6406, an obstacle sensor 6407, and a moving mechanism 6408.

The microphone 6402 has a function of detecting a speaking voice of a user, an environmental sound, and the like. The speaker 6404 has a function of outputting sound. The robot 6400 can communicate with a user using the microphone 6402 and the speaker 6404.

The display portion 6405 has a function of displaying various kinds of information. The robot 6400 can display information desired by a user on the display portion 6405. The display portion 6405 may be provided with a touch panel. Moreover, the display portion 6405 may be a detachable information terminal, in which case charging and data communication can be performed when the display portion 6405 is set at the home position of the robot 6400.

The upper camera 6403 and the lower camera 6406 each have a function of taking an image of the surroundings of the robot 6400. The obstacle sensor 6407 can detect an obstacle in the direction where the robot 6400 advances with the moving mechanism 6408. The robot 6400 can move safely by recognizing the surroundings with the upper camera 6403, the lower camera 6406, and the obstacle sensor 6407. The light-emitting device of one embodiment of the present invention can be used for the display portion 6405.

The robot 6400 further includes a secondary battery and the semiconductor device of one embodiment of the present invention or the electronic component. The robot 6400 including the semiconductor device of one embodiment of the present invention or the electronic component can function as an IoT device.

Figure 19E:
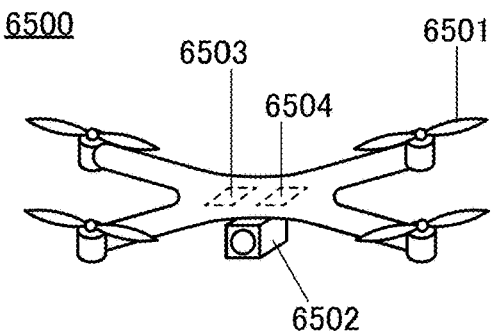

FIG. 19E illustrates an example of a flying object. A flying object 6500 illustrated in FIG. 19E includes propellers 6501, a camera 6502, a battery 6503, and the like and has a function of flying autonomously.

For example, image data taken by the camera 6502 is stored in an electronic component 6504. The electronic component 6504 can analyze the image data to detect whether there is an obstacle in the way of the movement. Moreover, the electronic component 6504 can estimate the remaining battery level from a change in the power storage capacity of the battery 6503. The flying object 6500 further includes the semiconductor device of one embodiment of the present invention or the electronic component. The flying object 6500 including the semiconductor device of one embodiment of the present invention or the electronic component can function as an IoT device.

Figure 19F:
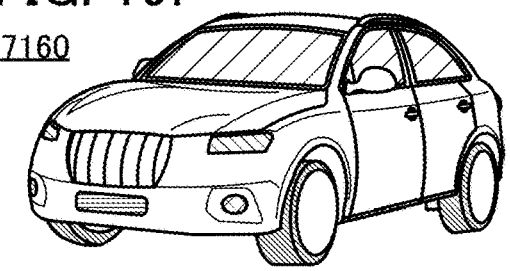

FIG. 19F illustrates an example of an automobile. An automobile 7160 includes an engine, tires, a brake, a steering gear, a camera, and the like. The automobile 7160 further includes the semiconductor device of one embodiment of the present invention or the electronic component. The automobile 7160 including the semiconductor device of one embodiment of the present invention or the electronic component can function as an IoT device.

The structures, the compositions, the methods, and the like described in this embodiment can be combined as appropriate with any of the structures, the compositions, the methods, and the like described in the other embodiments and examples.

Embodiment 5

With the use of the OS transistor described in this specification and the like, a CPU that is capable of normally-off (Noff) computing (also referred to as a normally-off CPU or an Noff CPU) can be obtained. Note that the Noff CPU is an integrated circuit including a normally-off transistor, which is in a non-conduction state (also referred to as an off state) even when a gate voltage is 0 V.

In the Noff CPU, power supply to a circuit that does not need to operate can be stopped so that the circuit can be brought into a standby state. The circuit brought into the standby state because of the stop of power supply does not consume power. Thus, the power usage of the Noff CPU can be minimized. Moreover, the Noff CPU can retain data necessary for operation, such as setting conditions, for a long time even when power supply is stopped. The return from the standby state requires only restart of power supply to the circuit and does not require rewiring of setting conditions or the like. In other words, high-speed return from the standby state is possible. As described here, the power consumption of the Noff CPU can be reduced without a significant decrease in operation speed.

The Noff CPU can be suitably used for a small-scale system such as an IoT end device (also referred to as an endpoint microcomputer) 803 in the IoT field, for example.

Figure 20:
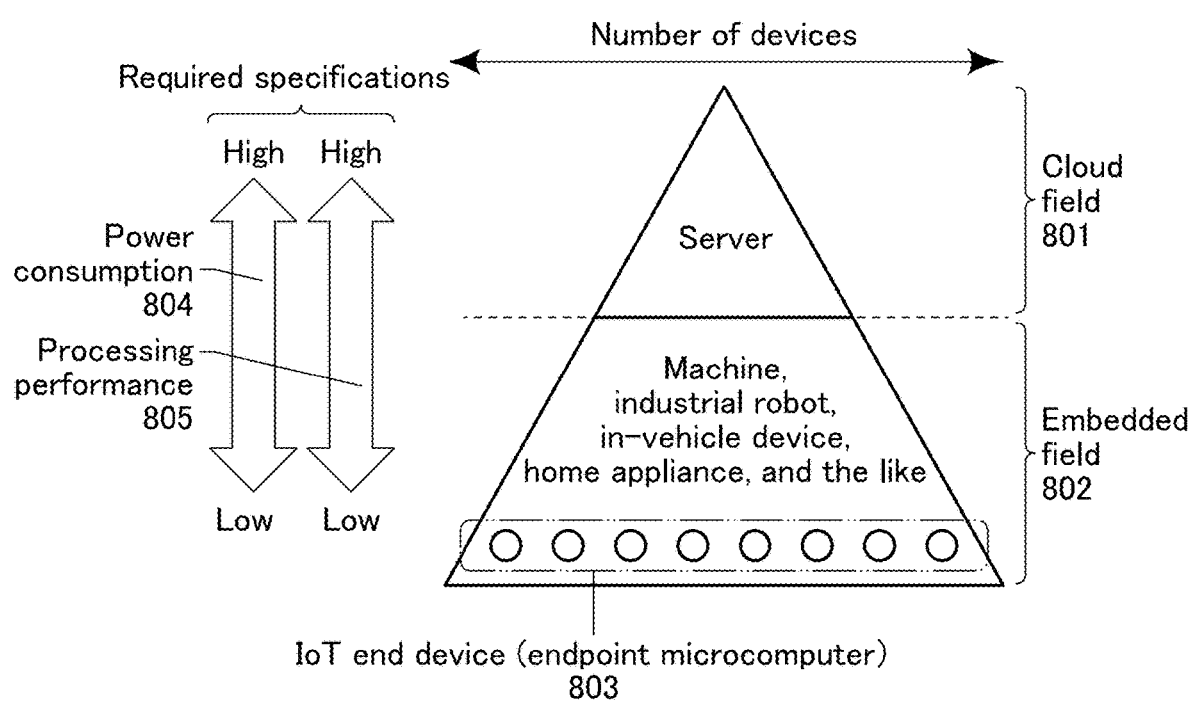
FIG. 20 shows a hierarchical structure of an IoT network and tendencies of required specifications.

FIG. 20 shows a hierarchical structure of an IoT network and tendencies of required specifications. FIG. 20 shows power consumption 804 and processing performance 805 as the required specifications. The hierarchical structure of the IoT network is roughly divided into a cloud field 801 at the top and an embedded field 802 at the bottom. The cloud field 801 includes a server, for example. The embedded field 802 includes a machine, an industrial robot, an in-vehicle device, and a home appliance, for example.

Higher processing performance is required rather than lower power consumption towards the top of the hierarchical structure. Thus, a high-performance CPU, a high-performance graphics processing unit (GPU), a large-scale system on chip (SoC), and the like are used in the cloud field 801. Furthermore, lower power consumption is required rather than higher processing performance towards the bottom of the hierarchical structure, and the number of devices is explosively increased. The semiconductor device of one embodiment of the present invention can be suitably used for a communication device in the IoT end device that needs to have low power consumption.

Note that an endpoint refers to an end region of the embedded field 802. Examples of a device used in the endpoint include microcomputers used in a factory, a home appliance, infrastructure, agriculture, and the like.

Figure 21:
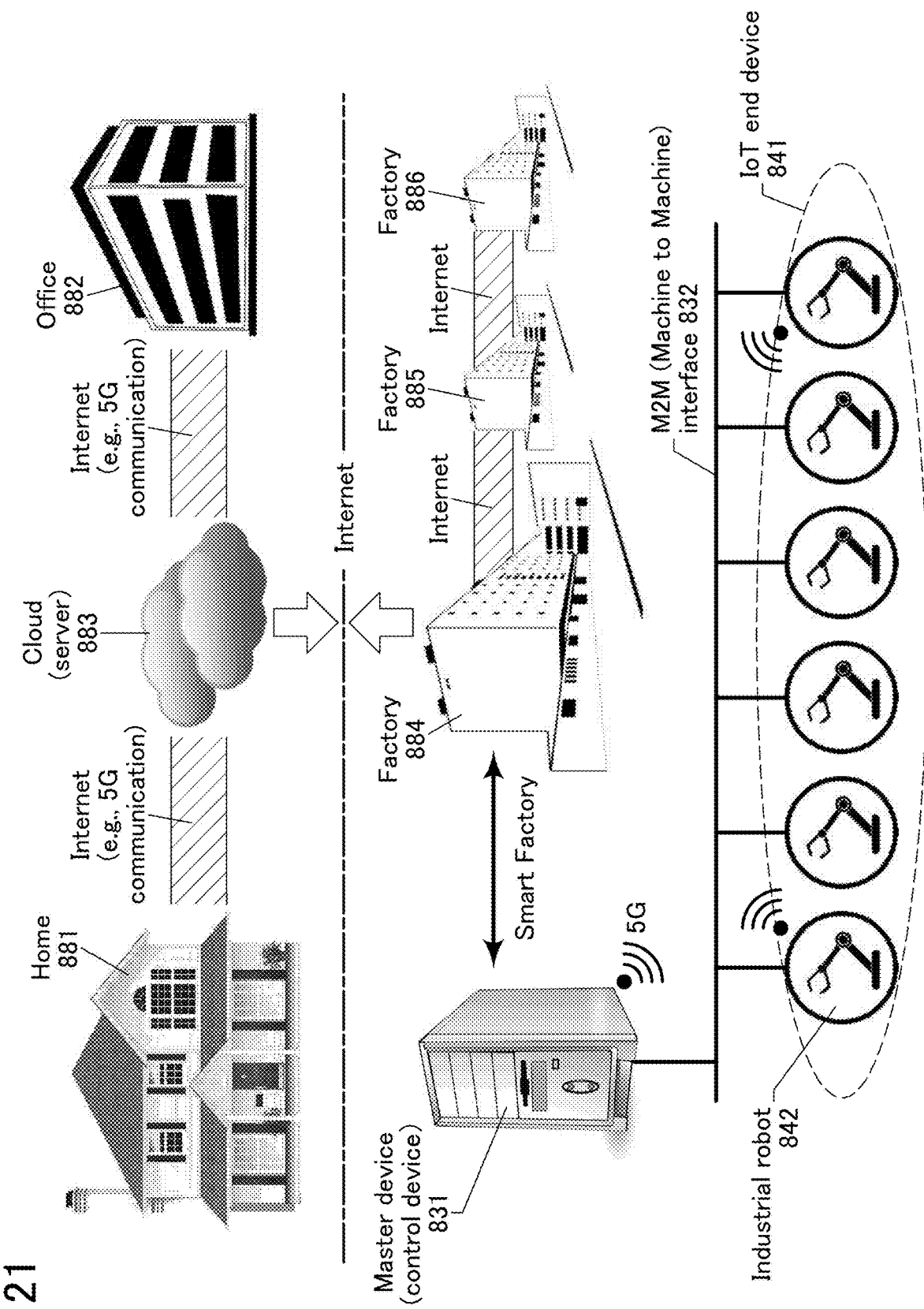
FIG. 21 is an image diagram of factory automation.

FIG. 21 is an image diagram showing factory automation as an application example of the endpoint microcomputer. A factory 884 is connected to a cloud 883 through Internet connection. The cloud 883 is connected to a home 881 and an office 882 through Internet connection. The Internet connection may be wired communication or wireless communication. In the case of wireless communication, for example, wireless communication based on a communication standard such as 4G or 5G is performed using the semiconductor device of one embodiment of the present invention for a communication device. The factory 884 may be connected to a factory 885 and a factory 886 through Internet connection.

The factory 884 includes a master device (control device) 831. The master device 831 is connected to the cloud 883 and has a function of transmitting and receiving data. The master device 831 is connected to a plurality of industrial robots 842 included in an IoT end device 841 through a Machine-to-Machine (M2M) interface 832. As the M2M interface 832, for example, industrial Ethernet (Ethernet is a registered trademark), which is a kind of wired communication, or local 5G, which is a kind of wireless communication, may be used.

A manager of the factory can check the operational status or the like from the home 881 or the office 882 connected to the factory 884 through the cloud 883. In addition, the manager can check wrong items and part shortage, instruct a storage space, and measure takt time, for example.

In recent years, IoT has been globally introduced into factories; this situation is called Smart Factory. Smart Factory has been reported to enable not only simple examination and inspection by an endpoint microcomputer but also detection of failures and prediction of abnormality, for example.

The total power consumption of a small-scale system such as an endpoint microcomputer during operation is often small, which enhances the power reduction effect in a standby state by the Noff CPU. Although the embedded field of IoT sometimes requires quick response, the use of the Noff CPU achieves high-speed return from a standby state.

The structures, the compositions, the methods, and the like described in this embodiment can be combined as appropriate with any of the structures, the compositions, the methods, and the like described in the other embodiments and examples, for example.

Embodiment 6

<Structure Example of Data Processing System>

Figure 22A:
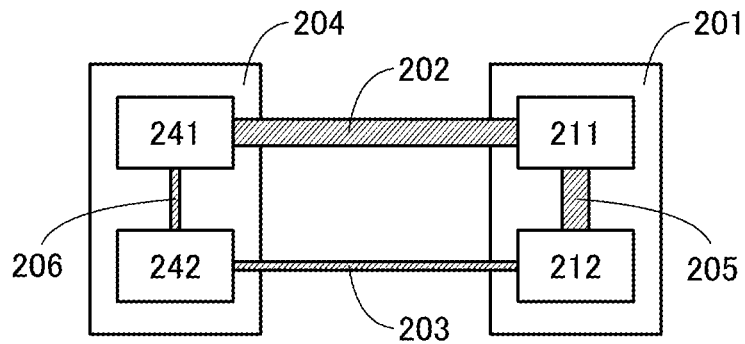
FIGS. 22A to 22C are each a block diagram showing a structure example of a data processing system.

FIG. 22A is a block diagram showing a structure example of a data processing system 200 of one embodiment of the present invention. The data processing system 200 includes an arithmetic processing device 201, a bus line 202, a bus line 203, and a storage device 204. The arithmetic processing device 201 includes a CPU 211 and a cache memory 212. The storage device 204 includes a DRAM 241 and a cache memory 242. Note that the CPU 211 may include a cache memory (different from the cache memory 212).

The data transmission speed of the bus line 203 is lower than that of the bus line 202. That is, the amount of data that can be transmitted per unit time is smaller in the bus line 203 than in the bus line 202. The power consumption of the bus line 203 is lower than that of the bus line 202.

The bus line 202 has a function of transmitting data between the CPU 211 and the DRAM 241, and the bus line 203 has a function of transmitting data between the cache memory 212 and the cache memory 242.

The arithmetic processing device 201 includes a bus line 205 having a function of transmitting data between the CPU 211 and the cache memory 212. The storage device 204 includes a bus line 206 having a function of transmitting data between the DRAM 241 and the cache memory 242.

Note that the CPU 211 is preferably an Noff CPU. The Noff CPU includes a nonvolatile memory, and power supply to the Noff CPU can be stopped during the time when the Noff CPU does not need to operate. The stop of power supply to the CPU can reduce the static power consumption due to leakage current of a transistor, for example.

The CPU 211 may be a GPU, a neural network processing unit (NPU), a field programmable gate array (FPGA), or the like. Alternatively, the CPU 211 may be a combination of a CPU, a GPU, an NPU, an FPGA, and the like.

The cache memory 212 and the cache memory 242 are each preferably a nonvolatile oxide semiconductor random access memory (NOSRAM: registered trademark). The NOSRAM is a storage device or a semiconductor device that includes a gain memory cell including an OS transistor, and has an extremely long data retention time. In addition, the NOSRAM can perform non-destructive reading.

The DRAM 241 is preferably a dynamic oxide semiconductor random access memory (DOSRAM: registered trademark). The DOSRAM is a DRAM including an OS transistor in a memory cell and has a long data retention time. An OS transistor is a thin film transistor; thus, memory cells can be stacked. For example, a peripheral circuit of a DRAM is formed using a transistor formed over a semiconductor substrate, and a memory cell of the DRAM can be formed using an OS transistor above the peripheral circuit.

A plurality of layers including memory cells formed using OS transistors may be stacked (also referred to as 3D DOSRAM). When the DRAM 241 is a DOSRAM or a 3D DOSRAM, the amount of data that can be stored in the DRAM 241 can be increased or the chip area of the DRAM 241 can be reduced.

Figure 22B:
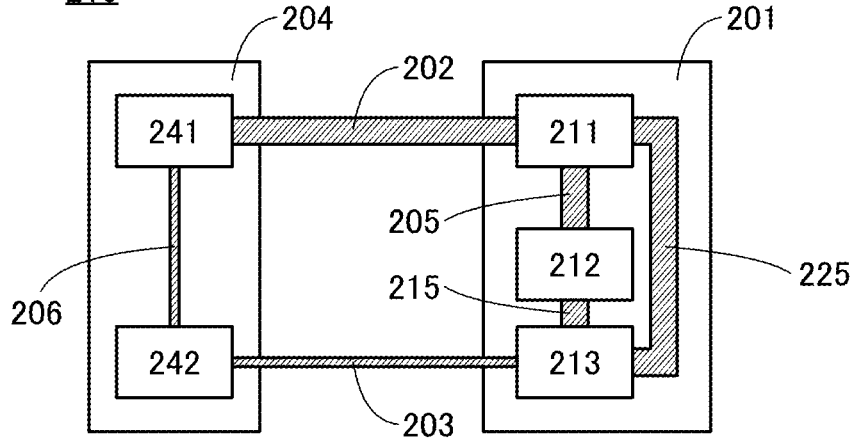

The data processing system 200 may include a plurality of cache memories. FIG. 22B is a block diagram showing a structure example of a data processing system 210 of one embodiment of the present invention. The data processing system 210 includes a cache memory 213 in addition to the cache memory 212. The data processing system 210 includes a bus line 215 or a bus line 225 in addition to the bus line 205. Alternatively, the data processing system 210 may include the bus line 215 and the bus line 225 in addition to the bus line 205.

In the data processing system 210, the bus line 215 has a function of transmitting data between the cache memory 212 and the cache memory 213, the bus line 225 has a function of transmitting data between the CPU 211 and the cache memory 213, and the bus line 203 has a function of transmitting data between the cache memory 213 and the cache memory 242.

The cache memory 213 may have a function similar to that of the cache memory 212. For example, the cache memory 213 may be a NOSRAM. The amount of data that can be stored in the cache memory 213 may be larger than that in the cache memory 212, and/or the operation speed of the cache memory 213 may be lower than that of the cache memory 212. The other components of the data processing system 210 are similar to those of the data processing system 200 and thus are not described here.

Figure 22C:
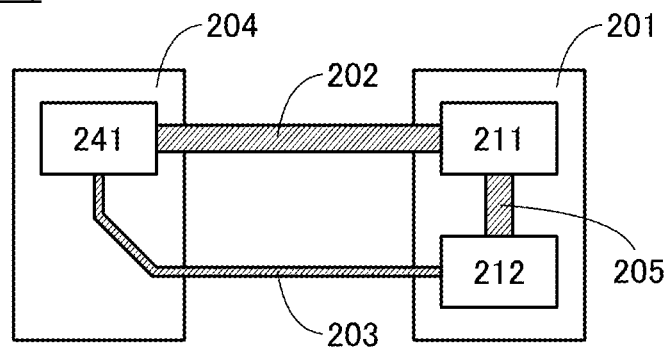

The data processing system 200 does not necessarily include the cache memory 242. FIG. 22C shows a structure example of a data processing system 220 that is different from the data processing system 200 in not including the cache memory 242 and the bus line 206. In the data processing system 220, the bus line 203 has a function of transmitting data between the cache memory 212 and the DRAM 241. The other components of the data processing system 220 are similar to those of the data processing system 200 and thus are not described here.

<Example of Data Transmission in Data Processing System>

An example of data transmission in the data processing system 200, the data processing system 210, and the data processing system 220 of one embodiment of the present invention will be described. Note that in the case where the data processing system 200, the data processing system 210, and the data processing system 220 do not need to be distinguished from each other, the description of the data processing system 210 and the data processing system 220 is omitted below.

In the data processing system 200, the DRAM 241 corresponds to a main memory, and data or a set of data and program stored in the DRAM 241 is supplied to the CPU 211 through the bus line 202. The CPU 211 performs processing in accordance with the program and generates new data; the data is transmitted to the DRAM 241 through the bus line 202 and stored in the DRAM 241.

Note that the processing speed of the whole data processing system 200 can be sometimes higher in the case where data (or data and program) that is frequently used (i.e., frequently accessed) is temporarily retained in a cache memory provided in or near the CPU 211 than in the case where such data (or data and program) is transmitted between the CPU 211 and the DRAM 241 through the bus line 202 every time the data (or data and program) is needed.

By contrast, when data newly generated by the CPU 211 is retained in a cache memory, the data needs to be transmitted to the DRAM 241 and stored in the DRAM 241. That is, data that is newly generated by the CPU 211 and is unlikely to be used needs to be transmitted to the DRAM 241. Alternatively, data that is retained in a cache memory and is not frequently accessed needs to be transmitted to the DRAM 241.

In the data processing system 200, data that is unlikely to be used or is not frequently accessed is transmitted to the cache memory 242 or the DRAM 241 through the bus line 203. The data transmission speed and power consumption of the bus line 203 are lower than those of the bus line 202; thus, the transmission of data that is unlikely to be used or is not frequently accessed through the bus line 203 consumes lower power than the transmission thereof through the bus line 202. In the case where data that is unlikely to be used or is not frequently accessed is transmitted, the low data transmission speed of the bus line 203 is not a critical problem.

When data that is unlikely to be used or is not frequently accessed is transmitted through the bus line 203, the amount of data transmitted through the bus line 202 can be reduced. A reduction in the amount of data transmitted through the bus line 202 makes data transmission between the CPU 211 and the DRAM 241 smooth, which can sometimes increase the processing speed of the whole data processing system 200.

<Usage Example of Data Processing System>

For example, the data processing system 200 of one embodiment of the present invention can be effectively used for learning in artificial intelligence.

Artificial intelligence is formed using a neural network modeled on the mechanism of the human brain (biological neural network). The neural network has a circuit configuration that resembles a biological neural network composed of neurons and synapses. Two or more pieces of data are input to each of the neurons and multiplied by a "weight coefficient" representing the strength of connection, and the sum of the products is obtained. That is, a weight coefficient represents importance, degree of contribution, and the like of each input data.

Learning in artificial intelligence is calculation and optimization of a weight coefficient. That is, in the case where learning is performed in the data processing system 200, data corresponding to a weight coefficient is frequently accessed.

When learning is performed in the data processing system 200, data corresponding to a weight coefficient is stored in the cache memory 212 (or a cache memory in the CPU 211), and the CPU 211 calculates the weight coefficient. In the case where the optimized weight coefficient is not used immediately after the learning, the frequency of access to the data corresponding to the weight coefficient suddenly decreases.

That is, the event-driven data transmission from the cache memory 212 to the cache memory 242 through the bus line 203 can be performed in conjunction with the event of the end of learning. Then, the CPU 211, the bus line 202, and the DRAM 241 can perform the subsequent data processing; thus, the processing speed of the whole data processing system 200 can be increased.

The structures, the compositions, the methods, and the like described in this embodiment can be combined as appropriate with any of the structures, the compositions, the methods, and the like described in the other embodiments and examples, for example.

Example 1

A microcontroller unit (MCU) was fabricated using a transistor including a crystalline In—Ga—Zn oxide semiconductor in a semiconductor layer (an IGZO-FET). The fabricated MCU includes a logic circuit that can retain data at the time of power-off, a memory macro, and an internal voltage regulator that can retain a reference voltage. The MCU was fabricated using a combination of a 60-nm IGZO process integrated with a back end of line (BEOL) and a 110-nm Si CMOS process, and achieved a leakage power of 880 nW, a system backup time of 21 ns, and a restoration time of 4.69 μs. The MCU including the IGZO-FET can be used for devices requiring low power consumption and quick startup, typified by IoT and edge AI.

In recent years, IoT and artificial intelligence (AI) have attracted attention as IC applications. In order to further accelerate the widespread use of IoT such as edge computing and AI technology, lower-power LSI is increasingly demanded.

As a technique for reducing power consumption, normally-off computing has been proposed. In the normally-off computing, data on the system state or the like is retained during power gating (PG), and the data needs to be restored instantly at the time of returning from the power gating. In the case of an application in which there is a large difference between a standby state and an active state, the power-on operation accounts for the majority of the active time. Thus, quick startup of a power supply circuit is also important.

When a ReRAM, an MTJ, or the like is used as a nonvolatile device, backup energy per bit is large. Thus, it is difficult to back up system data collectively. In addition, there are problems of long overhead time and large overhead energy due to the PG.

By contrast, in the case of a normally-off CPU and an embedded memory each including an IGZO-FET that has an extremely low off-state current of $10^{-21}$ A or lower, energy for data writing is small and thus the overhead in the PG is also small.

Table 1 compares novel memories.

The IGZO-FET included in the fabricated MCU has a trench-gate self-aligned (TGSA) structure. The IGZO-FET has a structure similar to that of a Fin-FET and includes a top gate (a top gate electrode) and a back gate (a back gate electrode).

FIG. 23A is a bird's-eye view of the IGZO-FET. FIG. 23B shows a manufacturing process flow chart of the IGZO-FET. FIG. 23C is a cross-sectional TEM image of a stacked-layer structure of Si CMOS-FETs and IGZO-FETs. FIG. 23C also shows the positions of layers M1 to M7, which are metal wiring layers.

The bird's-eye view of FIG. 23A shows a cross section passing through the top gate, the back gate, and a source and a drain (S/D electrodes). Thus, FIG. 23A also shows cross sections of a gate insulating layer on the top gate side (a top gate insulator), a gate insulating layer on the back gate side (a back gate insulator), and a semiconductor layer (an In—Ga—Zn oxide) where a channel is formed.

Figure 24:
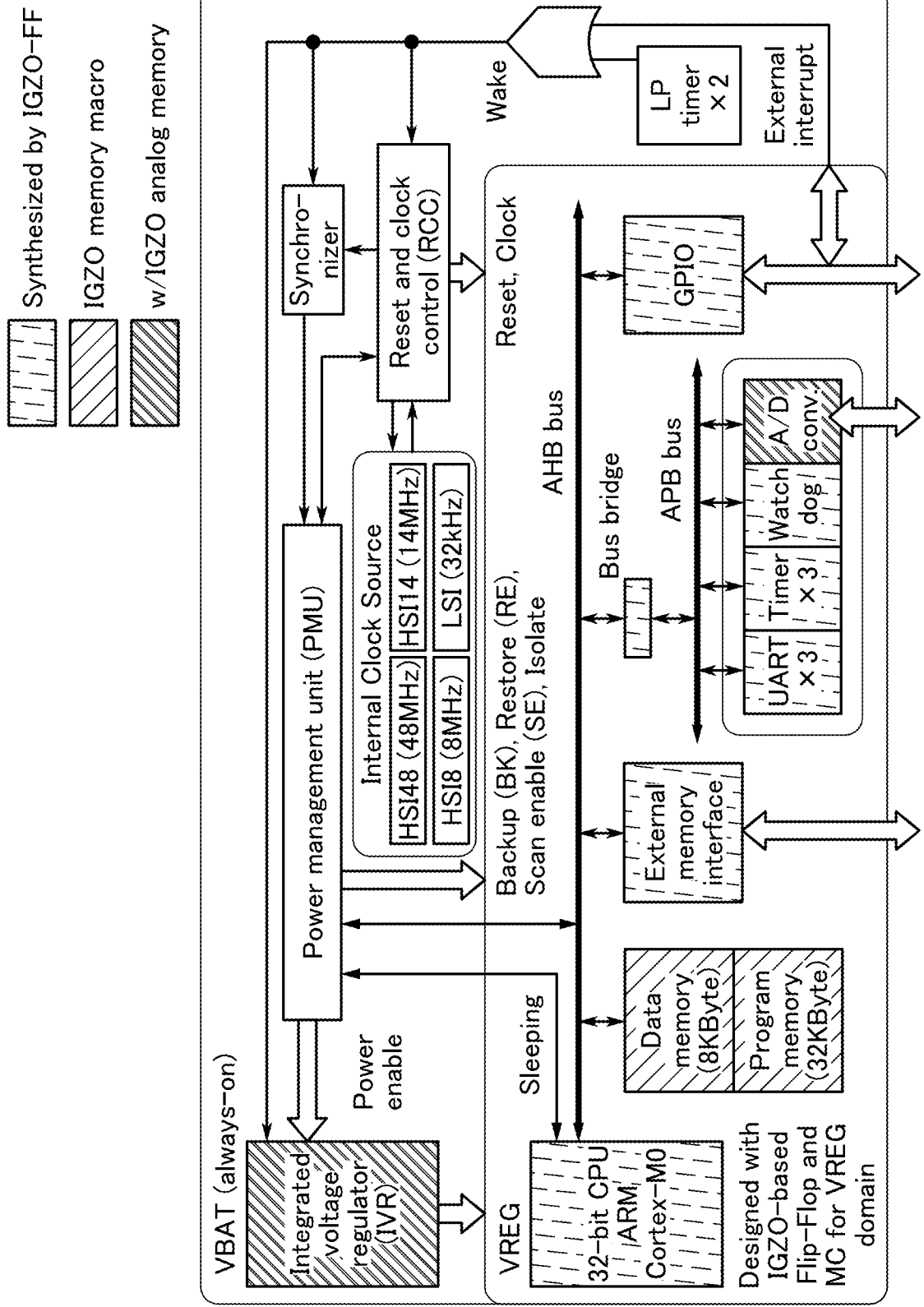
FIG. 24 shows a system structure of a fabricated normally-off MCU.

FIG. 24 shows a system structure of the fabricated normally-off MCU. The fabricated normally-off MCU includes a 32-bit ARM Cortex-M0 CPU, an 8 KB data memory, a 32 KB program memory, and circuits such as UARTs, timers, a monitoring circuit (a watchdog timer), an A/D converter, a general-purpose input/output (GPIO), and an external memory interface (IF). The fabricated normally-off MCU also includes an AHB bus, an APB bus, and a bus bridge.

The fabricated normally-off MCU also includes circuits for internally generating clock signals (internal clock sources), such as HSI8 (8 MHz), HSI48 (48 MHz), HSI14 (14 MHz), and LSI (32 kHz).

A power domain includes VBAT (constant power supply) and VREG. The VREG is a power supply to which power is supplied from an integrated voltage regulator (IVR) and which is capable of PG operation.

A power management unit (PMU) controls various operation modes (see Table 2).

TABLE 1

| Device | IGZO | STT-MRAM | ReRAM | PCM |
| --- | --- | --- | --- | --- |
| Principle | Extremely low leakage | Spin transfer | Formation of filament | Phase change |
| Element | Transistor (4 terminals) | Resistor (2 terminals) | Resistor (2 terminals) | Resistor (2 terminals) |
| On/off ratio | >1E12 | <3 | <1E2 | <1E3 |
| Write energy | <10 fJ | >100 fJ | >100 fJ | >10 pJ |
| Endurance | >1E14 | >1E6 | >1E8 | >1E8 |
| Issue of scalability | Demonstrate 25-nm device | Retention at high temp. | Miniaturize filament | High current for writing |

TABLE 2

| Mode | CPU | IGZO | Description | Wakeup Trigger |
|---|---|---|---|---|
| Run | Run | | Processing | — |
| Sleep 1 | WFI | | Only CPU is stopped | NMI, IRQ |
| Sleep 2 | WFI | | Disabled HSI8, HSI48, HSI14 | IRQ (Ext., LPTMR) |
| Deep-Sleep 1 | WFI | V | Power gating for VREG domain, Disabled HSI8, HSI48, HSI14 | IRQ (Ext., LPTMR) |
| Deep-Sleep 2 | WFI | V | Power gating for VREG domain, Disabled HSI8, HSI48, HSI14, LSI | IRQ (Ext.) |
| Backup only | STR | V | Perform backup individually | — |
| Restore only | STR | V | Perform restore individually | — |
| Refresh | STR | V | Restore to backup | — |

The PMU has a function of supplying, to the IVR, a signal for enabling power supply to the VREG, for example. The PMU also has a function of supplying a sleep signal to the CPU. The PMU also has a function of outputting a backup signal (BK), a restoration signal (RE), a scan enable signal (SE), and an isolate signal.

The fabricated normally-off MCU includes a synchronizer, a reset and clock control (RCC) circuit, and low-power (LP) timers. The RCC circuit has a function of outputting a reset signal and a clock signal. The LP timers have a function of supplying a startup signal to an input of an OR circuit. A startup signal from the outside (external interrupt) is also input to the OR circuit. The OR circuit outputs a restart signal (wake) when the startup signal is input.

The fabricated normally-off MCU has four low-power modes of a Sleep 1 mode, a Sleep 2 mode, a Deep-Sleep 1 mode, and a Deep-Sleep 2 mode.

In the Sleep 1 mode and the Sleep 2 mode, power consumed by toggling of a clock signal is reduced. In the Deep-Sleep 1 mode and the Deep-Sleep 2 mode, leakage power is reduced by PG performed on the VREG domain.

With the use of the IGZO-FET, the fabricated normally-off MCU backs up data of the whole system and retains the reference voltage of the IVR. Through these operations, the VREG domain can be charged at high speed and the original system state can be instantly restored at the time of returning from the PG, thereby restarting the processing immediately.

Figure 25A:
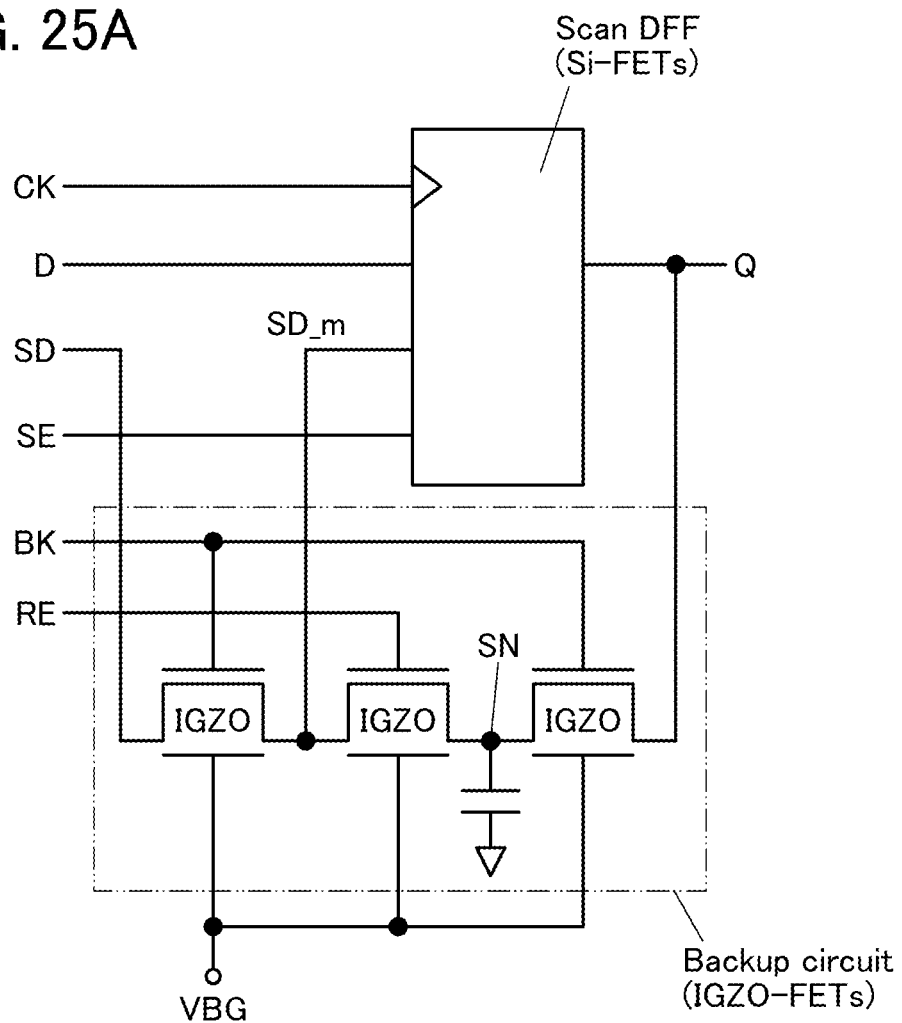
FIG. 25A shows a circuit structure example of a flip-flop including IGZO-FETs.
Figure 26:
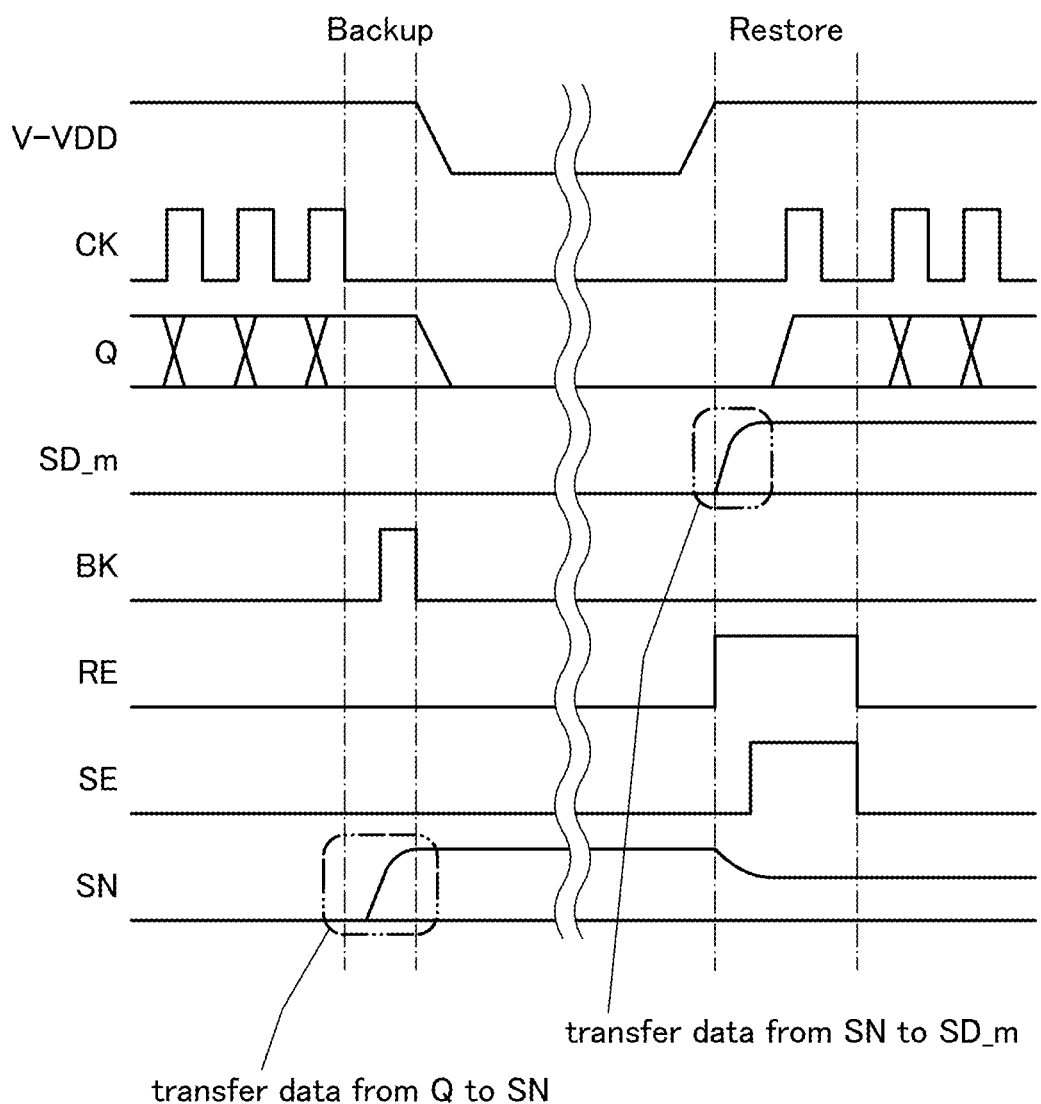
FIG. 26 is a timing chart showing operation of an IGZO-FF.

In the normally-off MCU, data of the system needs to be backed up at the time of power-off. FIG. 25A is a circuit diagram of a flip-flop circuit including the IGZO-FETs (an IGZO-FF). FIG. 26 is a timing chart showing the operation of the IGZO-FF. Table 3 is a truth table of the IGZO-FF. The IGZO-FF includes a flip-flop circuit fabricated using a foundry's standard Si-FET (a Si—FF) and a backup circuit composed of a 3T1C device including the IGZO-FETs. A back gate voltage (VBG) is supplied to back gates of the IGZO-FETs. The IGZO-FF can be fabricated without a change from the foundry's standard layout. The layout of a digital circuit (e.g., the CPU) in the VREG power domain was determined by logic synthesis including the IGZO-FF and the automatic placement and routing.

The IGZO-FF has a function of retaining data in a node SN. FIG. 25A shows a DFF having a scan function (a scan DFF) as the Si-FF.

TABLE 3

| | CK | D | SD | SE | Q[n + 1] | BK | RE | SN |
|---|---|---|---|---|---|---|---|---|
| Normal | R | 0 | X | 0 | 0 | 0 | 0 | X |
| | R | 1 | X | 0 | 1 | 0 | 0 | X |

TABLE 3-continued

| | CK | D | SD | SE | Q[n + 1] | BK | RE | SN |
|---|---|---|---|---|---|---|---|---|
| Scan | R | X | 0 | 1 | 0 | 1 | 0 | X |
| | R | X | 1 | 1 | 1 | 1 | 0 | X |
| Hold | F | X | X | X | Q[n] | 0 | 0 | X |
| Backup | 0 | X | X | X | X | 1 | 0 | Q[n] |
| Restore | R | X | X | 1 | Q[n] | 0 | 1 | Q[n] |

Figure 25B:
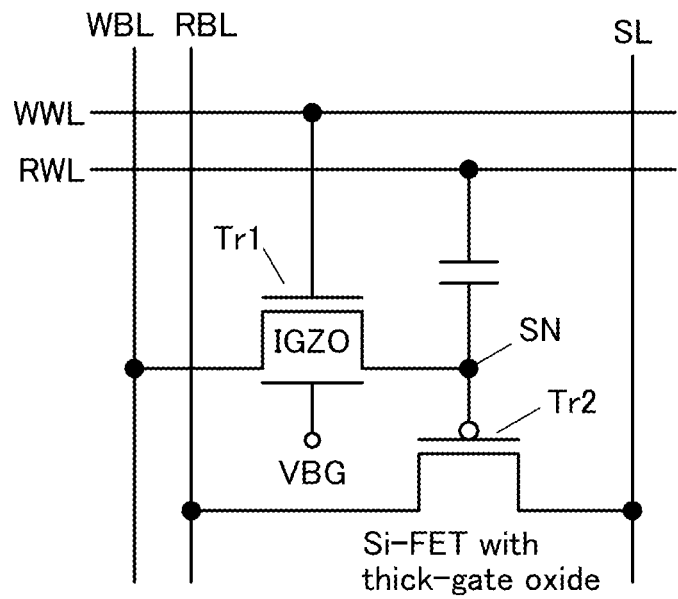
FIG. 25B shows a circuit structure example of a 2T1C gain memory cell including an IGZO-FET.

FIG. 25B is a circuit diagram of a 2T1C gain memory cell including the IGZO-FET. The memory cell shown in FIG. 25B has a function of retaining data in the node SN. A gain memory cell using an OS transistor (IGZO-FET) as a transistor Tr1 is referred to as a nonvolatile oxide semiconductor RAM (NOSRAM) in some cases. A transistor Tr2 may be an OS transistor or a transistor other than an OS transistor. For example, a transistor in which silicon is used for a semiconductor layer where a channel is formed (such a transistor is also referred to as a Si transistor or Si-FET) may be used as the transistor Tr2.

Table 4 is a truth table of the 2T1C gain memory cell. The memory cell shown in FIG. 25B can be used as the data memory and the program memory.

TABLE 4

| | WWL | RWL | WBL | RBL | SL | SN |
|---|---|---|---|---|---|---|
| Write 0 | Vdh | gnd | gnd | gnd | gnd | gnd |
| Write 1 | Vdh | gnd | Vdd | gnd | gnd | Vdd |
| Read 0 | gnd | gnd | Vdd | <Vdd | Vdd | gnd |
| Read 1 | gnd | gnd | Vdd | gnd | Vdd | Vdd |
| Hold 0 | gnd | Vdh | Vdd | gnd | gnd | gnd + α |
| Hold 1 | gnd | Vdh | Vdd | gnd | gnd | Vdd + α |

Note that in this example and the like, "IGZO" is sometimes written beside a circuit symbol of a transistor in order to clearly show that the transistor is an IGZO-FET.

Table 5 shows the simulation results of the area overhead, the delay time (operation speed) overhead, and the energy consumption (power consumption) overhead when the Si-FF is replaced with the IGZO-FF. The assumed Si technologies are 110 nm, 55 nm, and 28 nm, and the assumed IGZO technology is 60 nm. The area increase rate due to the replacement of the Si-FF with the IGZO-FF is 0%.

With the 55-nm Si technology and the 60-nm IGZO technology, the delay time of the Si-FF is 169.08 ps, and the delay time of the IGZO-FF is 169.74 ps (+0.39%). The energy consumption of the Si-FF is 13.82 fJ, and the energy consumption of the IGZO-FF is 13.87 fJ (+0.35%). The performance overhead is negligible. The IGZO-FF capable of PG becomes more attractive as the leakage current of the Si-FET becomes higher with miniaturization.

TABLE 5

| Si | Description | Si-FF | IGZO-FF | Overhead |
|---|---|---|---|---|
| 110 nm | Area (µm$^2$) | 30.85 | 30.85 | +0.00% |
| | Propagation Delays (ps) | 228.25 | 228.88 | +0.28% |
| | Power Dissipation (fJ) | 26.36 | 26.41 | +0.19% |
| 55 nm | Area (µm$^2$) | 6.8 | 6.8 | +0.00% |
| | Propagation Delays (ps) | 169.08 | 169.74 | +0.39% |
| | Power Dissipation (fJ) | 13.82 | 13.87 | +0.35% |
| 28 nm | Area (µm$^2$) | 1.7 | 1.7 | +0.00% |
| | Propagation Delays (ps) | 103.97 | 104.47 | +0.48% |
| | Power Dissipation (fJ) | 9.1 | 9.14 | +0.40% |

Input slew = 0.01 ns, 25° C., typical process, output load = 2 fF

Figure 27:
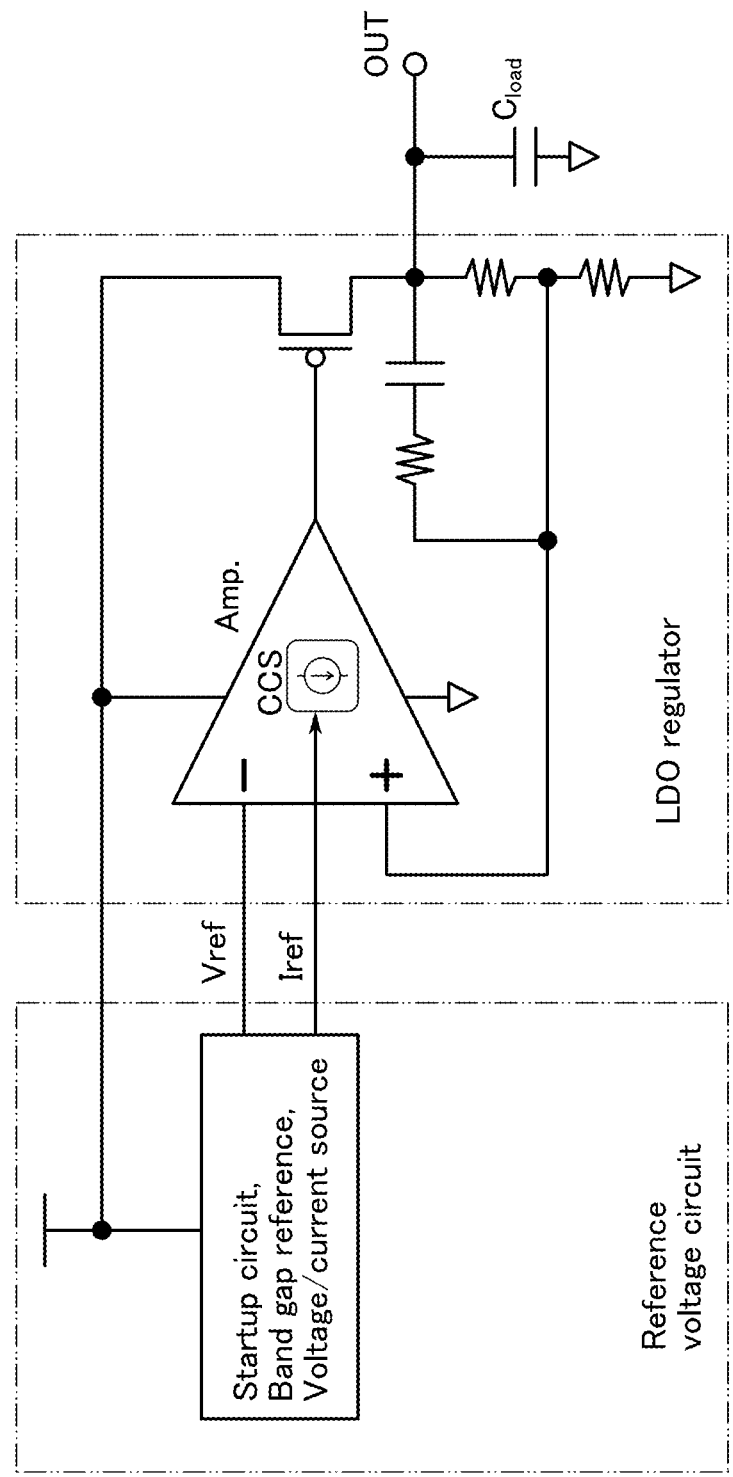
FIG. 27 shows a circuit structure example of a general IVR.
Figure 28:
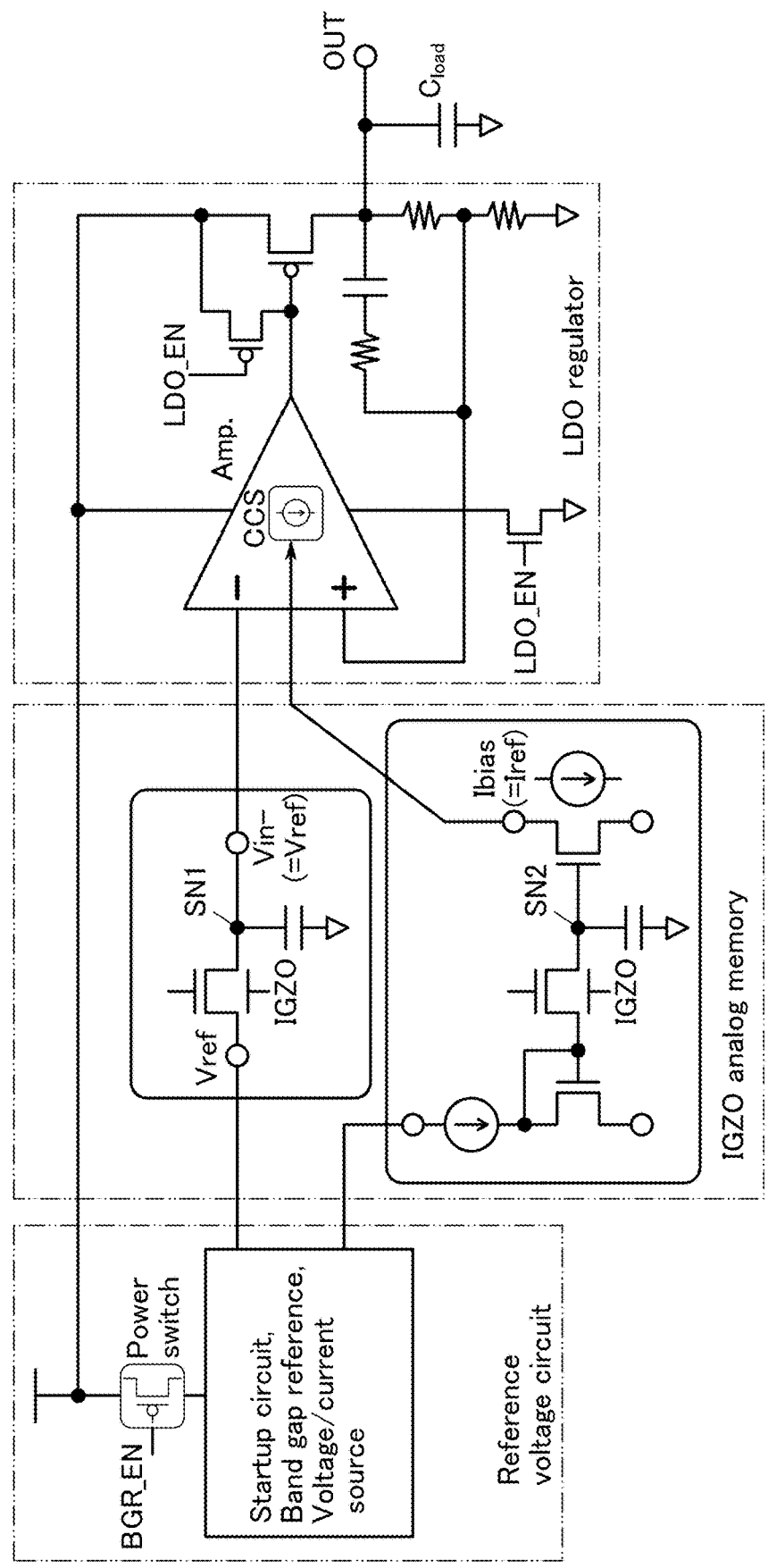
FIG. 28 shows a circuit structure of an IVR included in a fabricated MCU.
Figure 29A:
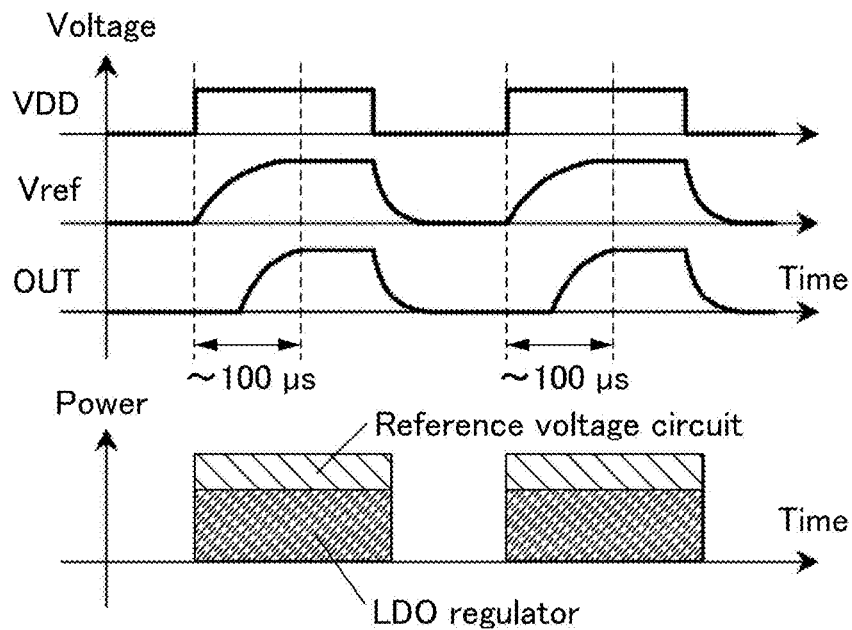
FIG. 29A is a conceptual diagram showing a relationship among startup time, a voltage change, and power consumption of a general WR.
Figure 29B:
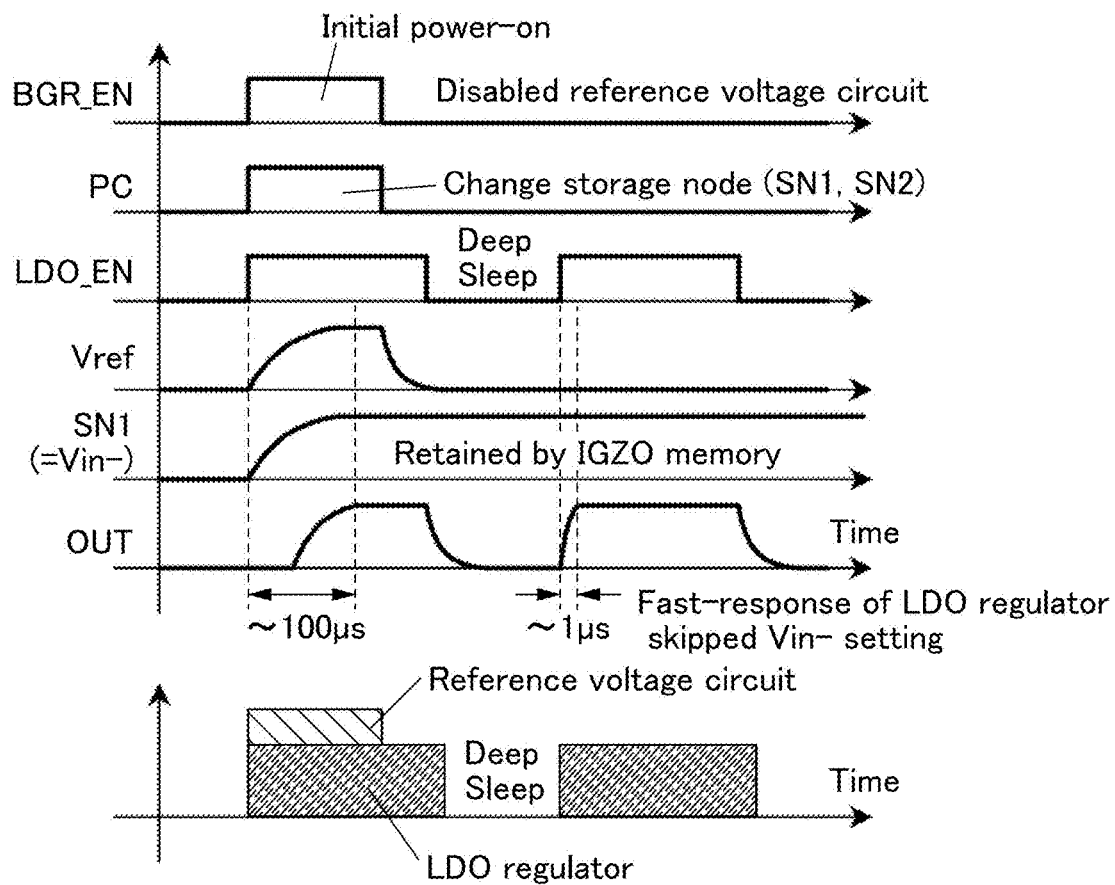
FIG. 29B is a conceptual diagram showing a relationship among startup time, a voltage change, and power consumption of an IVR included in a fabricated MCU.

FIG. 27 is a circuit diagram of a general IVR. FIG. 29A is a conceptual diagram showing a relationship among startup time, a voltage change, and power consumption of a general WR. FIG. 28 is a circuit diagram of the IVR included in the fabricated MCU. FIG. 29B is a conceptual diagram showing a relationship among startup time, a voltage change, and power consumption of the IVR included in the fabricated MCU.

In general, an IVR includes a reference voltage generator (a reference voltage circuit) and a low-dropout (LDO) regulator (see FIG. 27). The reference voltage generator includes a startup circuit, a band gap reference circuit, and a voltage/current source.

The reference voltage generator has a function of supplying a reference voltage (Vref) and a reference current (Iref) to an amplifier circuit included in the LDO regulator. The Iref is supplied to a constant current source (CCS) included in the amplifier circuit.

Note that in FIG. 27 and FIG. 28, load capacitance $C_{load}$ is written beside an output terminal (OUT).

The bottleneck of the startup time of the whole IVR is the delay time due to the generation of the reference voltage of the band gap reference circuit composed of a bipolar transistor. With the aim of high-speed startup and low power consumption of the IVR, an IGZO analog memory is provided between the reference voltage generator and the LDO regulator (see FIG. 28). When an initially generated reference voltage is retained in the IGZO analog memory, the response time of the LDO regulator in the subsequent stage can be significantly shortened from the next startup. Furthermore, the power consumption of the IVR can be reduced by the intermittent operation of the reference voltage generator.

Figure 30:
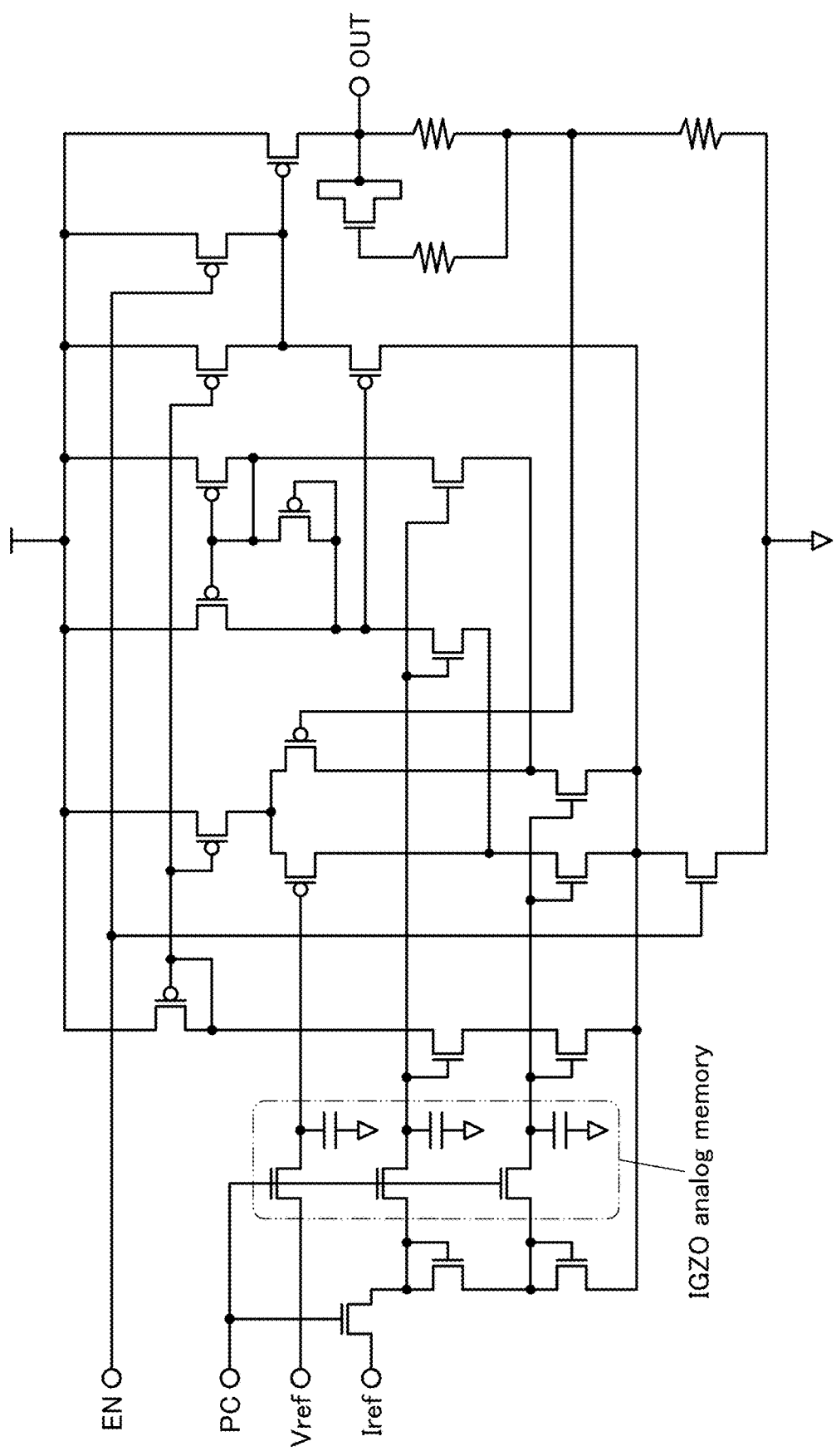
FIG. 30 is a circuit diagram of an LDO regulator.

FIG. 30 is a detailed circuit diagram of the LDO regulator. The LDO regulator includes a folded cascode differential amplifier circuit and a common source amplifier circuit. The LDO regulator also includes three IGZO analog memories. The IGZO analog memories have a function of retaining a reference voltage and a constant voltage for a current source.

Figure 31:
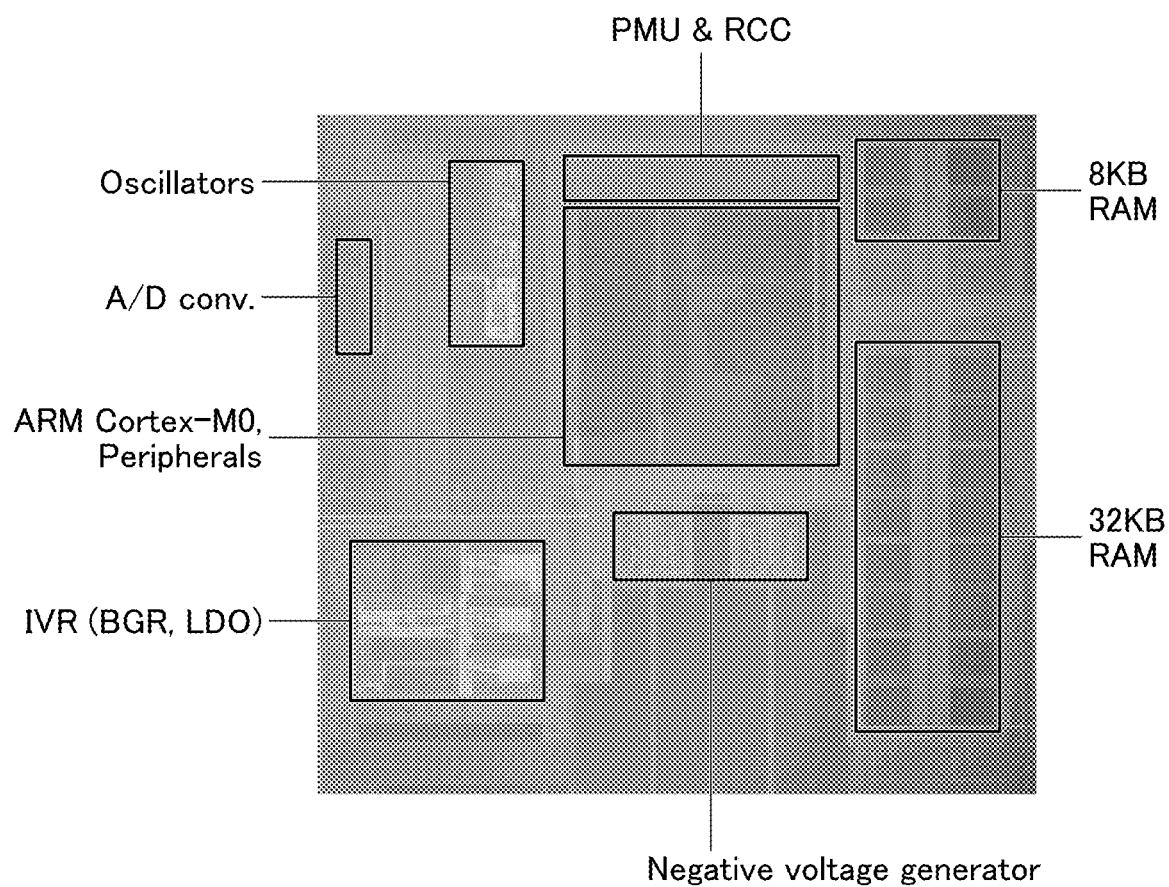
FIG. 31 is a die micrograph of a fabricated normally-off MCU.

FIG. 31 is a die micrograph of the fabricated normally-off MCU. Table 6 shows the specifications of the fabricated normally-off MCU.

TABLE 6

| Technology | 110-nm Si CMOS, 60-nm IGZO-FET (BEOL) |
|---|---|
| Supply voltage | 1.2 V, 3.3 V |
| CPU | ARM Cortex-M0 |
| Memory | 8 KB + 32 KB |
| Other integration | PMU (4 LP modes), Int. clock sources, IVR, 6 timers, 3 UARTs, 16-b GPIO (2 groups), A/D conv. (10 channels) |

TABLE 6-continued

| Frequency | Up to 48 MHz |
|---|---|
| Active power | 6.60 mW @ 48 MHz |
| Static power | 3.71 µW in Deep-Sleep 1 |
| | 880 nW in Deep-Sleep 2 |
| Backup time | 21 ns (1 clock) |
| Backup energy | 0.130 nJ |
| Wakeup time | 4.69 µs |

Figure 32A:
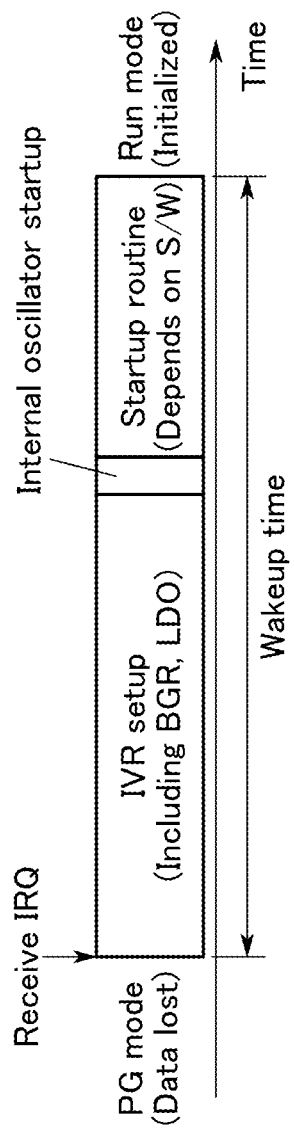
FIG. 32A shows a restoration sequence from a PG mode of a general WR.

FIG. 32A shows a restoration sequence from a PG mode of a general IVR. During the PG mode, data necessary for the restoration is lost (data lost). When receiving a startup signal (IRQ), the IVR restarts (IVR setup). At this time, the band gap reference circuit (BGR) and the LDO regulator also restart. Next, an internal oscillator starts up. Then, a startup routine is executed, and the restoration sequence is terminated. After that, the IVR is transferred to a normal operation mode (run mode). In that case, the CPU is initialized.

Figure 32B:
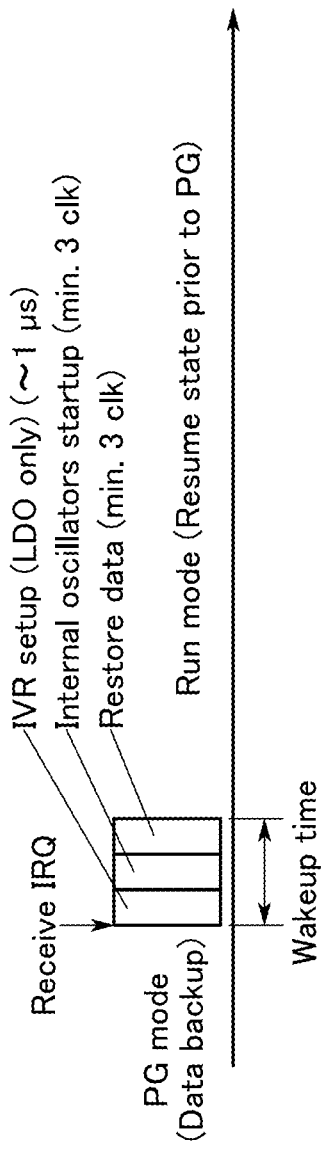
FIG. 32B shows a restoration sequence from a PG mode of an IVR included in a fabricated MCU.

FIG. 32B shows a restoration sequence from the PG mode of the IVR included in the fabricated MCU. During the PG mode, data necessary for the restoration is retained in the IGZO-FF (data backup). When receiving the IRQ, the IVR restarts. At this time, only the LDO regulator starts up. The time required for startup of the LDO regulator is approximately 1 µs. Next, an internal oscillator starts up. The time required for startup of the internal oscillator is three clocks at a minimum. Next, restoration data is read out using a 48-MHz internal clock (HSI48). The time required for reading out the restoration data is three clocks at a minimum. After that, the IVR is transferred to a normal operation mode (run mode); at this time, the IVR returns to a state just before the PG. High-speed startup of the WR and instant system data restoration of the IGZO-FF with the use of the IGZO-FET can reduce the total time required for the restoration (wake-up time).

FIG. 33A shows a shmoo plot of backup time. FIG. 33B shows a shmoo plot of restoration time. At VDH=3.0 V, backup time (TB1) was 18 ns and restoration time (TR1) was 18 ns. The system restoration time is the sum of the above times and power supply line charge time and the like.

Figure 34:
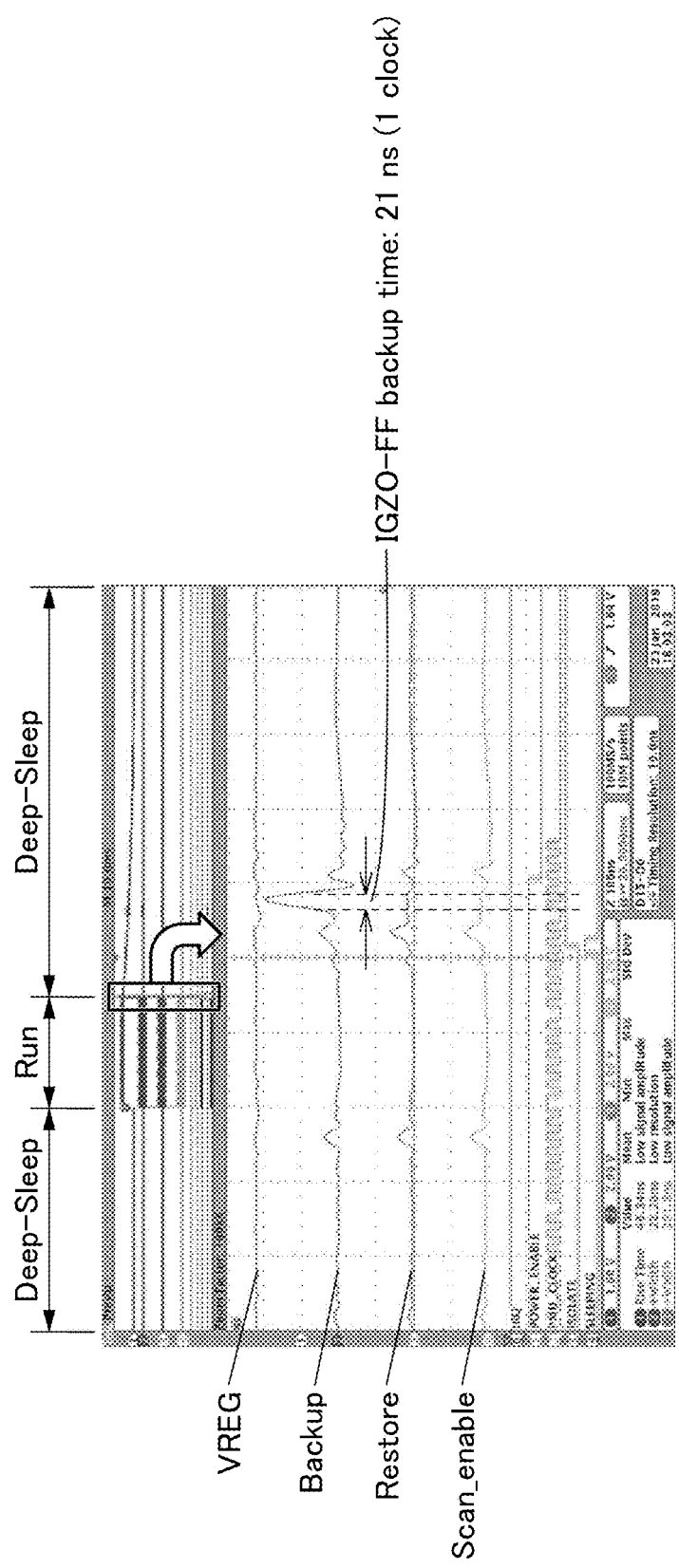
FIG. 34 shows oscilloscope waveforms in backup operation.
Figure 35:
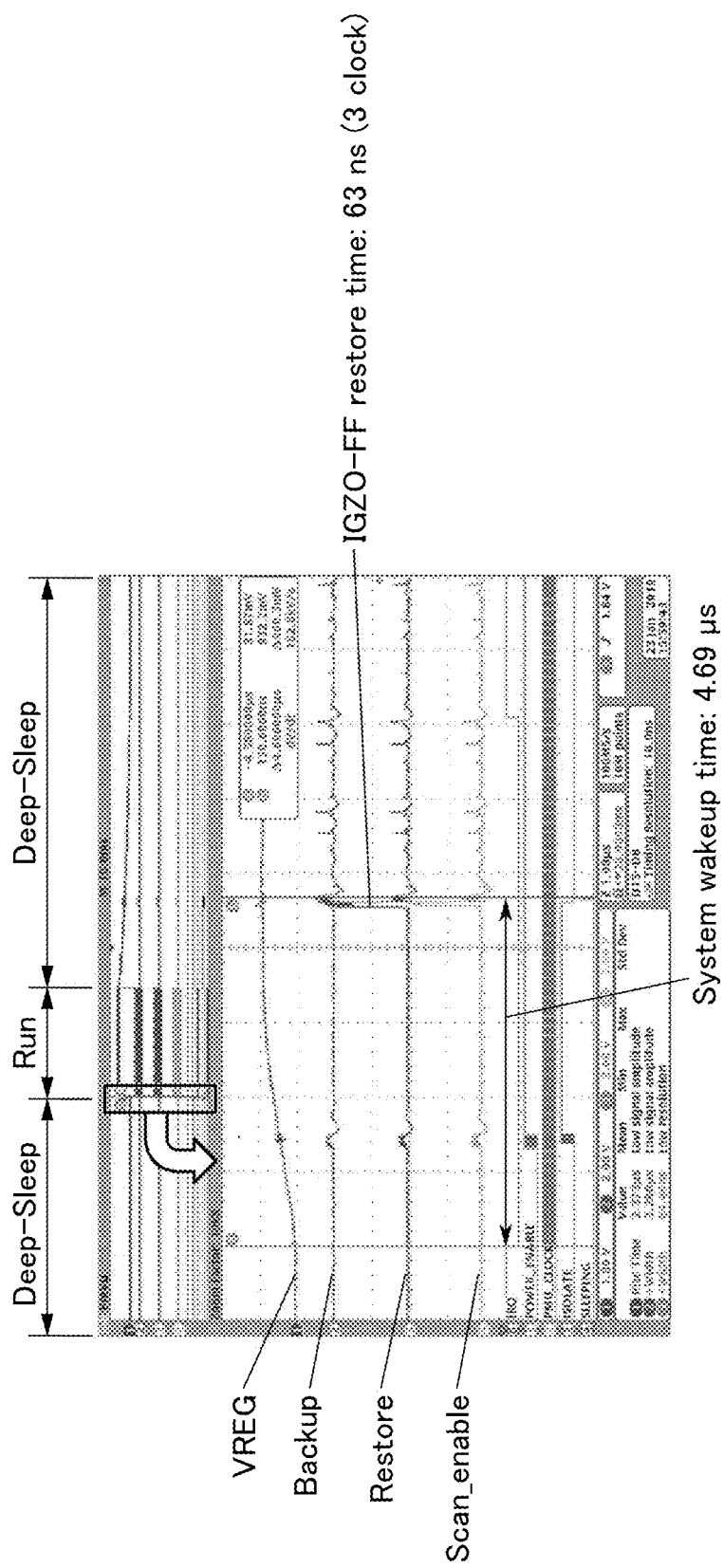
FIG. 35 shows oscilloscope waveforms in restoration operation.

FIG. 34 shows oscilloscope waveforms in backup operation. The time required for backup to the IGZO-FF was 21 ns (one clock). FIG. 35 shows oscilloscope waveforms in restoration operation. The time required for restoration from the IGZO-FF was 63 ns (three clocks). The system restoration time including the restoration time (decoupling capacitance $C_{decap}$=10 nF) was 4.69 µs.

Figure 36A:
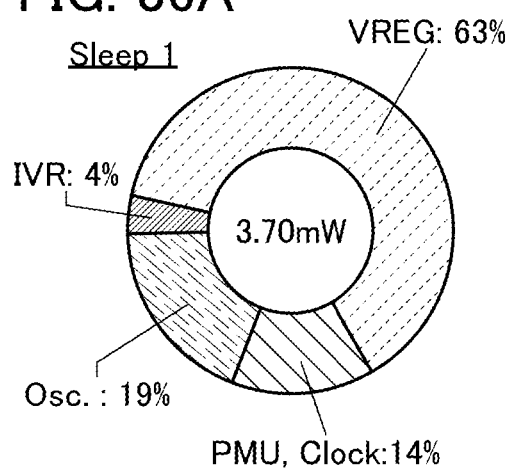
FIG. 36A shows power consumption in a Sleep 1 mode and its breakdown.
Figure 36B:
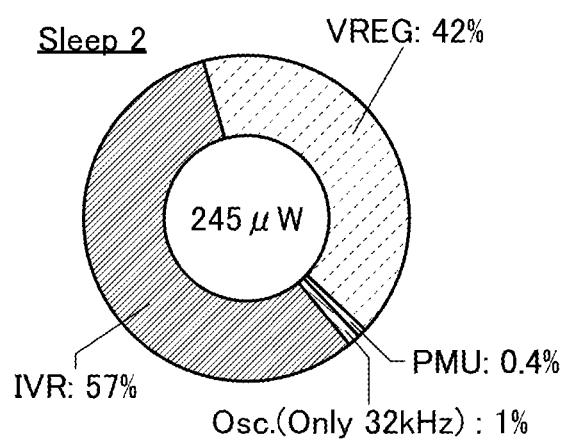
FIG. 36B shows power consumption in a Sleep 2 mode and its breakdown.
Figure 36C:
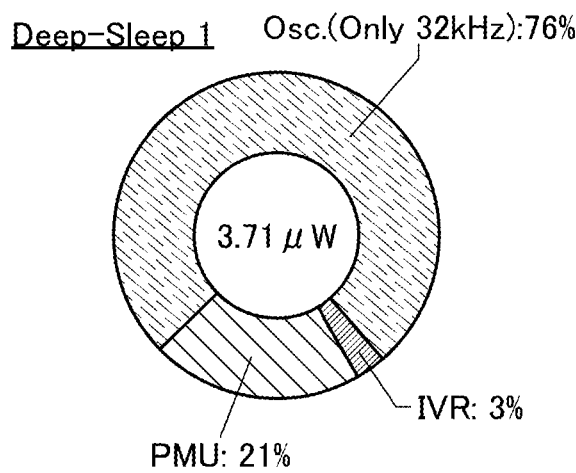
FIG. 36C shows power consumption in a Deep-Sleep 1 mode and its breakdown.
Figure 36D:
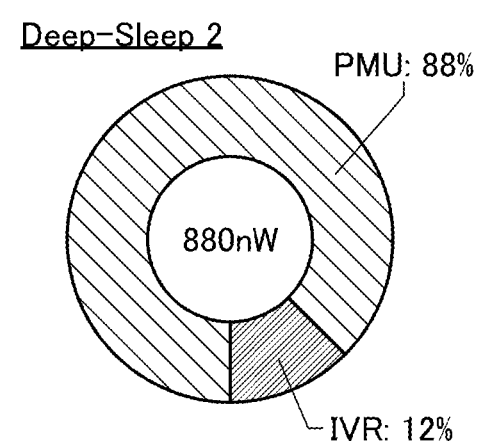
FIG. 36D shows power consumption in a Deep-Sleep 2 mode and its breakdown.

FIG. 36A shows the power consumption in the Sleep 1 mode and its breakdown. FIG. 36B shows the power consumption in the Sleep 2 mode and its breakdown. FIG. 36C shows the power consumption in the Deep-Sleep 1 mode and its breakdown. FIG. 36D shows the power consumption in the Deep-Sleep 2 mode and its breakdown.

The power consumption in the Sleep 1 mode was 3.70 mW. In the Sleep 1 mode, the power consumption of the VREG was 63%, the power consumption of the PMU and the clock source was 14%, the power consumption of the oscillator was 19%, and the power consumption of the IVR was 4%.

The power consumption in the Sleep 2 mode was 245 µW. In the Sleep 2 mode, the power consumption of the VREG was 42%, the power consumption of the PMU was 0.4%, the power consumption of the oscillator was 1%, and the power consumption of the IVR was 57%.

The power consumption in the Deep-Sleep 1 mode was 3.71 µW. In the Deep-Sleep 1 mode, the power consumption of the oscillator was 76%, the power consumption of the IVR was 3%, and the power consumption of the PMU was 21%.

The power consumption in the Deep-Sleep 2 mode was 880 nW. In the Deep-Sleep 2 mode, the power consumption of the PMU was 88% and the power consumption of the IVR was 12%.

Figure 37:
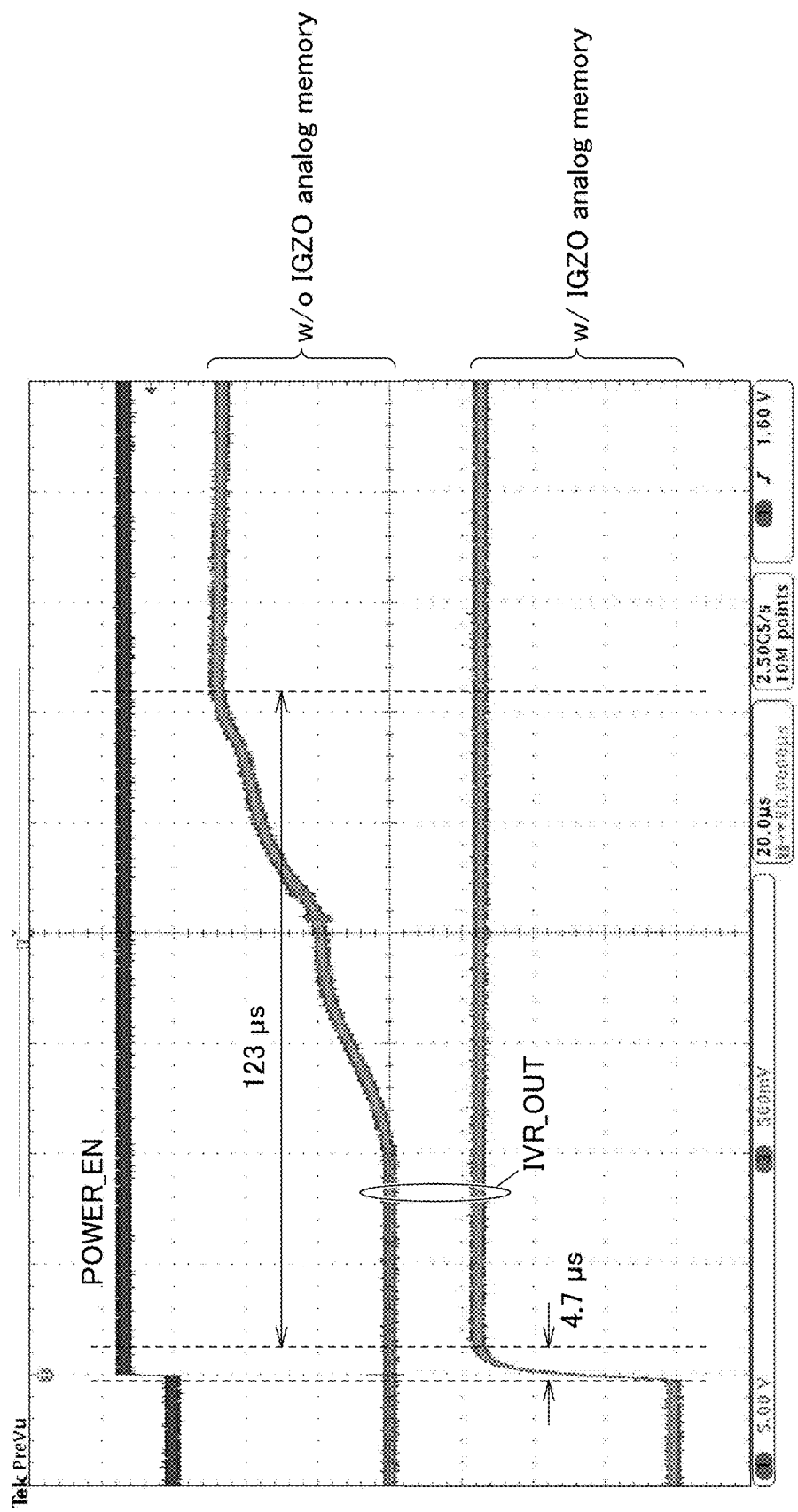
FIG. 37 shows rise time of IVRs with and without an IGZO analog memory.

FIG. 37 shows the rise time of the WR without the IGZO analog memory and the rise time of the IVR with the IGZO analog memory. The rise time of the IVR without the IGZO analog memory was 123 µs, and the rise time of the IVR with the IGZO analog memory was 4.7 µs. The rise time of the IVR with the IGZO analog memory retaining a reference voltage can be 26 times shorter than that of the IVR without the IGZO analog memory.

Figure 38:
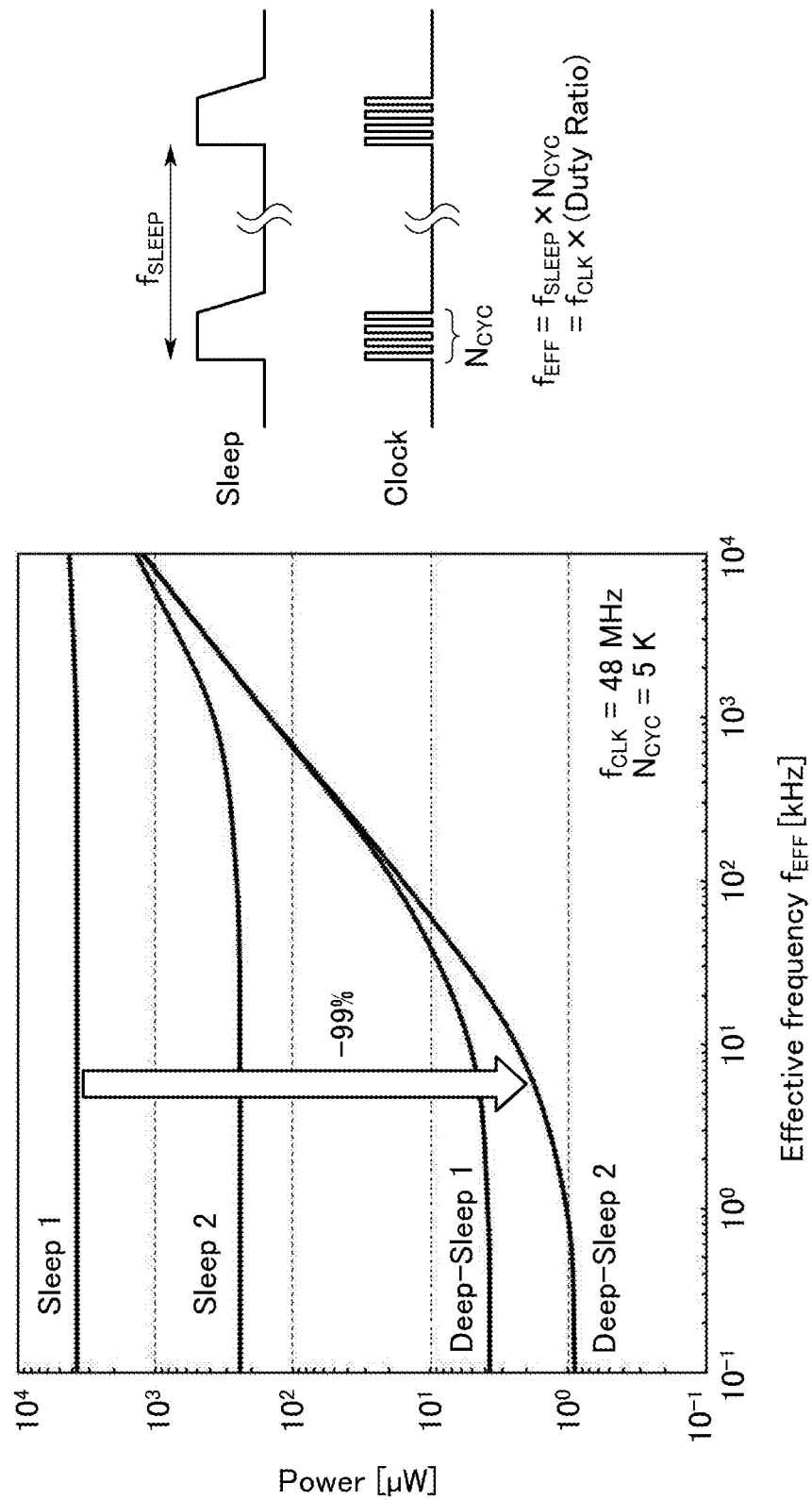
FIG. 38 shows estimated power consumption dependence on an effective frequency.

FIG. 38 shows the estimated power consumption dependence on the effective frequency ($f_{EFF}$) on the assumption of an application with long standby time (sleep time), such as an event-driven system.

The $f_{EFF}$ is represented by the product of the cycles of a sleep mode ($f_{SLEEP}$) and the number of clocks in the normal operation ($N_{CYC}$). Alternatively, the $f_{EFF}$ is represented by the product of the clock frequency ($f_{CLK}$) and the duty ratio.

FIG. 38 shows the estimated power consumption in the case where fax is 48 MHz and $N_{CYC}$ is 5000. The power consumption in the Deep-Sleep 2 mode is 99% lower than that in the Sleep 1 mode.

Table 7 compares the fabricated MCU with other non-volatile MCUs. The backup energy of the fabricated MCU is 0.130 nJ (the number of IGZO-FFs in the MCU is 2949), and the PG overhead is small. The MCU including the IGZO-FET can achieve low leakage power, high-speed and low-energy backup, and high-speed system restoration.

memory, a secondary cache memory, and the like. A DOSRAM, a NOSRAM, or the like can be used as a main storage device, a storage class memory (SCM), or the like.

The IGZO-FET can be used not only for the MCU but also for a low-power processor. In order to be compatible with various kinds of information technology such as IoT, a new communication standard called 5G that achieves higher transmission speed, more simultaneous connections, and shorter delay time than 4G has been recently examined. The IGZO-FET is compatible with an event-driven system that requires extremely low power consumption and high-speed restoration and thus can be used for IoT and edge AI applications employing 5G.

Example 2

In this example, a negative voltage generator (see FIG. 31) included in the normally-off MCU described in Example 1 will be described.

Figure 40A:
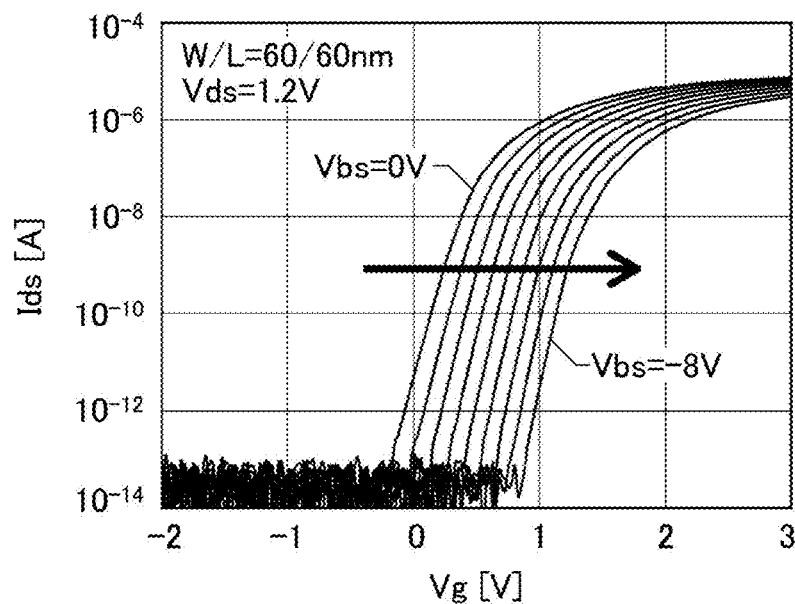
FIG. 40A shows back gate voltage ($V_{bs}$) dependence of $I_{ds}$-$V_{gs}$ characteristics of an IGZO-FET.
Figure 40B:
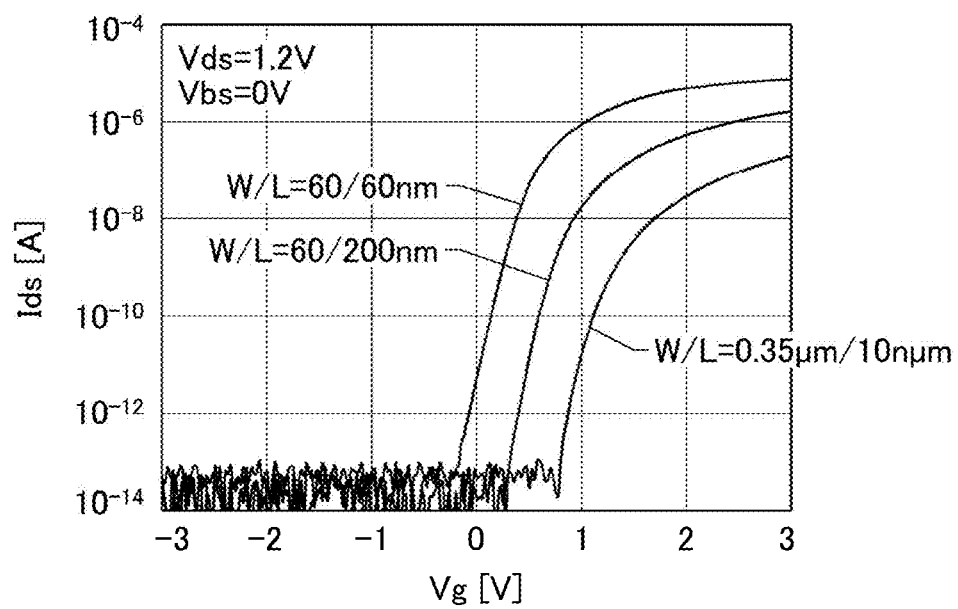
FIG. 40B shows device size dependence of an IGZO-FET.

The threshold voltage of the Si-FET is controlled by the amount of channel doping, whereas the threshold voltage of the IGZO-FET can be controlled with its back gate. FIG. 40A shows the back gate voltage ($V_{bs}$) dependence of the $I_{ds}$-$V_{gs}$ characteristics of the IGZO-FET. FIG. 40B shows the device size (channel length L and channel width W on the top gate side) dependence of the IGZO-FET.

FIG. 40A shows the $I_{ds}$-$V_{gs}$ characteristics at $V_{bs}$ changed in steps of 1 V from –8 V to 0 V. The $I_{ds}$-$V_{gs}$ characteristics monotonously shift in the $V_{bs}$ range from –8 V to 0 V. The mobility and the subthreshold swing value (S value) do not decrease. FIG. 40B reveals that the threshold voltage shifts in the positive direction as the top gate length increases.

TABLE 7

| NV device | This work IGZO | ReRAM | MTJ | FeRAM | FeRAM |
|---|---|---|---|---|---|
| Technology | 110 nm (Si) 60 nm (OS) | 65 nm | 90 nm | 130 nm | 130 nm |
| CPU | Crtx-M0 | 8051 | MSP430 | Unknown | Crtx-M0 |
| Frequency | 48 MHz | 100 MHz | 20 MHz | 16 MHz | 8 MHz |
| Supply voltage | 1.2 V, 3.3 V | 0.8 V, 3 V | 1.0 V, 3.3 V | 1.3 V, 3.3 V | 1.5 V |
| Leakage in PG | 880 nW | N/A | 1.6 µW | 0.05 mW | 0.00 nW |
| Backup time | 21 ns | 4µ-1.0 ms | 4 ns/word | N/A | 320 ns |
| Backup energy | 44 fJ/bit | 12 pJ/bit | 6 pJ/bit | N/A | 2.2 pJ/bit |
| Restore (NVFF) | 63 ns | 20-170 ns | 120 ns | 9 µs | 384 ns |
| Wakeup (Syst.) | 4.69 µs | N/A | N/A | 1.23 ms | N/A |

Figure 39A:
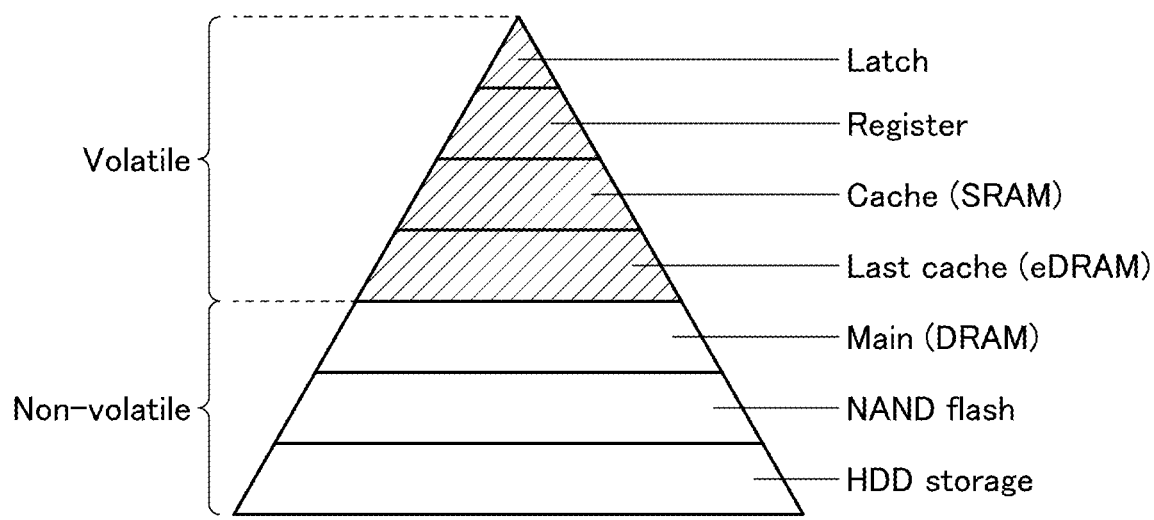
FIG. 39A shows a hierarchical structure example of conventional memories using Si.

FIG. 39A shows a hierarchical structure of conventional memories using Si. Higher-speed operation is required towards the top, and lower power consumption is required towards the bottom. The hierarchical structure of the conventional memories is roughly divided into volatile memories and nonvolatile memories.

Examples of the volatile memories include a latch memory, a register memory, a primary cache memory, and a secondary cache (last cache) memory. An SRAM is used as the primary cache memory, and an embedded DRAM (eDRAM) is used as the secondary cache memory in some cases.

Examples of the nonvolatile memories include a DRAM for a main storage device, a NAND flash memory, and an HDD storage.

Figure 39B:
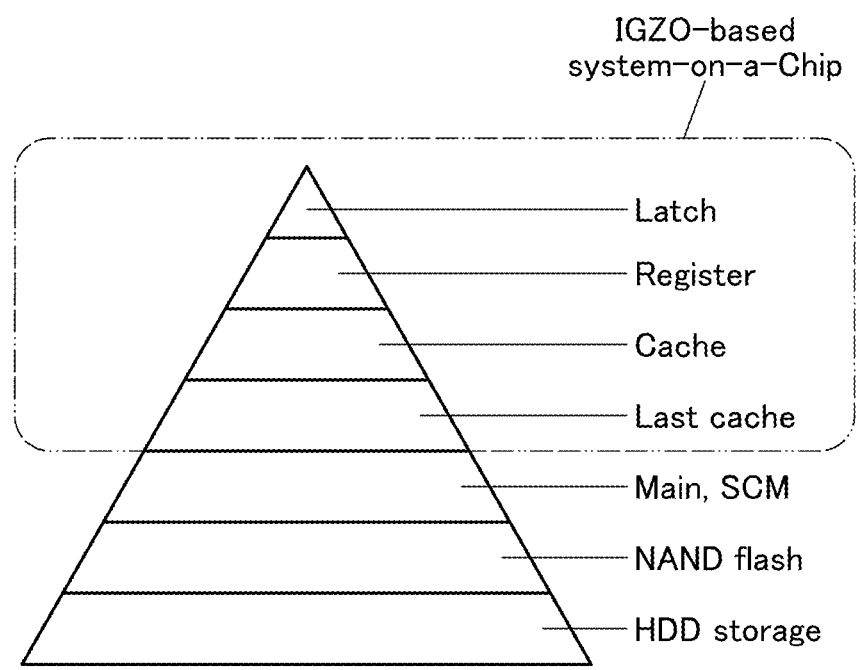
FIG. 39B shows a hierarchical structure example of memories including IGZO-FETs.

FIG. 39B shows a hierarchical structure example of memories including the IGZO-FETs. The use of the IGZO-FETs can achieve a system-on-a-chip (SOC) embedded with a latch memory, a register memory, a primary cache When W/L is 0.35 µm/10 µm, extrapolated $I_{ds}$ at $V_{gs}$=$V_{bs}$=0 V is estimated to be approximately 0.66 zA.

Figure 41:
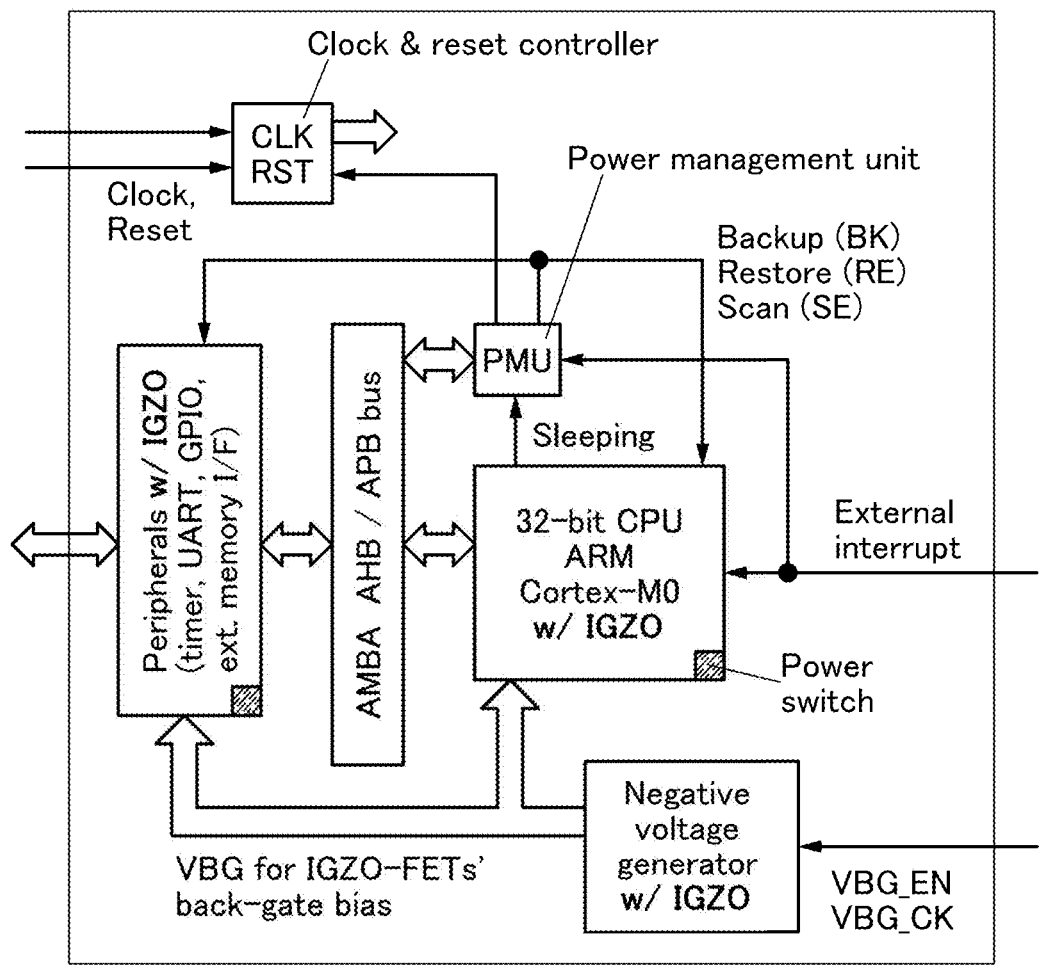
FIG. 41 is a system block diagram.

FIG. 41 is a block diagram of a system including a 32-bit ARM Cortex-M0 CPU, a PMU, and a negative voltage generator each including the IGZO-FET. The PMU has a function of reducing power consumption by control of power gating (PG) and clock gating (CG) that reduces power consumed by toggling of a clock signal. The CPU performs logic synthesis and the automatic placement and routing with the use of 2949 IGZO-FFs (see FIG. 25A). Data of the CPU register can be backed up in the PG by the IGZO-FFs. This enables the original state to be instantly restored at the time of returning from the PG, thereby restarting the processing immediately.

The area of the IGZO-FFs does not increase because 3T1C devices are stacked without a change in the cell layout from the foundry's standard Si-FF. In order to maintain the retention time of the IGZO-FFs (i.e., to shift the $I_{ds}$-$V_{gs}$ characteristics of the IGZO-FETs in the positive direction), a negative voltage is applied to the back gates of the IGZO-FETs. The negative voltage is supplied from an internal voltage generator.

Figure 42A:
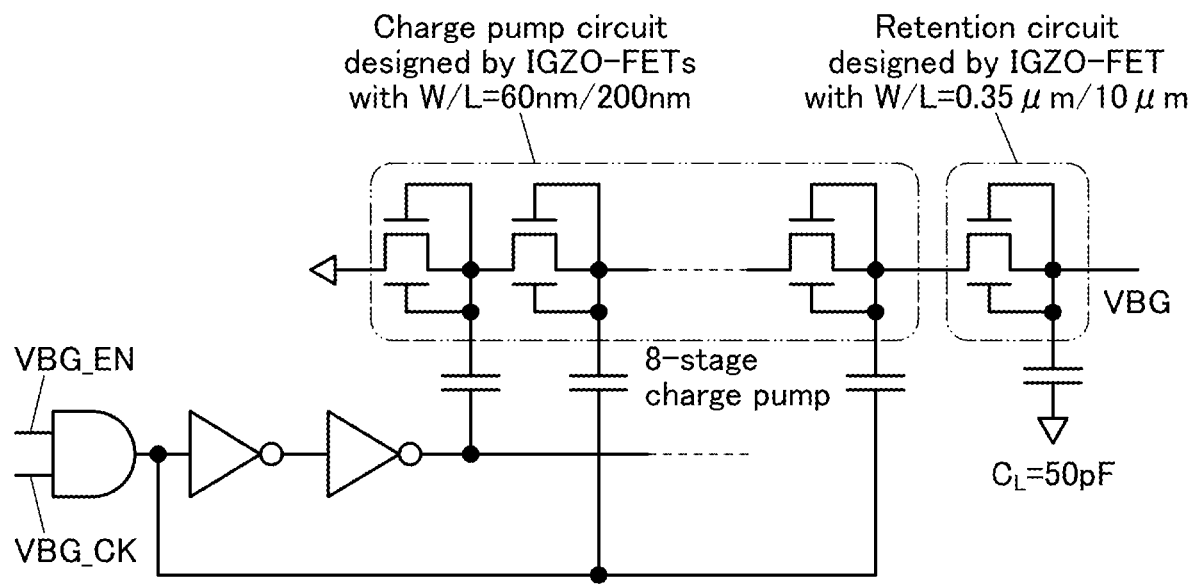
FIG. 42A is a circuit diagram of a negative voltage generator.
Figure 42B:
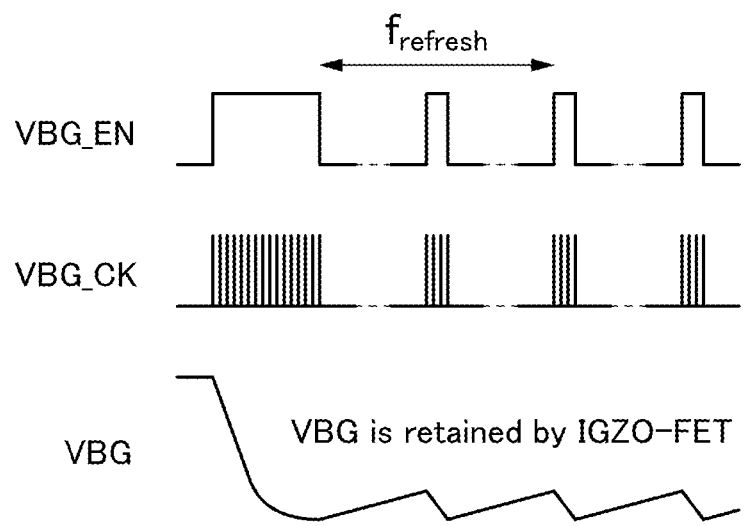
FIG. 42B is a timing chart of charging operation.

FIG. 42A is a circuit diagram of the negative voltage generator. FIG. 42B is a timing chart of charging operation. The negative voltage generator includes a generation unit (charge pump circuit) and a retention unit (retention circuit). The generation unit includes IGZO-FETs with W/L=60 nm/200 nm. The retention unit includes an IGZO-FET with W/L=0.35 μm/10 μm. With the use of the diode-connected IGZO-FET included in the retention unit, voltage generated in the charge pump circuit is retained for a long time. The intermittent operation of the charge pump circuit can reduce the power consumption of the negative voltage generator.

Figure 43A:
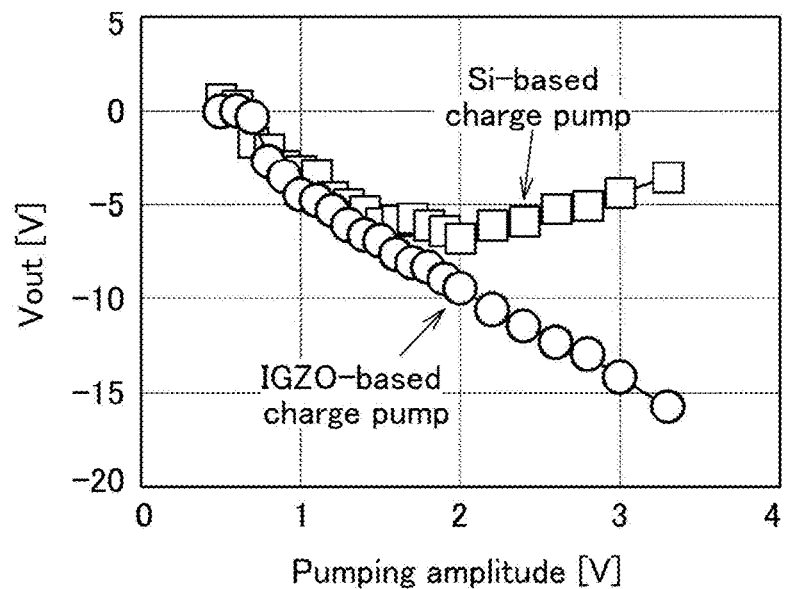
FIG. 43A shows a relationship between pumping voltage amplitude and generation voltage of a charge pump circuit.

FIG. 43A shows a relationship between the pumping voltage amplitude and generation voltage of the charge pump circuit. The voltage of the negative voltage generator including the IGZO-FETs can be decreased to −15 V, whereas the voltage of a negative voltage generator including Si-FETs fabricated for comparison can be only decreased to −5 V. This is because, in a bulk n-channel Si-FET, reverse bias current flows in a parasitic diode between a P$^+$ well and an N well as a negative voltage increases. The IGZO-FETs are isolated from each other by an insulating layer and thus can avoid a problem of a parasitic diode.

Figure 43B:
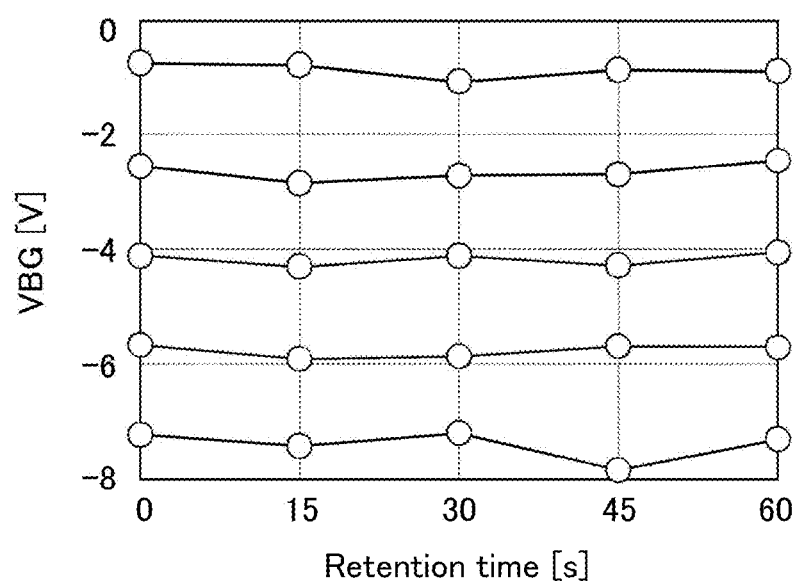
FIG. 43B shows a relationship between back gate voltage and generation voltage retention time.

FIG. 43B shows a relationship between the back gate voltage (VBG) and the generation voltage retention time at 85° C. FIG. 43B reveals that the generation voltage can be retained for 60 seconds or longer at 85° C. The negative voltage generated in the charge pump circuit is retained for a long time with the use of the diode-connected IGZO-FET.

Figure 44:
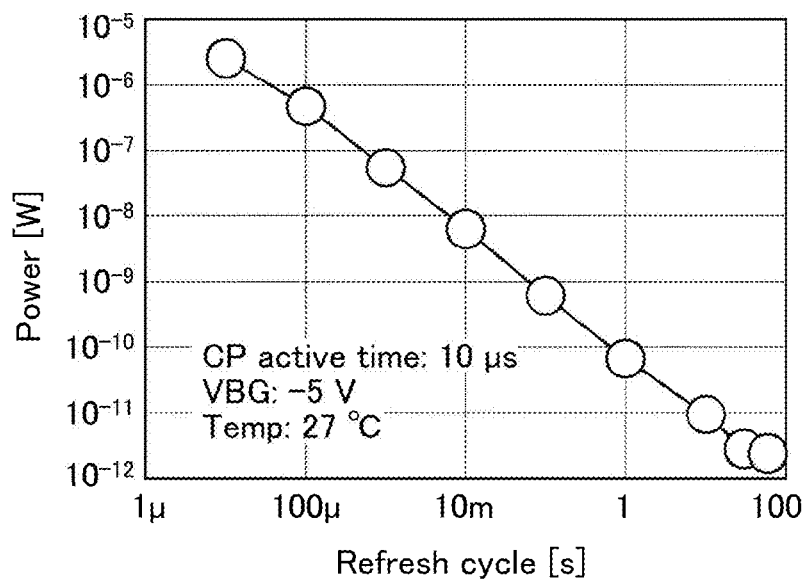
FIG. 44 shows refresh cycle dependence of power consumption of a negative voltage generator.

FIG. 44 shows the refresh cycle dependence of the power consumption of the negative voltage generator. When the intermittent operation is performed every 60 seconds, the power consumption is lower than or equal to 2.4 pW.

Table 8 shows the back gate voltage dependence of the retention time of the normally-off CPU (IGZO-FFs) at 85° C. For example, a back gate voltage (back bias) of −5 V is necessary to achieve a retention time of 1000 seconds. Note that a retention time of 1000 seconds is sufficiently long for a power consumption reduction in normally-off computing.

TABLE 8

|  |  | Renention time (s) | | | | | | |
| --- | --- | --- | --- | --- | --- | --- | --- | --- |
|  |  | 0.01 | 0.1 | 1 | 10 | 60 | 600 | 1000 |
| Back-bias of IGZO-FETs (V) | 0 | Fail | Fail | Fail | Fail | Fail | Fail | Fail |
|  | −1 | Fail | Fail | Fail | Fail | Fail | Fail | Fail |
|  | −2 | Fail | Fail | Fail | Fail | Fail | Fail | Fail |
|  | −3 | Pass | Pass | Pass | Fail | Fail | Fail | Fail |
|  | −4 | Pass | Pass | Pass | Pass | Pass | Fail | Fail |
|  | −5 | Pass | Pass | Pass | Pass | Pass | Pass | Pass |
|  | −6 | Pass | Pass | Pass | Pass | Pass | Pass | Pass |

In addition, the power consumption in the CG mode and the PG mode was evaluated and compared with the total power consumption of the MCU. It was found from the results that the proportion of the power consumption of the negative voltage generator in the total power consumption of the MCU was lower than or equal to 0.000000001%.

This application is based on Japanese Patent Application Serial No. 2019-106982 filed with Japan Patent Office on Jun. 7, 2019, Japanese Patent Application Serial No. 2019-123905 filed with Japan Patent Office on Jul. 2, 2019, and Japanese Patent Application Serial No. 2019-155418 filed with Japan Patent Office on Aug. 28, 2019, the entire contents of which are hereby incorporated by reference.

What is claimed is:
1. A system comprising:
a power management unit;
a CPU comprising a flip-flop circuit; and
a negative voltage generator,
wherein the power management unit is configured to control power gating,
wherein the flip-flop circuit is configured to back up data of the CPU in the power gating,
wherein the flip-flop circuit comprises a transistor including an oxide semiconductor in a semiconductor layer, and
wherein the negative voltage generator is configured to apply a negative voltage to a back gate of the transistor.

2. A system comprising:
a power management unit;
a CPU comprising a flip-flop circuit; and
a negative voltage generator,
wherein the power management unit is configured to control power gating,
wherein the flip-flop circuit is configured to back up data of the CPU in the power gating,
wherein the flip-flop circuit comprises a first transistor comprising silicon and a second transistor including an oxide semiconductor in a semiconductor layer, and
wherein the negative voltage generator is configured to apply a negative voltage to a back gate of the second transistor.

3. A system comprising:
a power management unit comprising a third circuit;
a CPU comprising a flip-flop circuit; and
a negative voltage generator comprising:
    a generation unit comprising a first transistor including an oxide semiconductor in a semiconductor layer; and
    a retention unit comprising a second transistor including an oxide semiconductor in a semiconductor layer,
wherein the power management unit is configured to control power gating,
wherein the flip-flop circuit is configured to back up data of the CPU in the power gating,
wherein the flip-flop circuit comprises a third transistor including an oxide semiconductor in a semiconductor layer, and
wherein the negative voltage generator is configured to apply a negative voltage to a back gate of the third transistor.

* * * * *